United States Patent
Wright et al.

(10) Patent No.: US 11,160,178 B2
(45) Date of Patent: *Oct. 26, 2021

(54) WATERPROOF CASE

(71) Applicant: CATALYST LIFESTYLE LIMITED, North Point (HK)

(72) Inventors: Joshua Wright, Hong Kong (CN); June Lai, Hong Kong (CN)

(73) Assignee: INTUIT INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/226,754

(22) Filed: Dec. 20, 2018

(65) Prior Publication Data

US 2019/0124780 A1 Apr. 25, 2019

Related U.S. Application Data

(63) Continuation of application No. 15/694,118, filed on Sep. 1, 2017, now Pat. No. 10,206,296, which is a (Continued)

(51) Int. Cl.
*H05K 5/00* (2006.01)
*G06F 1/16* (2006.01)
(Continued)

(52) U.S. Cl.
CPC .......... *H05K 5/0086* (2013.01); *B65D 43/00* (2013.01); *G06F 1/1626* (2013.01);
(Continued)

(58) Field of Classification Search
CPC ...... H05K 5/0091; H05K 5/0061; H04R 1/08; H04R 1/04; H04R 2499/11
(Continued)

(56) References Cited

U.S. PATENT DOCUMENTS

D68,807 S 11/1925 Hill
D68,988 S 12/1925 Riehie
(Continued)

FOREIGN PATENT DOCUMENTS

CN 1782853 A 6/2006
CN 1819090 A 8/2006
(Continued)

OTHER PUBLICATIONS

International Search Report, International Application No. PCT/IB2012/002187, 6 pages.
(Continued)

*Primary Examiner* — Anthony D Stashick
*Assistant Examiner* — Raven Collins
(74) *Attorney, Agent, or Firm* — Dinsmore & Shohl LLP

(57) ABSTRACT

A protective case for an electronic device includes a main housing. The main housing receives an electronic device including a switch. The main housing includes a slot formed therein proximate the switch of the electronic device. A toggle is rotatively positioned within the slot. The toggle includes a pair of raised contact portions and the switch is positioned between the raised contact portions and actuated by rotation of the toggle.

11 Claims, 36 Drawing Sheets

Related U.S. Application Data continuation of application No. 13/835,915, filed on Mar. 15, 2013, now Pat. No. 9,795,044, which is a continuation-in-part of application No. 13/591,944, filed on Aug. 22, 2012, now Pat. No. 9,800,962.

(60) Provisional application No. 61/749,752, filed on Jan. 7, 2013, provisional application No. 61/526,093, filed on Aug. 22, 2011.

(51) Int. Cl.
  *H04R 1/02* (2006.01)
  *B65D 43/00* (2006.01)
  *H05K 5/06* (2006.01)

(52) U.S. Cl.
  CPC ............ *G06F 1/1656* (2013.01); *H04R 1/02* (2013.01); *H05K 5/06* (2013.01); *H04R 2499/11* (2013.01)

(58) Field of Classification Search
  USPC ........................................................ 206/320
  See application file for complete search history.

(56) References Cited

U.S. PATENT DOCUMENTS

| | | | |
|---|---|---|---|
| D97,459 S | 11/1935 | Booth | |
| D143,807 S | 2/1946 | Eastham | |
| 54,734 A | 8/1949 | Anderson | |
| 74,104 A | 2/1955 | Wilkens et al. | |
| D181,065 S | 9/1957 | Middlemark | |
| D191,798 S | 11/1961 | Niles | |
| D305,725 S | 1/1990 | Yung | |
| D324,986 S | 3/1992 | Fratantonio et al. | |
| D356,042 S | 3/1995 | Nakanishi | |
| 5,491,311 A | 2/1996 | Muscat et al. | |
| D373,087 S | 8/1996 | Maubouissin | |
| D384,294 S | 9/1997 | Woo et al. | |
| D394,396 S | 5/1998 | Matsuda | |
| D400,802 S | 11/1998 | Galli | |
| D410,852 S | 6/1999 | Riley | |
| D415,434 S | 10/1999 | Matsuda | |
| D417,402 S | 12/1999 | Fujihara | |
| 5,996,790 A | 12/1999 | Yamada et al. | |
| 6,068,119 A | 5/2000 | Derr et al. | |
| D426,777 S | 6/2000 | Tomimatsu | |
| D434,987 S | 12/2000 | Versace | |
| D435,221 S | 12/2000 | Nikaido et al. | |
| 6,349,824 B1 | 2/2002 | Yamada | |
| D457,073 S | 5/2002 | Scarinzi et al. | |
| 6,468,619 B1 | 10/2002 | Larroche | |
| D470,421 S | 2/2003 | Ramazzina | |
| D470,776 S | 2/2003 | Blondin | |
| 6,568,619 B1 | 5/2003 | Shiga et al. | |
| D476,906 S | 7/2003 | Nussbaum | |
| 6,646,864 B2 | 11/2003 | Richardson | |
| D503,346 S | 3/2005 | Akagi | |
| 6,995,976 B2 | 2/2006 | Richardson | |
| D520,805 S | 5/2006 | Wright | |
| D525,148 S | 7/2006 | Gruosi | |
| 7,180,735 B2 | 2/2007 | Thomas et al. | |
| 7,230,823 B2 | 6/2007 | Richardson et al. | |
| 7,312,984 B2 | 12/2007 | Richardson et al. | |
| 7,449,650 B2* | 11/2008 | Richardson ............. G05G 1/02 | |
| | | | 200/331 |
| 7,609,512 B2 | 10/2009 | Richardson et al. | |
| 7,663,879 B2 | 2/2010 | Richardson et al. | |
| 7,688,580 B2 | 3/2010 | Richardson et al. | |
| D614,514 S | 4/2010 | Laucella | |
| D616,767 S | 6/2010 | Laucella | |
| D617,459 S | 6/2010 | Bogue | |
| D620,777 S | 8/2010 | Demers et al. | |
| D632,944 S | 2/2011 | Kang | |
| 7,889,489 B2 | 2/2011 | Richardson et al. | |
| 7,907,394 B2 | 3/2011 | Richardson et al. | |
| 7,933,122 B2 | 4/2011 | Richardson et al. | |
| 8,045,323 B2 | 10/2011 | Murakata | |
| D670,280 S | 11/2012 | Rayner | |
| 8,342,325 B2 | 1/2013 | Rayner | |
| D675,655 S | 2/2013 | Leach | |
| 8,457,701 B2* | 6/2013 | Diebel .................. H04B 1/3888 |
| | | | 455/575.8 |
| D691,990 S | 10/2013 | Rayner | |
| D693,801 S | 11/2013 | Rayner | |
| D720,596 S | 1/2015 | Dams | |
| 9,795,044 B2 | 10/2017 | Lai et al. | |
| D812,495 S | 3/2018 | Michele | |
| 10,496,197 B2 | 12/2019 | Taira | |
| 2002/0136557 A1* | 9/2002 | Shimamura ............ G03B 17/08 |
| | | | 396/535 |
| 2003/0111366 A1 | 6/2003 | Enners | |
| 2004/0173402 A1 | 9/2004 | Morkerken | |
| 2005/0067216 A1 | 3/2005 | Schuhmann et al. | |
| 2006/0042920 A1 | 3/2006 | Kubo | |
| 2006/0086351 A1 | 4/2006 | Wilgus et al. | |
| 2006/0279924 A1 | 12/2006 | Richardson et al. | |
| 2007/0087640 A1 | 4/2007 | Albertone et al. | |
| 2007/0133830 A1 | 6/2007 | Verne et al. | |
| 2007/0139873 A1 | 6/2007 | Thomas et al. | |
| 2007/0297149 A1 | 12/2007 | Richardson et al. | |
| 2008/0068934 A1 | 3/2008 | Hiranuma | |
| 2008/0192114 A1 | 8/2008 | Pearson et al. | |
| 2008/0298026 A1 | 12/2008 | Wang et al. | |
| 2009/0009945 A1 | 1/2009 | Johnson et al. | |
| 2009/0032420 A1 | 2/2009 | Zenzai | |
| 2009/0080153 A1 | 3/2009 | Richardson et al. | |
| 2010/0008028 A1 | 1/2010 | Richardson et al. | |
| 2010/0104814 A1 | 4/2010 | Richardson et al. | |
| 2010/0147737 A1 | 6/2010 | Richardson et al. | |
| 2010/0200456 A1 | 8/2010 | Parkinson | |
| 2010/0298025 A1 | 11/2010 | Spence | |
| 2011/0003213 A1 | 1/2011 | Burchardt et al. | |
| 2011/0043086 A1* | 2/2011 | Cui ........................ G06F 1/1626 |
| | | | 312/293.3 |
| 2011/0073608 A1 | 3/2011 | Richardson et al. | |
| 2011/0139643 A1 | 6/2011 | Elenes | |
| 2011/0143114 A1 | 6/2011 | Horie et al. | |
| 2011/0182463 A1 | 7/2011 | Lee | |
| 2011/0226545 A1 | 9/2011 | Richardson et al. | |
| 2011/0228458 A1 | 9/2011 | Richardson et al. | |
| 2011/0228459 A1 | 9/2011 | Richardson et al. | |
| 2012/0018323 A1 | 1/2012 | Johnson et al. | |
| 2012/0031914 A1 | 2/2012 | Liu | |
| 2012/0043235 A1 | 2/2012 | Klement | |
| 2012/0074005 A1 | 3/2012 | Johnson et al. | |
| 2012/0118773 A1* | 5/2012 | Rayner .................. G06F 1/1626 |
| | | | 206/320 |
| 2012/0211382 A1 | 8/2012 | Rayner | |
| 2012/0261306 A1 | 10/2012 | Richardson et al. | |
| 2012/0325723 A1 | 12/2012 | Carnevali | |
| 2013/0063004 A1 | 3/2013 | Lal et al. | |
| 2013/0255198 A1* | 10/2013 | Guschke ................. A61J 1/03 |
| | | | 53/467 |
| 2013/0264143 A1 | 10/2013 | Richardson et al. | |

FOREIGN PATENT DOCUMENTS

| | | |
|---|---|---|
| CN | 2829305 Y | 10/2006 |
| CN | 101142523 A | 3/2008 |
| CN | 201042019 Y | 3/2008 |
| CN | 101359156 A | 2/2009 |
| CN | 201639626 U | 11/2010 |
| CN | 201639626 U | 11/2010 |
| CN | 201878464 U | 6/2011 |
| CN | 102123863 A | 7/2011 |
| CN | 202455520 U | 9/2012 |
| EP | 2081201 A2 | 7/2009 |
| EP | 3373107 A1 | 9/2018 |
| JP | 8046371 A | 2/1996 |
| JP | 9023072 | 1/1997 |
| JP | 9023072 A | 1/1997 |
| JP | 3044740 U | 1/1998 |

(56) References Cited

FOREIGN PATENT DOCUMENTS

| JP | 10079582 A | 3/1998 |
|---|---|---|
| JP | 11231970 A | 8/1999 |
| JP | 11231973 A | 8/1999 |
| JP | 11284358 A | 10/1999 |
| JP | 2000125916 A | 5/2000 |
| JP | 2003324796 A | 11/2003 |
| JP | 20040247297 A | 9/2004 |
| JP | 2006064998 A | 3/2006 |
| WO | 2007056864 A1 | 5/2007 |
| WO | 2012/051358 A2 | 4/2012 |

OTHER PUBLICATIONS

International Search Report for International App. No. PCT/US2014/010524, five pages.
International Search Report and Written Opinion for PCT/US2014/010524, dated Jul. 3, 2014.
Int'l Search Report for EP18175763.4, dated Nov. 11, 2018.
Extended European Search Report; Application No. EP18175763.4 dated Nov. 6, 2018.
Anonymous: "[Review] the Newest Waterproof Case on the Market: Introducing the Ecape Capsule . . . | i PhoneLife.com," i Phone + i Pad Life Magazine Nov. 6, 2012 (Nov. 6, 2012), XP055292666, Retrieved from the Internet: URP:http://www.iphonelife.com/blog/28861/review-newest-waterproof-case-market-introducing-escape-capsile [retrieved on Aug. 2, 2016].
Canadian Office Action cited in Canadian Application No. 2,897,399 dated Oct. 11, 2018.
Extended European Search Report for European Application No. 20159168.2 dated Jun. 10, 2020, 6 pages.
Extended European Search Report for European Application No. 20159283.9 dated Jun. 3, 2020, 6 pages.
Chinese Office Action cited in Chinese Application No. 201910261408.7 dated Jul. 31, 2020. 33 pages.

\* cited by examiner

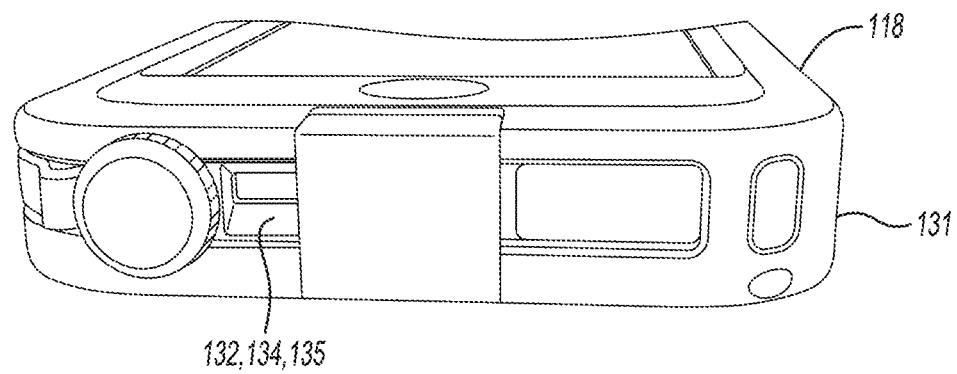
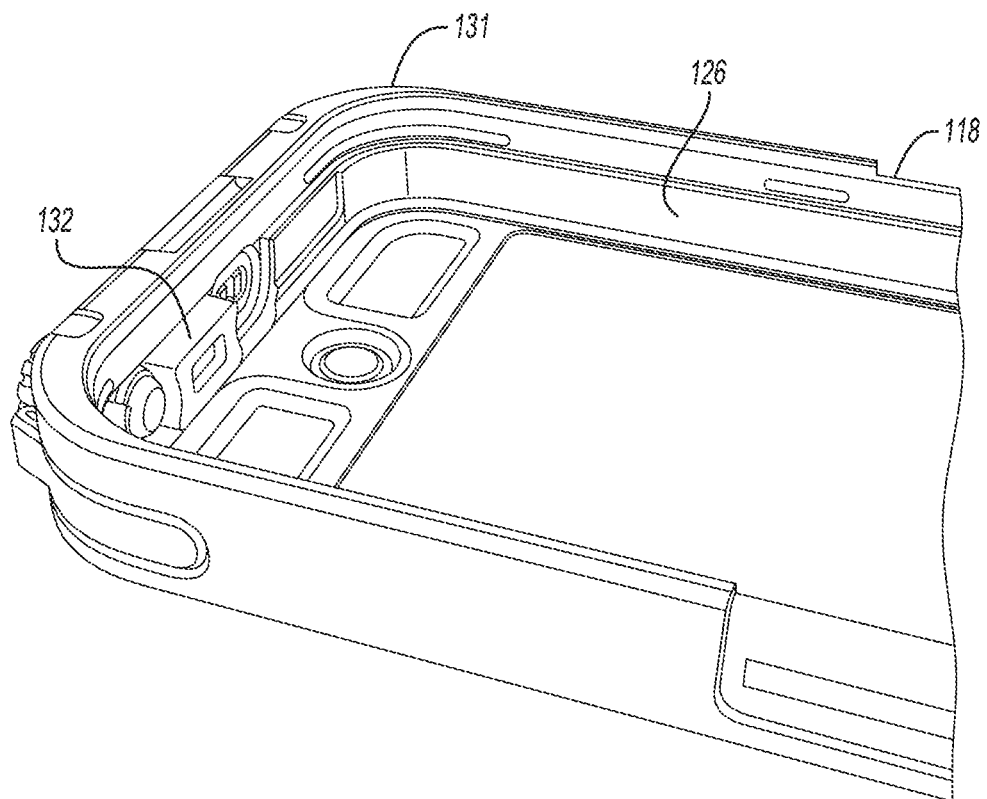
Fig-10

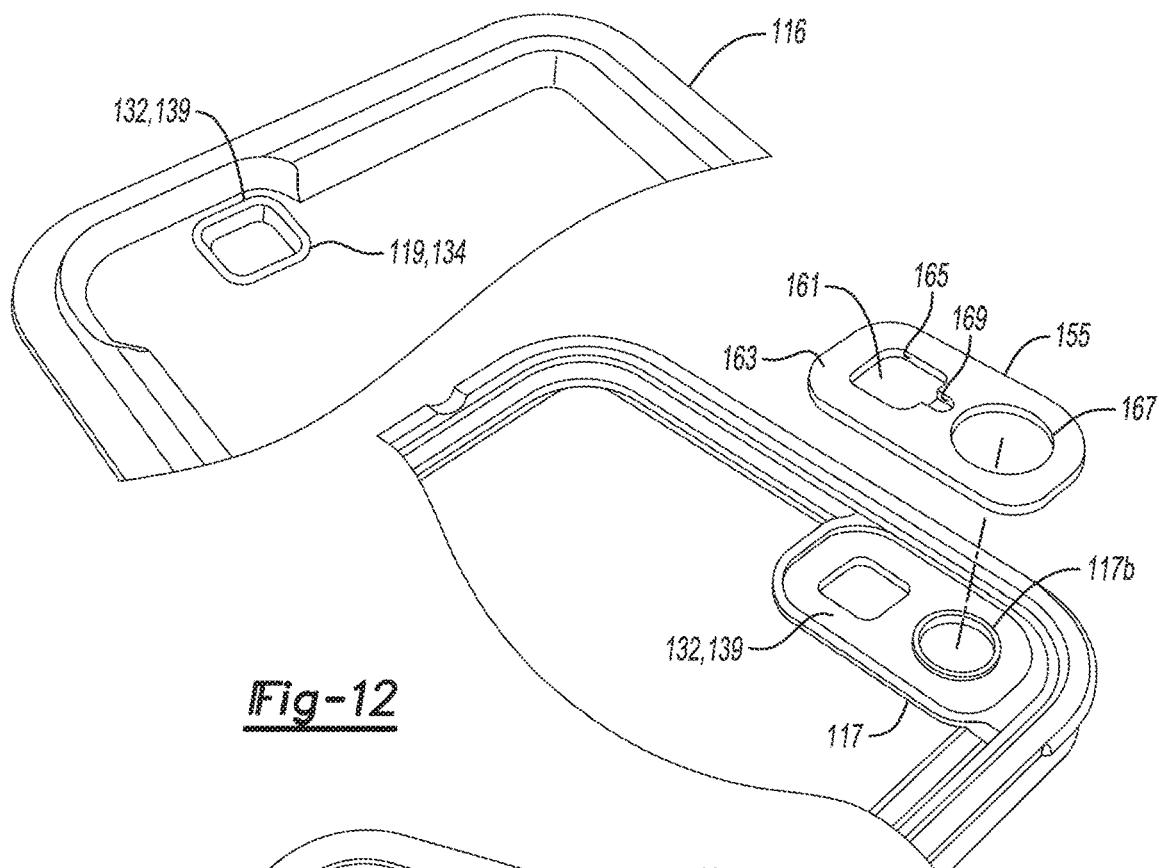
Fig-12
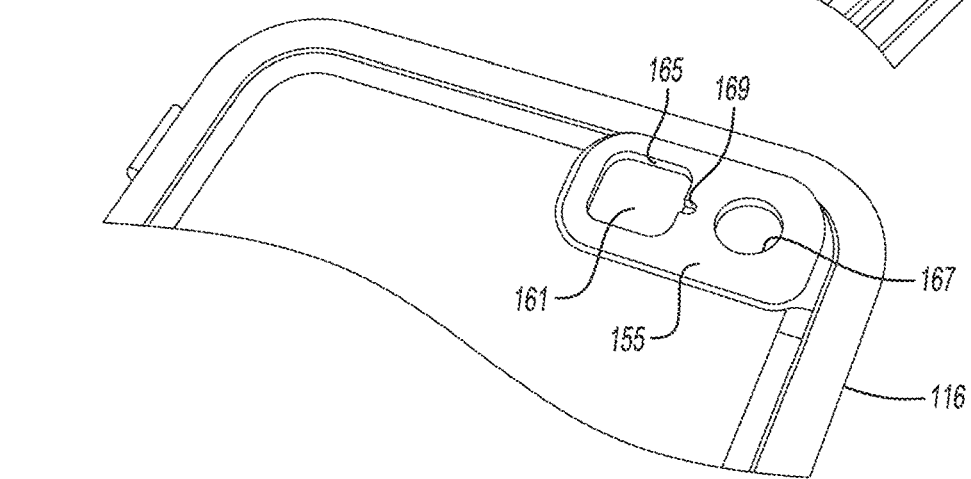
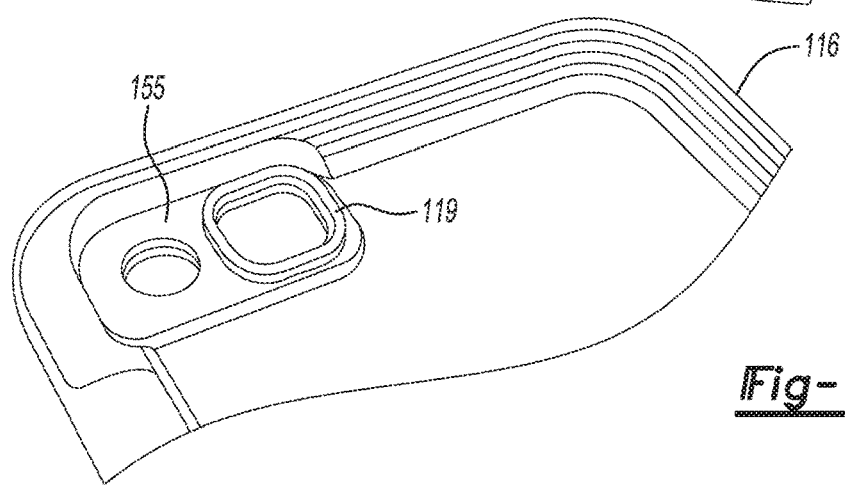
Fig-13

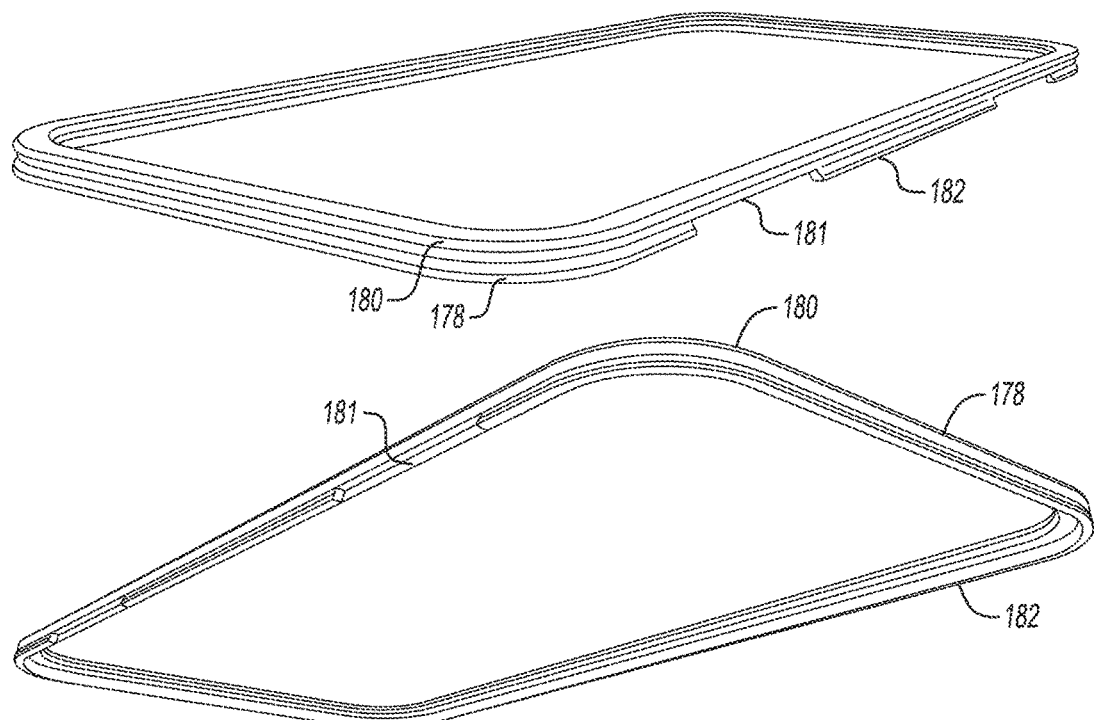
Fig-15
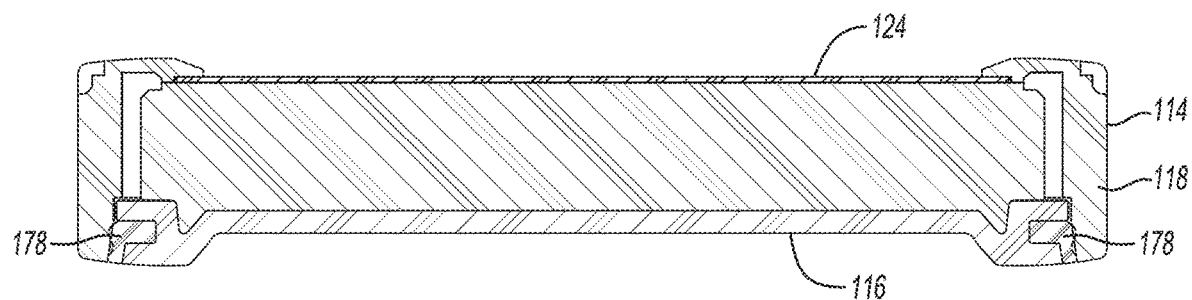
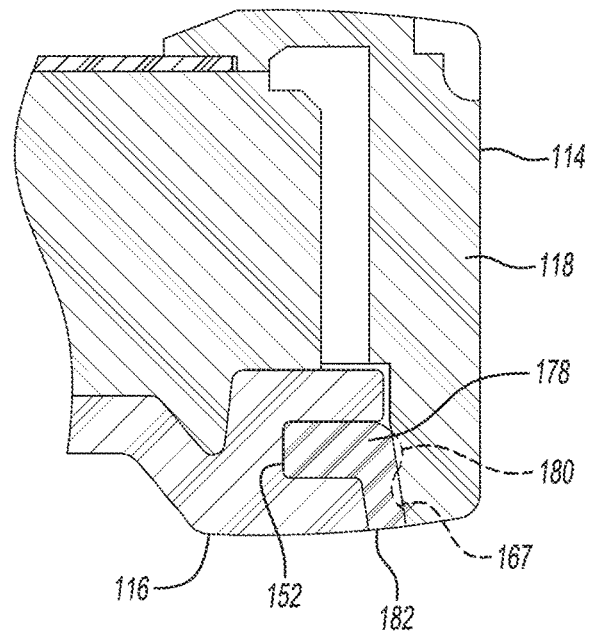
Fig-16A

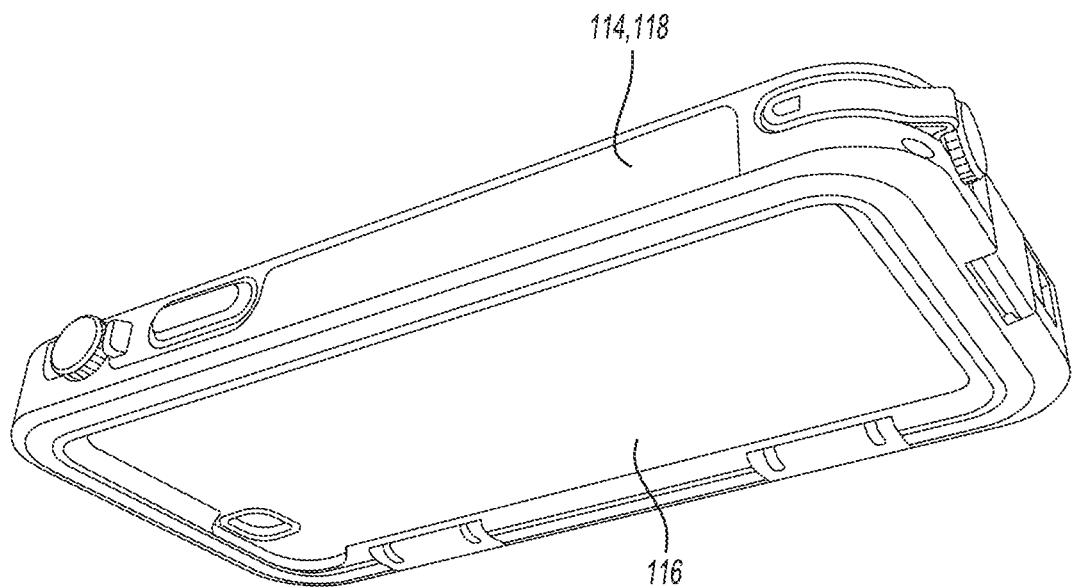
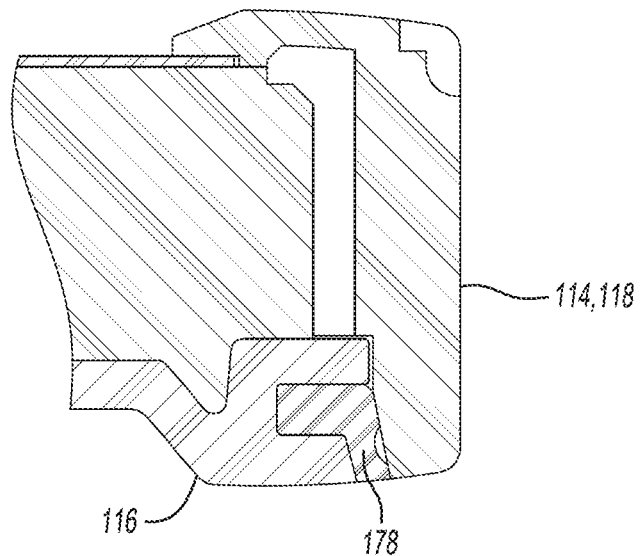
Fig-16B

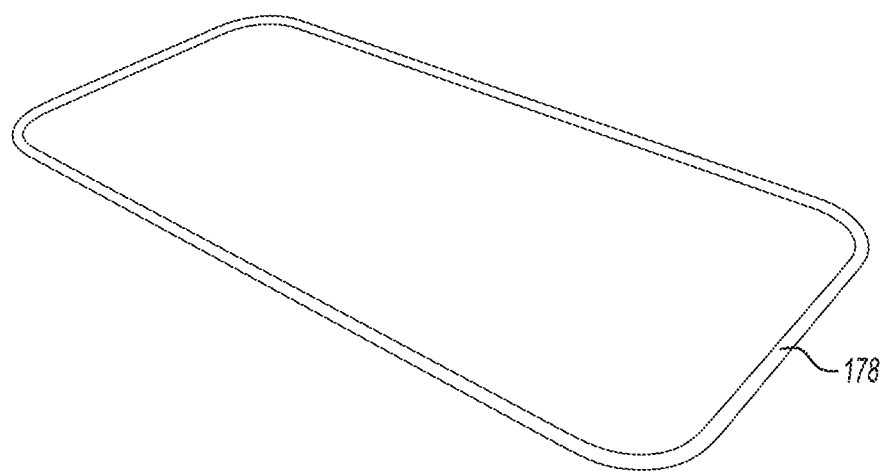
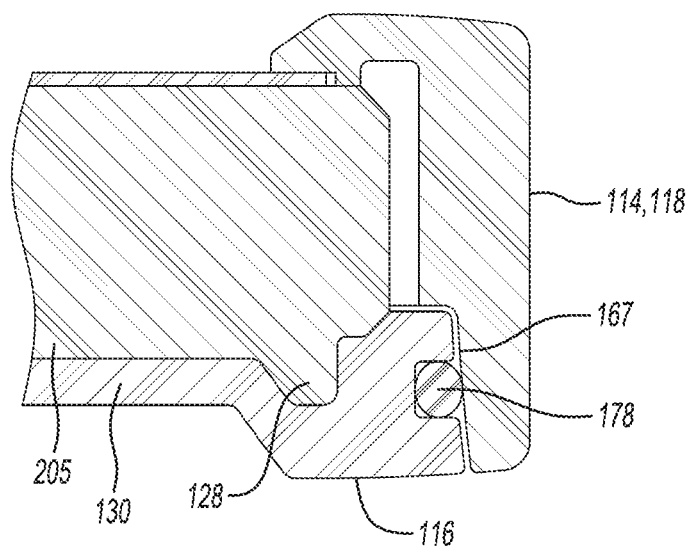
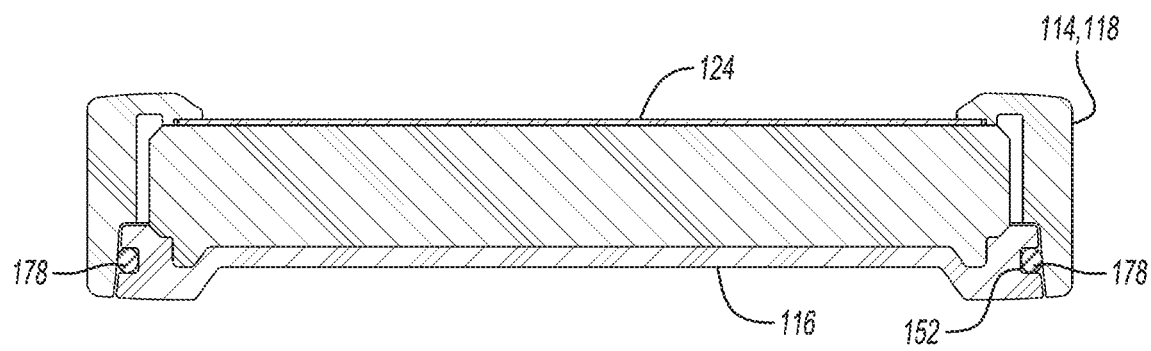
Fig-16C

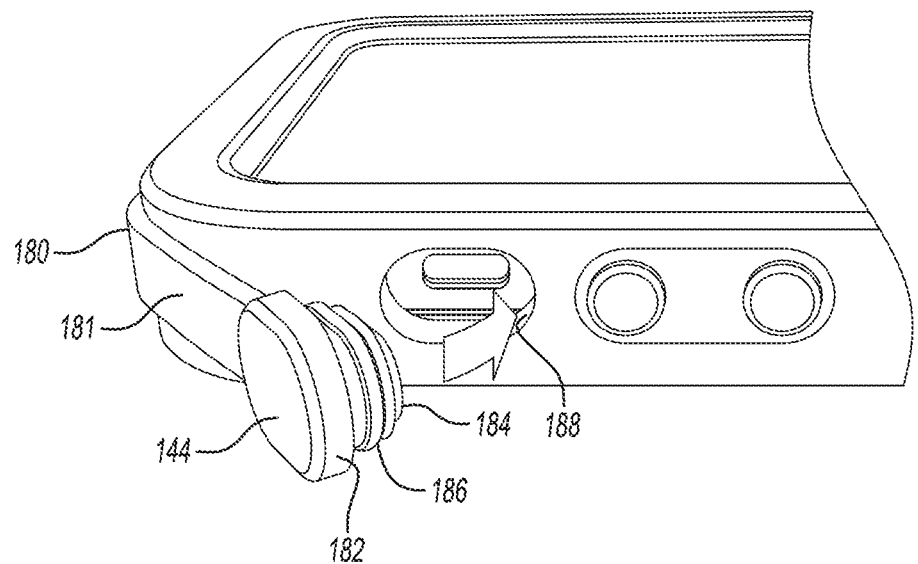
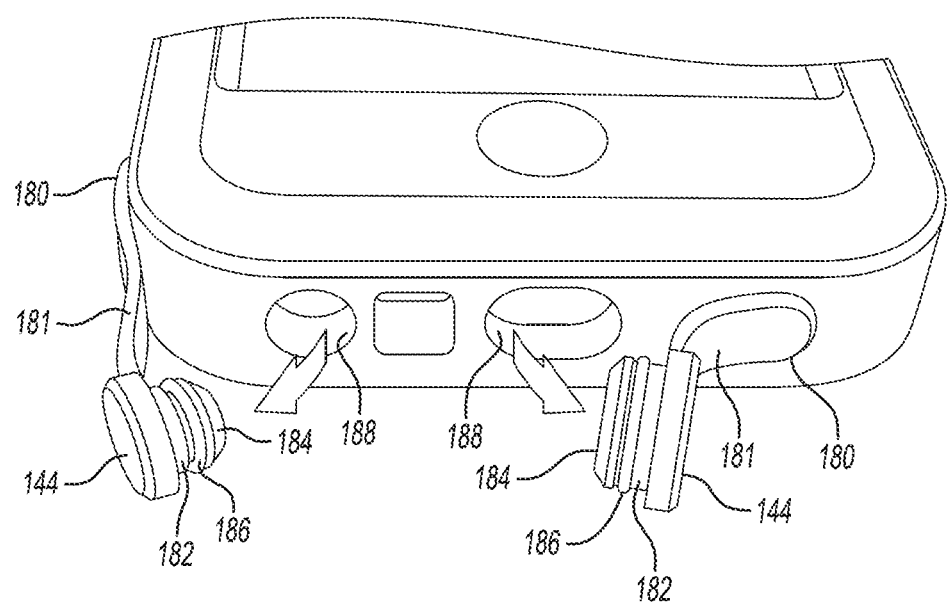
Fig-17B

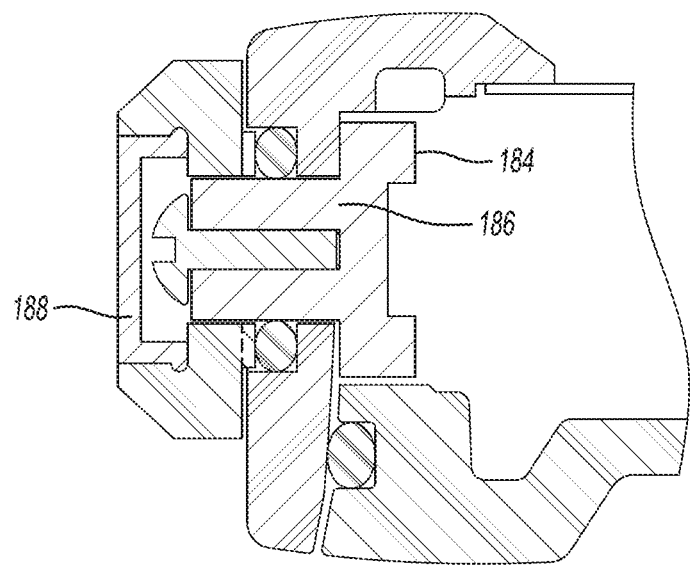
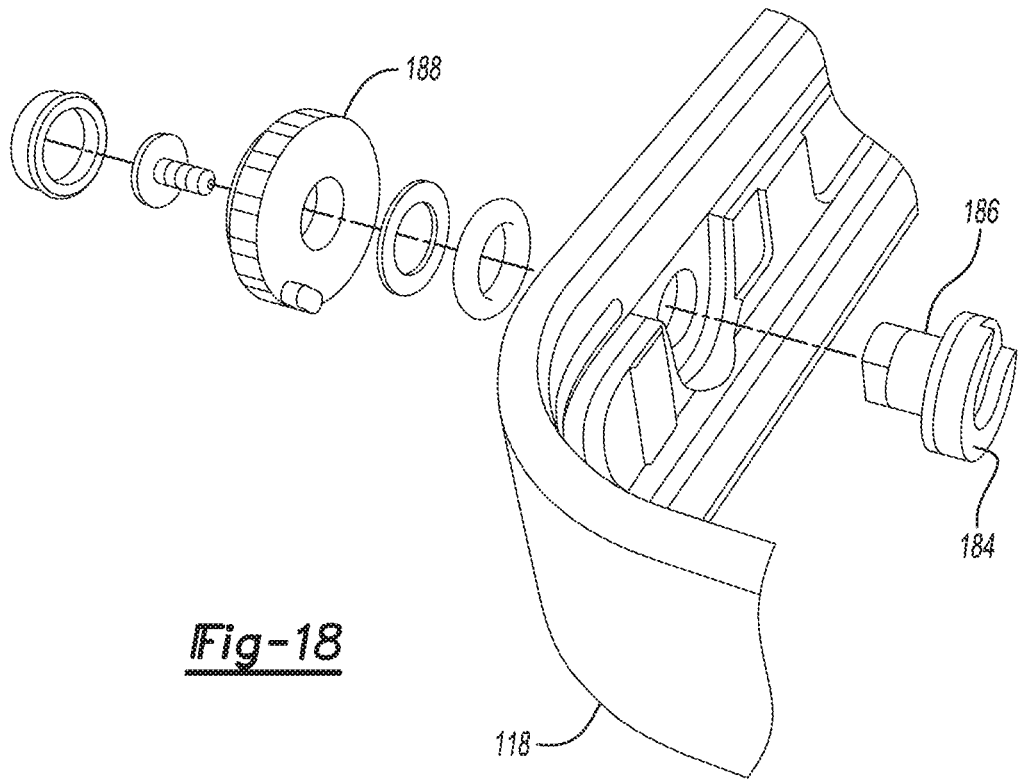
Fig-18

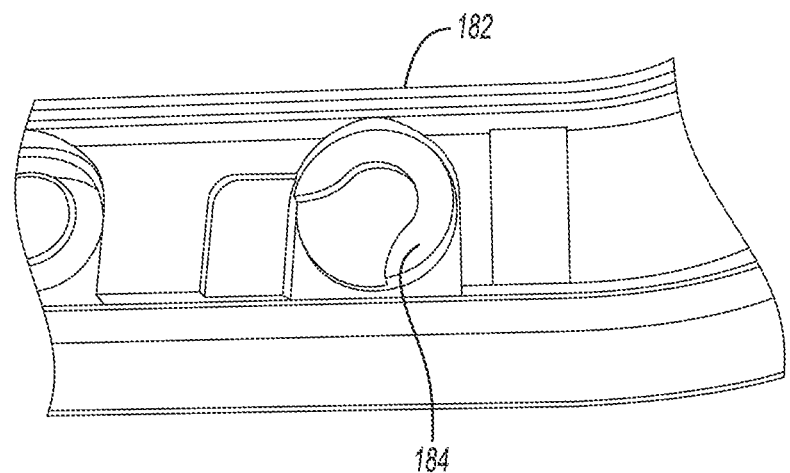
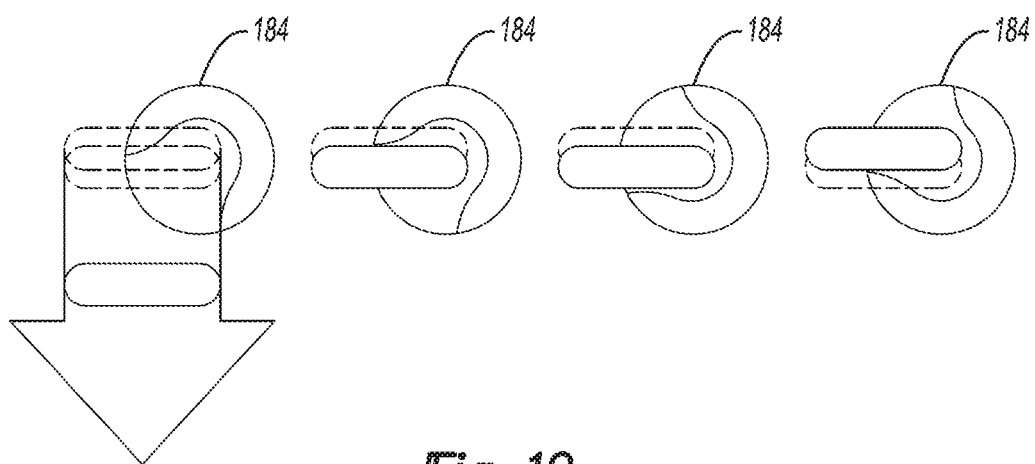
Fig-19

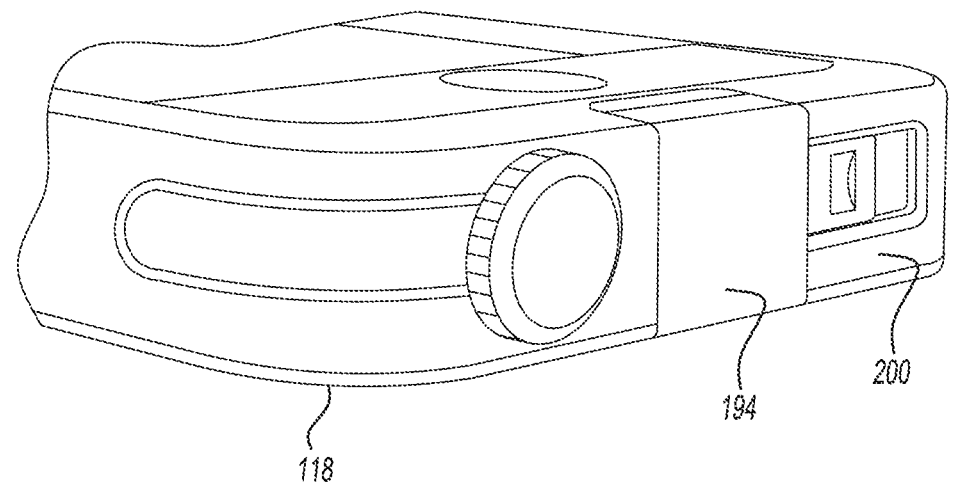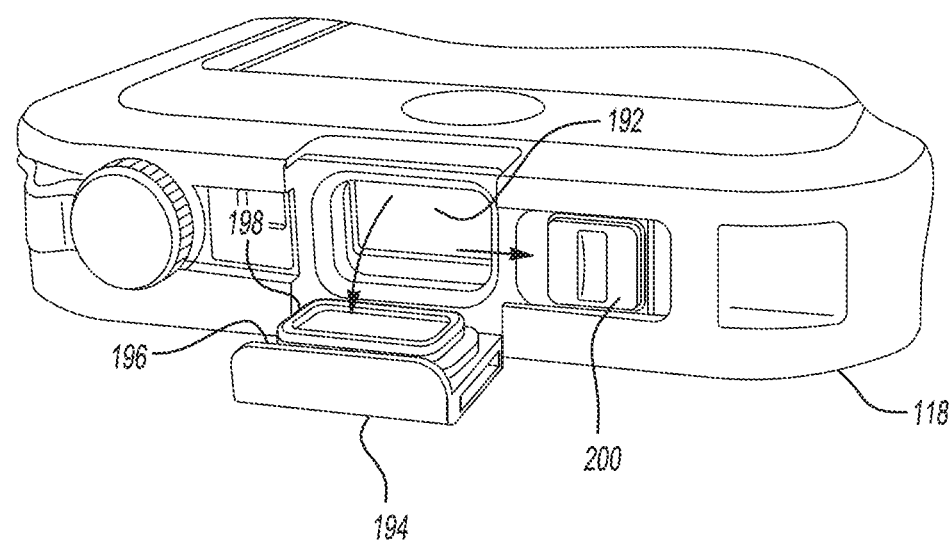
Fig-21

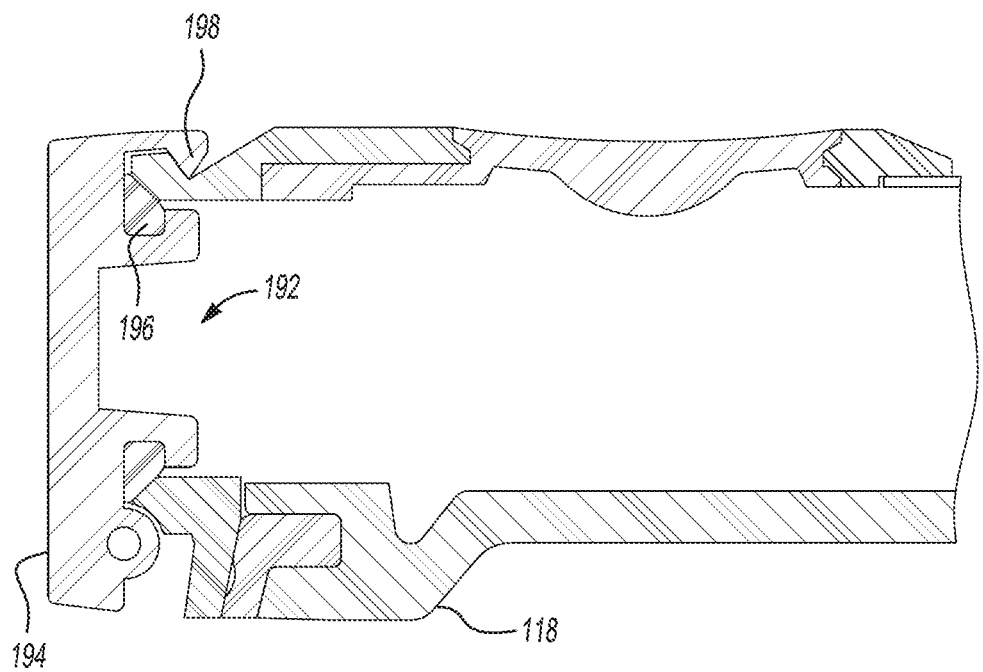
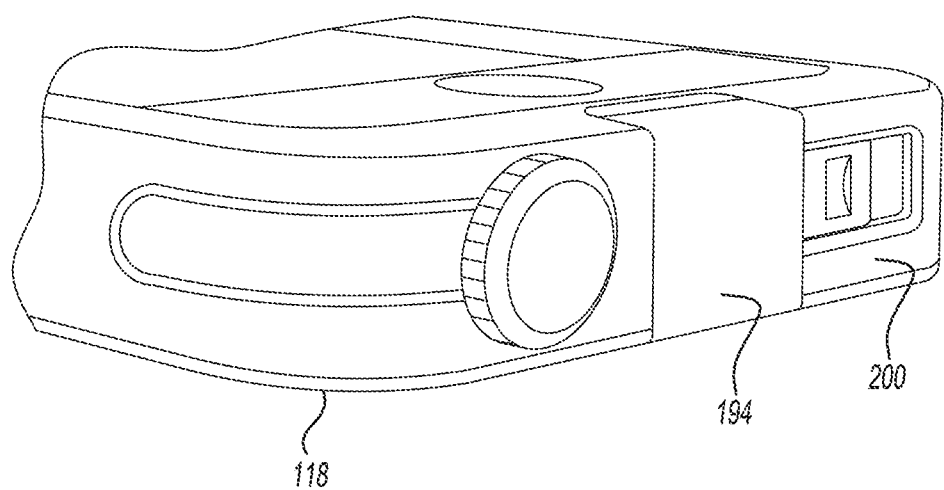
Fig-22A

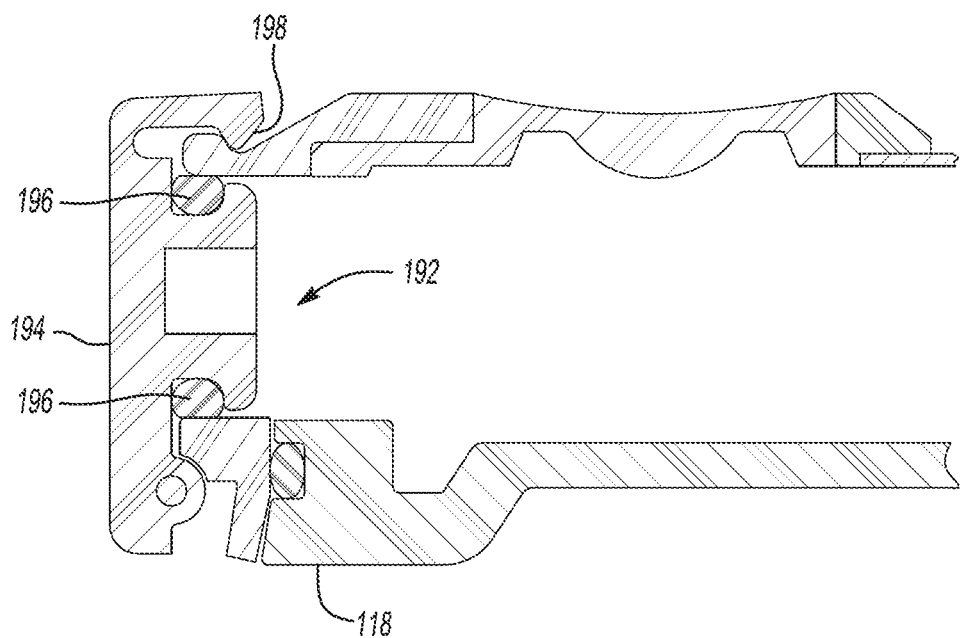
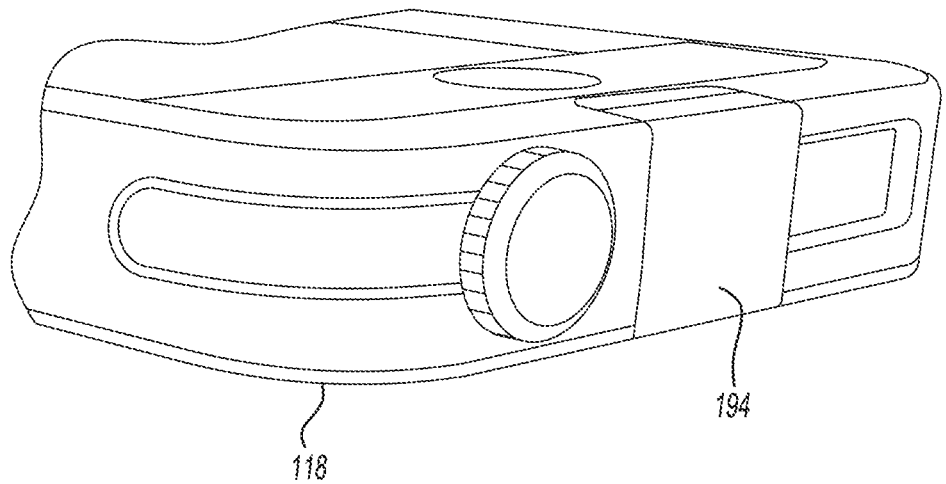
Fig-22B

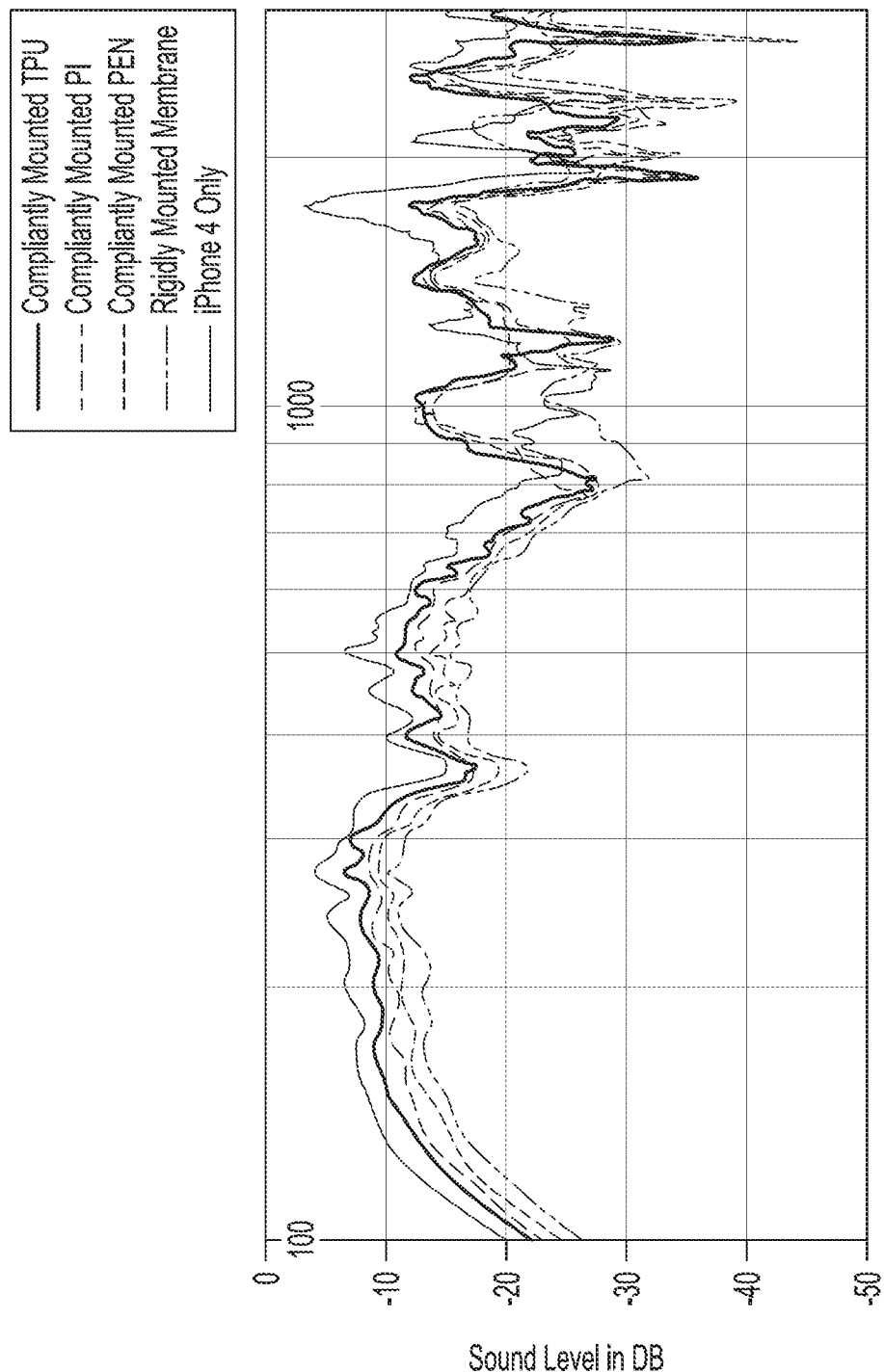

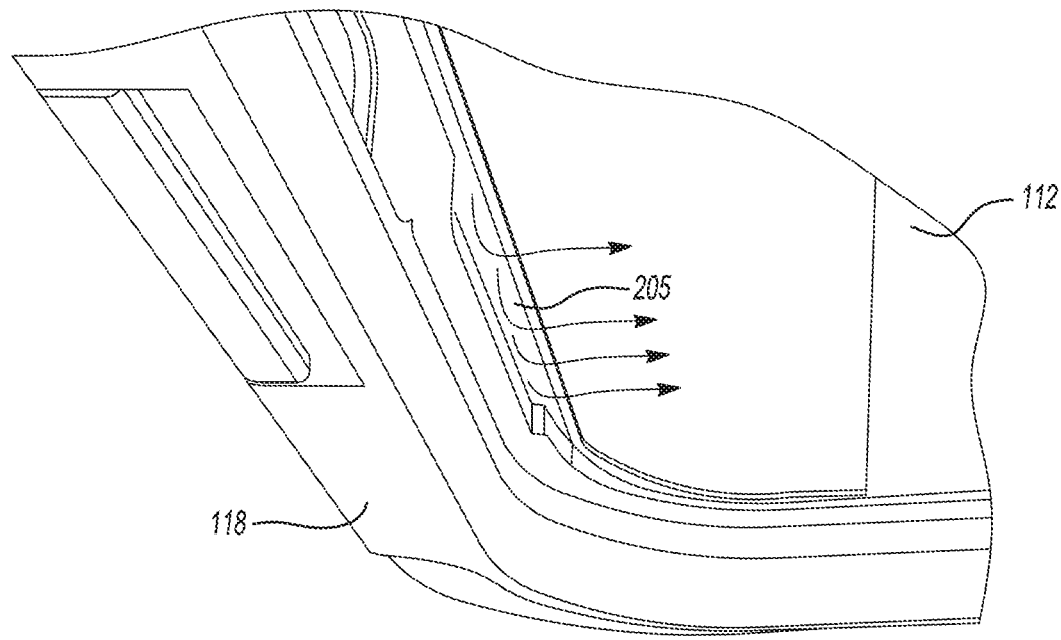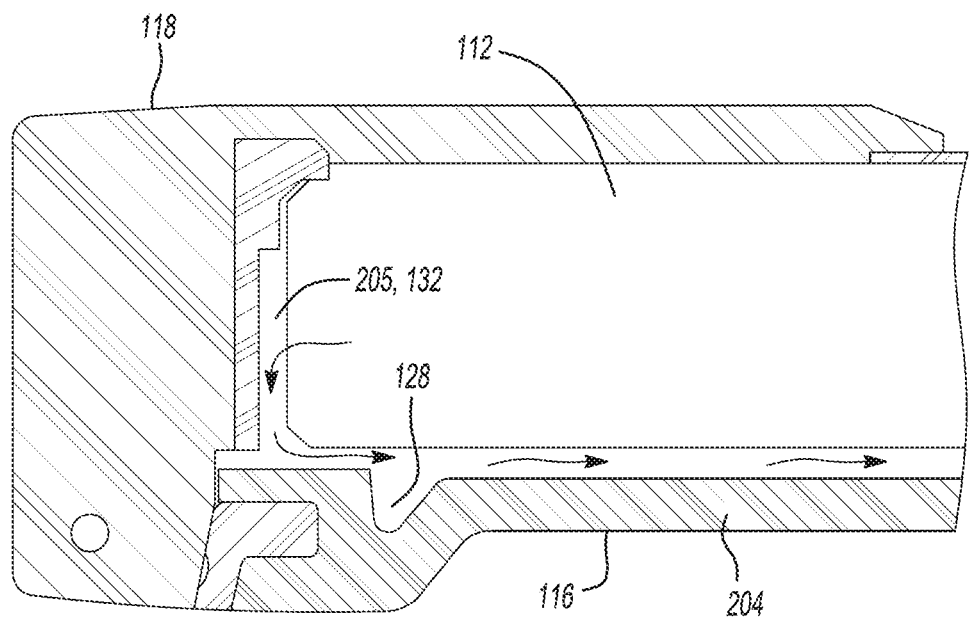
Fig-24

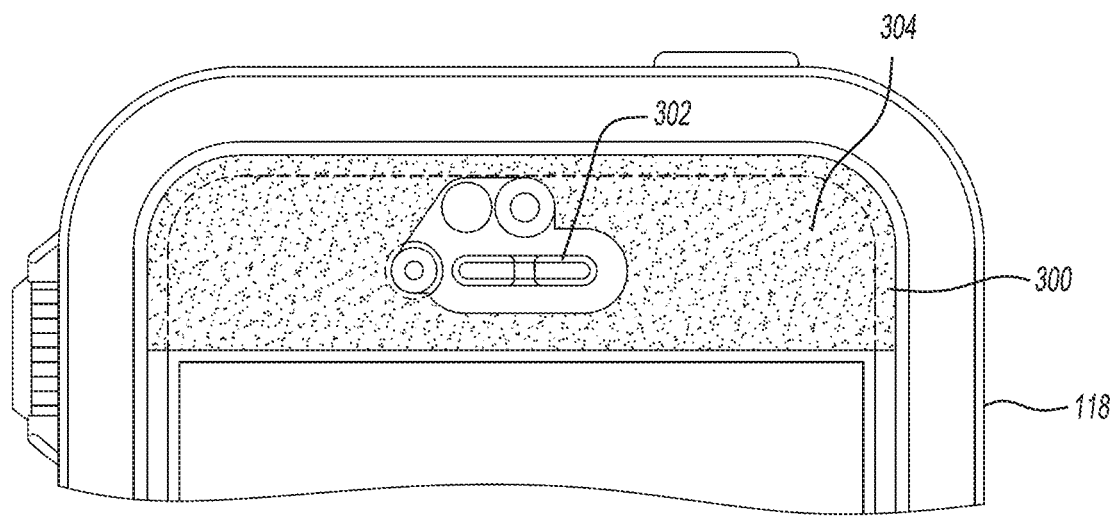
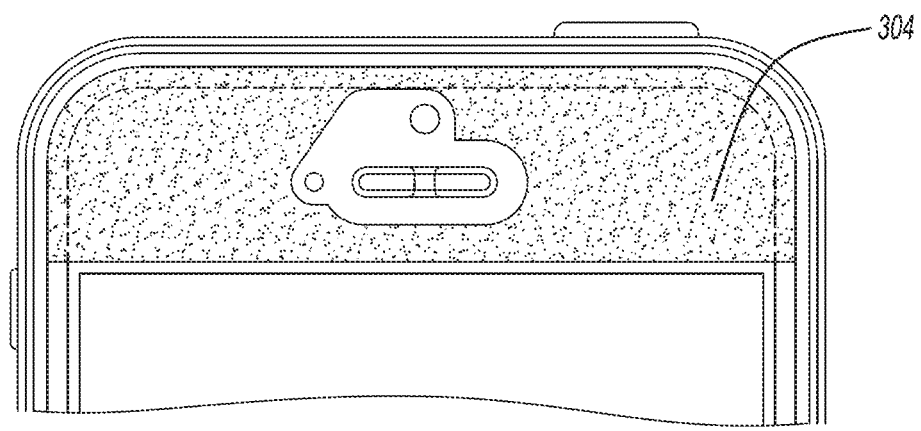
Fig-28

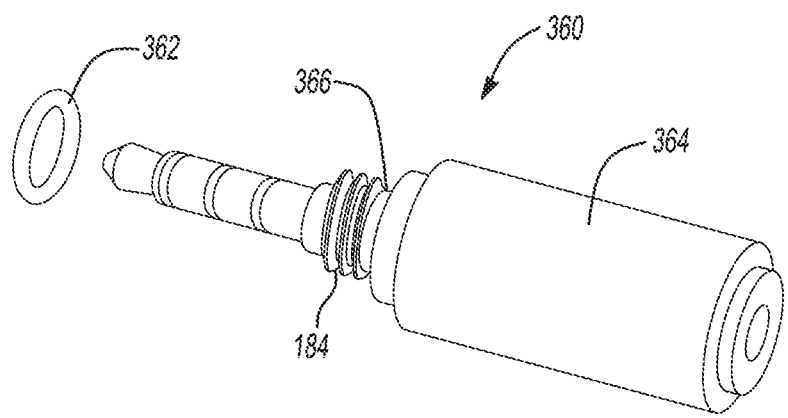
Fig-29
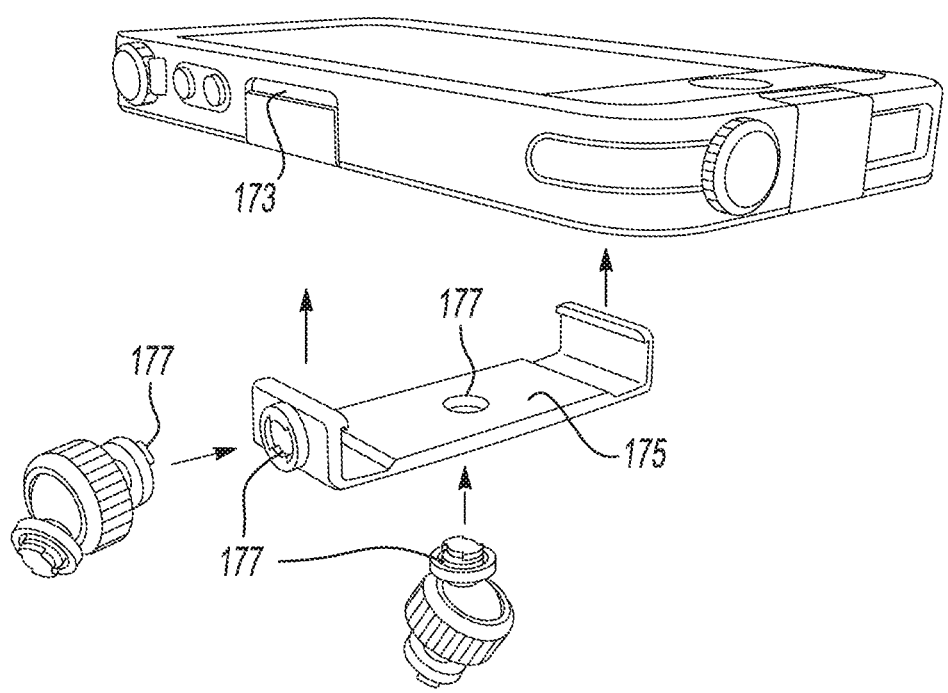
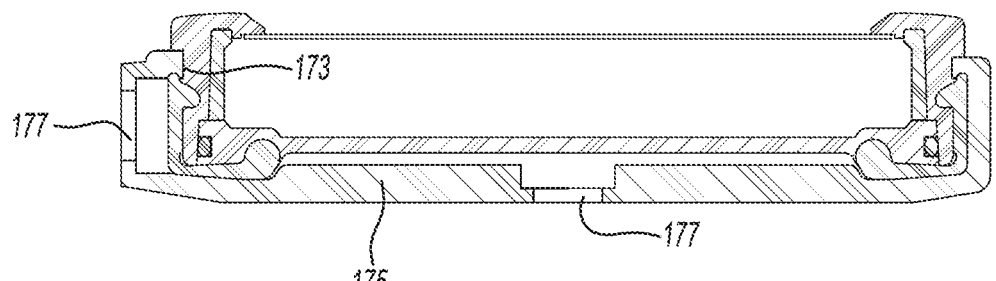
Fig-30

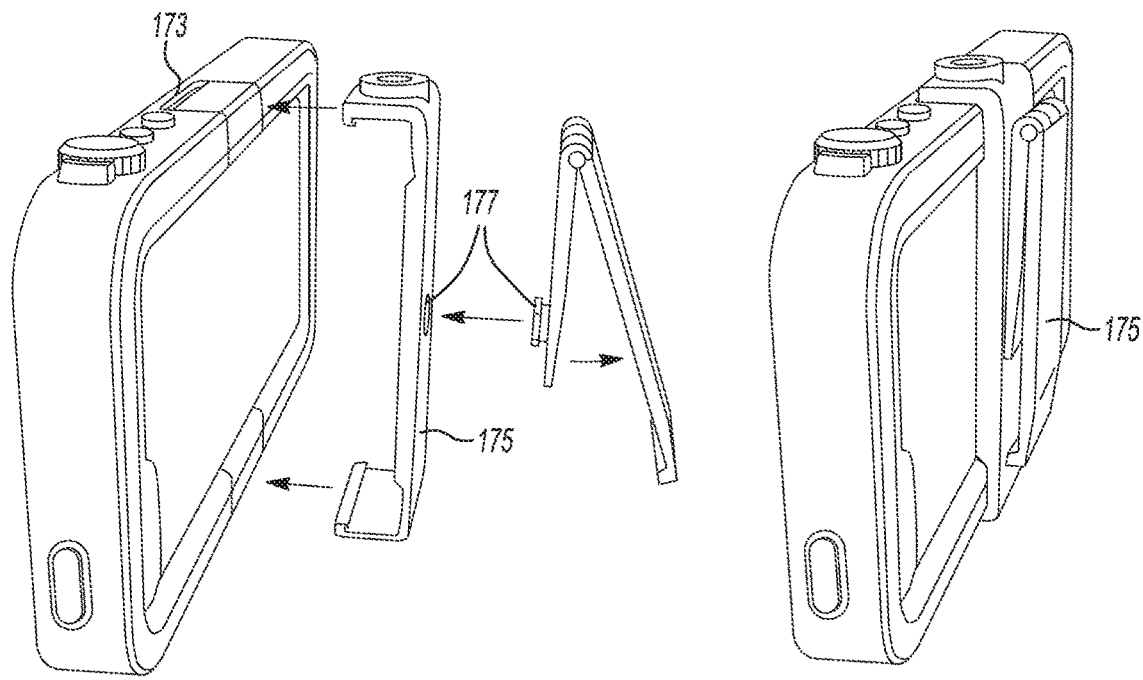
Fig-31
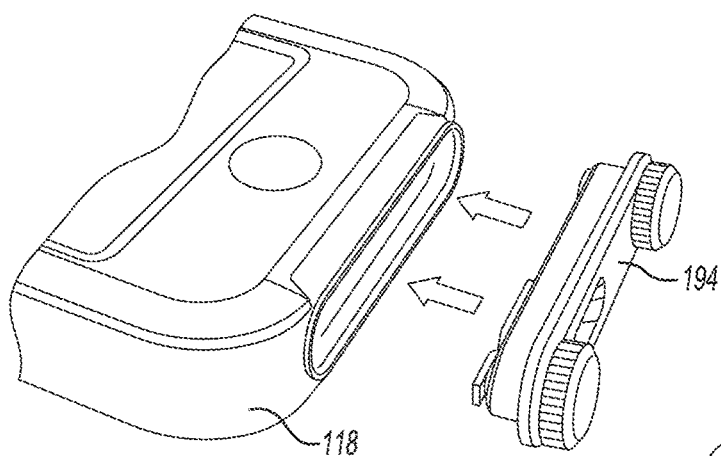
Fig-32
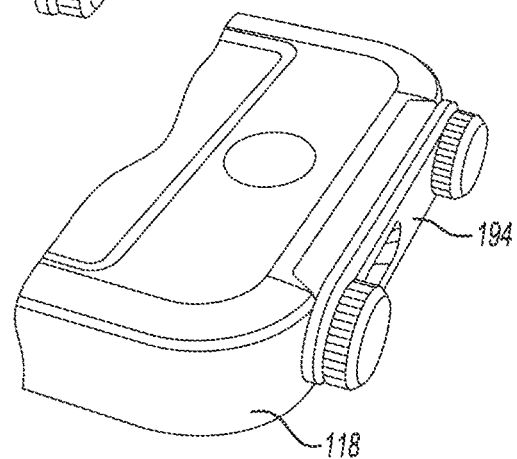

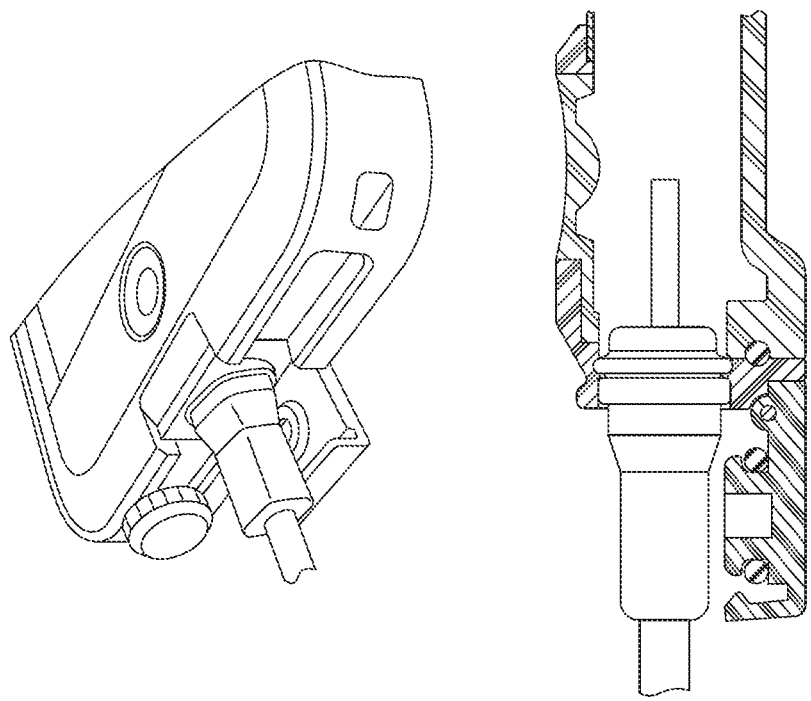
Fig-33
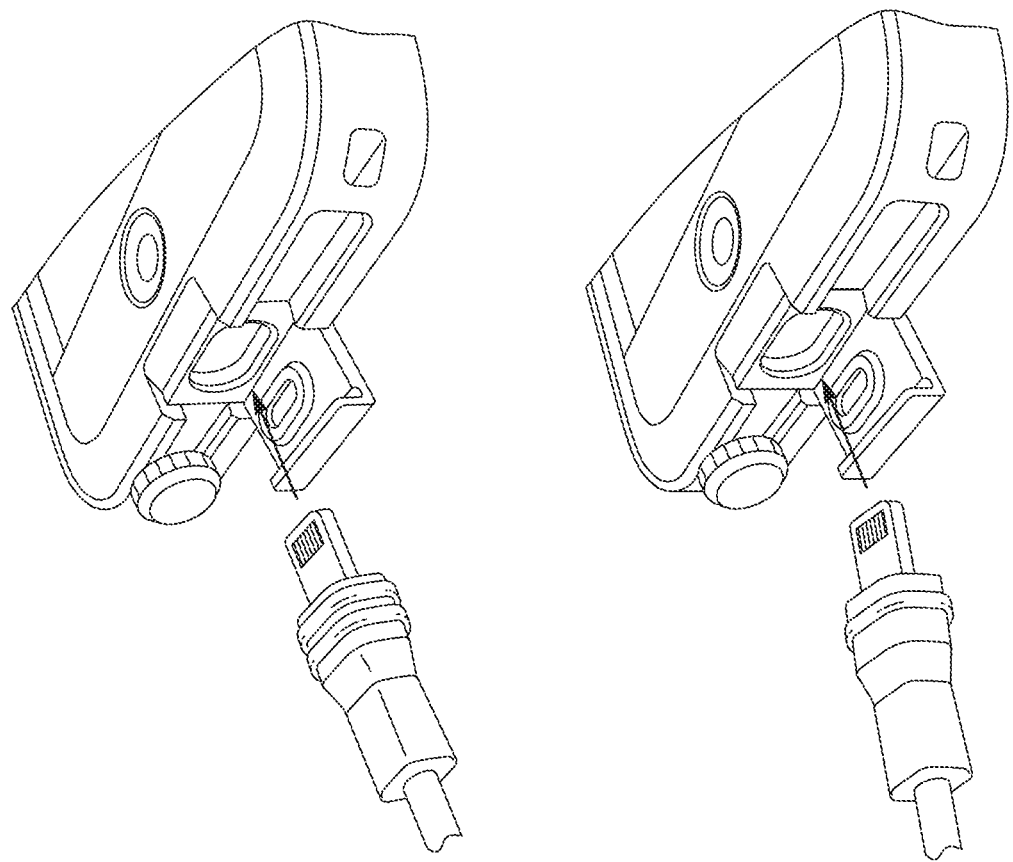

WATERPROOF CASE

CROSS REFERENCE TO RELATED APPLICATIONS

This application is a continuation application of U.S. application Ser. No. 15/694,118 filed on Sep. 1, 2017 which claims priority to U.S. application Ser. No. 13/835,915 filed on Mar. 15, 2013 which claims priority to provisional application No. 61/526,093 filed on Aug. 22, 2011, utility application Ser. No. 13/591,944 filed Aug. 22, 2012 and provisional application 61/749,752 filed Jan. 7, 2013 all of which are herein incorporated by reference in its entirety.

FIELD OF THE INVENTION

The invention relates to water and air sealed cases for electronic devices.

BACKGROUND OF THE INVENTION

Waterproof housings for various devices are known in the art. However such water proof housings are not specifically designed for the actuation of buttons, switches, toggles or screens and sensors to function of the enclosed electronic device and to provide a clear transmission of sound from the interior of the case to an exterior of the case and/or from the exterior to the interior of the case. There is therefore a need in the art for a water tight case that has an improved sound transmission and allows a user to actuate various portions of the device and for sensors to function while positioned within the case.

While waterproof housings exist in the art, what is not understood is how to create a waterproof housing that allows the enclosed device to operate and effectively transmit sound into and out of a sealed enclosure using mechanical means through the use of strategically placed air cavities and acoustic membranes to translate acoustic energy into vibrational energy. Devices in most waterproof housings may not transmit sound effectively, may have problems with reverberations from vibrational effects of the housing itself or feedback from echoes from other sound sources within the housing, or may not allow the concurrent operation of other sensors of the electronic device as this is not obvious and is thus the subject of this patent. In order to allow the full functionality of the electronic device housed within a waterproof housing, such a housing requires the strategic use and placement of air cavities and the use of specific acoustic membranes for sound transmission.

SUMMARY OF THE INVENTION

In one aspect, there is disclosed a protective case for an electronic device that includes a main housing. The main housing receives an electronic device including a switch. The main housing includes a slot formed therein proximate the switch of the electronic device. A toggle is rotatively positioned within the slot. The toggle includes a pair of raised contact portions and the switch is positioned between the raised contact portions and actuated by rotation of the toggle.

In another aspect, there is disclosed a protective case for an electronic device that includes a main housing. The main housing receives an electronic device including a switch. The main housing includes a slot formed therein proximate the switch of the electronic device. A toggle is rotatively positioned within the slot. The toggle includes a circular body having the pair of raised contact portions formed on a lower surface and the switch is positioned between the raised contact portions and actuated by rotation of the toggle.

In a further aspect, there is disclosed a protective case for an electronic device that includes a main housing. The main housing receives an electronic device including a switch. The main housing includes a slot formed therein proximate the switch of the electronic device. A toggle is rotatively positioned within the slot. The toggle includes a pair of raised contact portions and the switch is positioned between the raised contact portions and actuated by rotation of the toggle. The pair of raised contact portions are positioned within the main housing, the toggle including a shaft extending from the pair of raised contact portions and passing through the slot.

BRIEF DESCRIPTION OF THE DRAWINGS

FIG. 10 are perspective views of a microphone port and membrane of another embodiment;

FIG. 12 is a partial perspective view of the lid and membrane assembly for a second microphone port of the second embodiment;

FIG. 13 is a partial perspective view of the lid and membrane assembly for a second microphone port of the second embodiment;

FIG. 15 is a perspective view of a seal of the lid of the second embodiment;

FIG. 16A-C are perspective and sectional views of the case including the lid and main housing and seal of the second embodiment;

FIG. 17A-17B are perspective views of the case and plug of the second embodiment;

FIG. 18 is a perspective and sectional view of the case and a toggle for actuating a device of the second embodiment;

FIG. 19 is a perspective and partial sectional view of the case and a toggle for actuating a device of the second embodiment;

FIG. 21 is a perspective view of the case including an access port of the second embodiment;

FIGS. 22A, 22B, and 22C is a perspective view and sectional view of the case including an access port of the second embodiment;

FIG. 23 is graph of acoustic responses for membranes;

FIG. 24 are perspective views of a case member showing air gaps of the second embodiment;

FIG. 28 is a front view of an isolation assembly area positioned about an ear piece;

FIG. 29 are views of an audio jack assembly;

FIG. 30 is a perspective view and sectional view of the case and mounting feature;

FIG. 31 are perspective views of the case and mounting feature;

FIG. 32 are perspective views of an alternate door structure

FIG. 33 are perspective views of a charge plug and the access port.

DETAILED DESCRIPTION OF THE PREFERRED EMBODIMENTS

Figure 1:
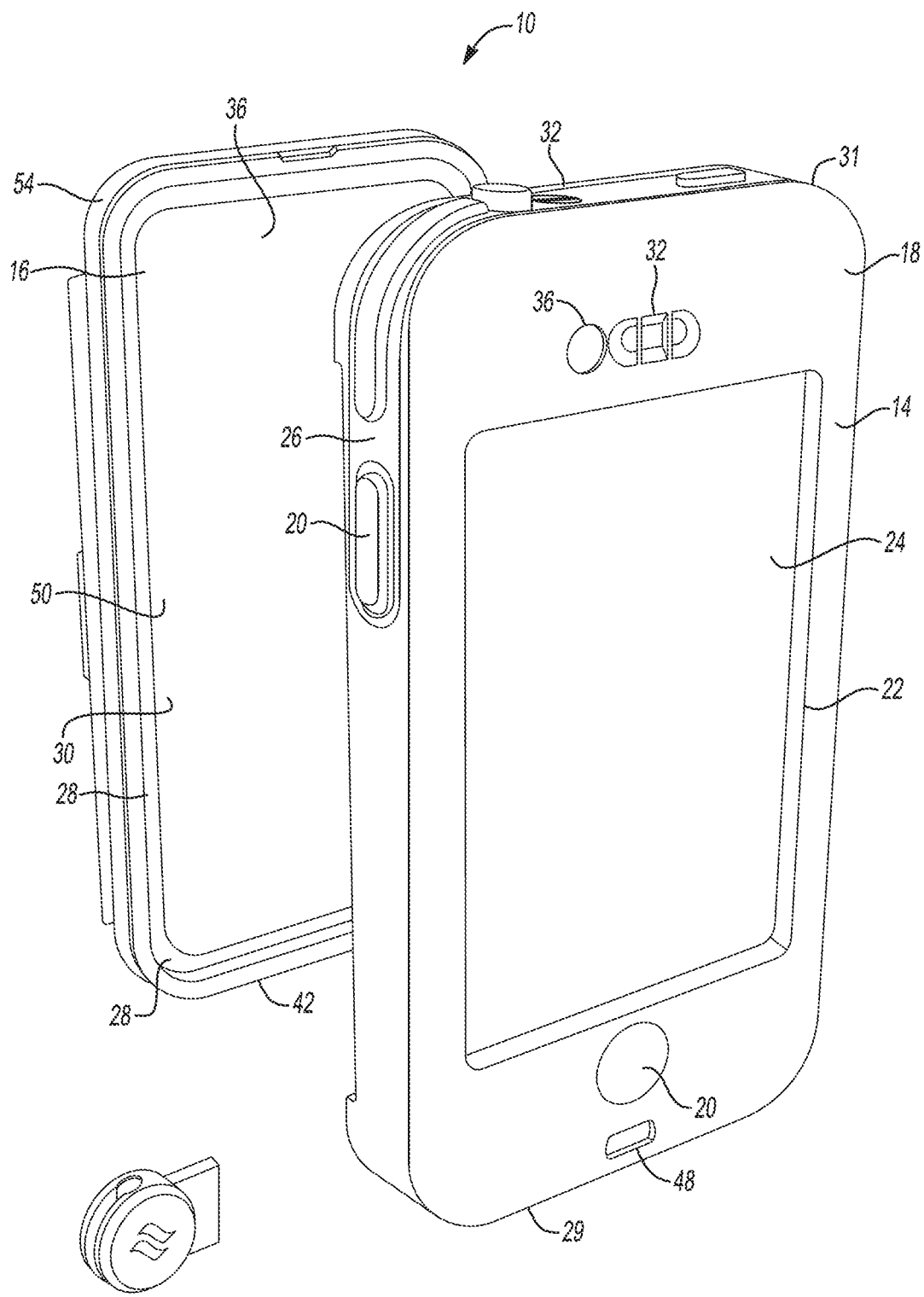
FIG. 1 is an exploded perspective view of one embodiment of a protective case.

Referring to the various figures there are shown various embodiments of a water proof case 10 that includes water tight acoustic membranes. For the purposes of creating a waterproof housing to protect the contents of the housing, it is desirable to have a housing made with thick solid walls made of a structurally strong water proof material that can withstand the external environment that it is exposed to and as few openings as possible. However for the functions of some electronic devices, there exists a need to have sections that allow the actuation of the device or to somehow allow input and output to be captured. For example, specific functional features of enclosed devices may require sensory response or input such as to proximal visual, reflective, conductive, magnetic, electromagnetic, vibratory, pressure, inductive, piezoelectric, or acoustic elements in the external environment in order for features to operate or buttons or switches to actuate functions. The enclosed devices may have other features that capture input or generate output, such as to capture images, acoustic environment, signals, or to generate light, sound, vibrations, signals. In some of the features described, a consistent thick wall for a waterproof housing will not allow the device to serve this functional purpose within the housing. Hence, some sections may require specific elements to allow the enclosed device to function and operate in a waterproof environment. Of all of these functions, one of the more challenging elements is the capture and transmission of acoustics in a waterproof housing. In order for a speaker to transmit and propagate sound, there may exist strategic air gaps, cavities, channels, and ports within a housing so that the walls of the housing can act to vibrate or propagate sound out of the housing. Where there is less room for a sufficiently large surface area for speaker output to vibrate, sound may be directed through the use of strategically placed air gaps, cavities, channels, ports, ribs, pockets or holes to an area within a housing where sound may be transmitted using an appropriately thin wall section or flat membrane formed of a suitable material and of a surface area not too small so that it can freely vibrate. This membrane may be of sufficient thickness such that it is able to convert the amount of acoustic energy as it may otherwise be subjected to excessive vibration resulting in a buzzing sound that affects sound transmission. If the membrane is unable to handle the acoustic energy without excessive vibration, it is possible to increase the thickness of the material or alter the boundary conditions by using damping materials and compliantly mounting the membrane so that it can still vibrate but not excessively. A combination of several criteria may be modified to achieve sufficient propagation of overall volume and lower tonal frequency of sound transmitted by increasing the volume of air or size of the air chamber, mounting the membrane more compliantly or flexibly, using a thinner material, increasing the size of the membrane, adjusting the proportions of the membrane, changing the membrane material as it is more acoustically transparent in the desired frequency range or changing the boundary conditions and damping materials used. For example, a wall of the main housing or the entire lid may be used as the membrane to propagate sound with sufficiently large proportions of a suitable thickness such that it is designed, mounted or assembled to allow the wall or lid to flexibly vibrate.

In one aspect, the ability to transmit sound in and out of a water tight housing through the design of the membranes and housing differs from that of those known in the art. In order for a microphone to operate, a thin membrane may be assembled over a sound port such that it forms a waterproof barrier. The thin membrane may or may not be permeable to air but is not be permeable to water. The membrane may be assembled using glue, solvent bonding, double stick tape, ultrasonic welding or other methods of bonding such that the construction is waterproof. The thin membrane transmits acoustic energy from the exterior of the case to vibrational energy of the membrane and generates sound waves on the interior side of the membrane that are directed to a specific microphone on the electronic device in the waterproof housing. The membrane may be assembled flat and not wrinkled, compliantly mounted and made of a sufficiently thin material that has suitable acoustic transparency and of an appropriately surface area so that it can vibrate and propagate sound into the housing. The material properties of the membrane may be chosen for their range of acoustic frequency response and their ability to withstand temperature and environmental exposure. The outside of the sound port on the exterior of the case can have a channel to direct and amplify sound by using a funnel shape. In order to have an increase in overall volume and lower frequency sound allowing the acoustic membrane to function properly with less distortion and a more full bass range for a microphone, it is desirable to create an air tight seal between the microphone port of the electronic device and the acoustic membrane on the sound port to create an isolated air cavity and avoid a reduction of the dB of lower frequency sound that passes through the membrane and increase overall loudness allowing a louder, more full, rich and neutral tonal frequency for the voice and shift from the higher frequency distortion that would otherwise result without a sealed air cavity. The sealed air cavity may be created using foam, rubber or other damping materials to direct, isolate and channel sound directly from the sound port to the microphone of the device, which also serves to dampen and prevent reverberations and feedback from other internal sources of sound, including speakers and the housing itself from affecting sound transmission Strategic air channels and damping materials may be used to isolate noise from ambient sound traveling from other areas, openings or the housings and in effect can channel or direct sound such that an omnidirectional microphone can effectively operate as if it were directional.

In one aspect, a thin waterproof acoustic membrane functions best when it is mounted closer to the microphone and closer to the internal portion of the housing as its vibration becomes the sound source for the microphone. A spaced membrane located further from the microphone may lower the volume of sound detected by the microphone and the membrane may need to have a larger dimension or be of a thinner material to achieve the same effect, which is a constraint in developing a functional waterproof housing to transmit sound for some devices. The mounting of such a membrane may be flat and not wrinkled as that may lead to acoustic distortion and the bond strength of the adhesive must be sufficient to keep the membrane from deformation which also affects acoustics and waterproofness.

In one aspect, where the enclosed electronic device serves a functional purpose of voice communication, there are disclosed materials that are suitable to form acoustic membranes that produce a suitable frequency range for the human voice, primarily from 100 Hz to 3000 Hz. By selecting materials with a suitable Young's modulus and density, the membrane frequency response can be adjusted to a target frequency. As shown in FIG. 23 the compliantly mounted membranes have a higher output in decibels than the rigidly mounted membrane.

For a speaker, a large dimension membrane is desirable to vibrate and transmit sound outward. Such a membrane may be mounted to allow it to flex or vibrate using a compliant mounting or the membrane may have a sufficiently large dimension or a sufficiently thin dimension to vibrate and transmit sound outward.

In order to create a waterproof seal, an appropriate adhesive may be selected to create a strong bond taking into account the surface energy of the materials, the surface area for bonding and the compliance of the bond allowing the membrane to vibrate and transmit sound.

Equally important to the selection of the acoustic and waterproof membrane materials are the boundary conditions selected of how the membrane is mounted as this will also affect the frequency range of the membrane. More compliant, less rigid mounting conditions will result in a lower frequency range. The lowest frequency of resonance of the membrane may be limited by mechanical and material parameters. In a compliantly mounted membrane, the low frequency mode of a membrane rigidly bonded to the surrounding housing can be determined to approximate the frequency response of a diaphragm defined as a free vibrating edge-clamped circular disc. The natural frequency of such a disc is determined by the equation. $f\ mn = \alpha mn / 4\pi \times \sqrt{(E/3\rho(1-\nu^2))} \times (h/\alpha^2)$: where $\alpha mn$ is a vibrating modes constant of the diaphragm, h is the thickness of the diaphragm, $\alpha$ is the effective radius of the diaphragm, $\rho$ is the mass density of the diaphragm material, $\nu$ is the Poisson's Ratio of the diaphragm material, and E is the Young's Modulus of the diaphragm material. The resonant frequency of the membrane may be governed by this equation. It will show up in the frequency response as a resonance and there may be other vibration modes at higher frequencies compared to the lowest mode given by this equation. Thus, in order to transfer energy from the acoustic membrane to the speaker, a low modulus is desirable. Specifically, a flexible membrane with low density is desirable so that the movement of the membrane is maximized when impacted by a sound wave such that the sound wave is then re-produced on the other side of the membrane. This resonance shows up as a peak in the frequency response of the speaker with membrane. It is further possible to tune the membrane frequency to provide additional output from the speaker-membrane unit. This can be achieved by using soft or compliant foam to mount the membrane to the housing. In one aspect, a viscoelastic adhesive tape can be used to compliantly mount the membrane to a housing as it creates a strong waterproof bond suitable for dynamic use. In another aspect, the compliance of the membrane assembly may be enhanced by using a soft foam with viscoelastic adhesive tape on both sides of the membrane. More rigid edge conditions for the membrane may result in a higher frequency response for the membrane. Hence, the mode frequency of the membrane may be dependent upon the Young's Modulus, density and diameter and thickness of the material.

In one aspect, the membrane material may be selected with Young's Modulus from 50 MPa up to 80 GPa and a density from 500 kg/m3 up to 2500 kg/m3. Some examples of such materials include thermoplastic films PEN, PI, PET, PBT, PE, PC, PVC, PP, EVA; thermoplastic alloys, themosets, thermoplastic elastomers such as TPE/TPU), rubbers such as butyl, ethylene propylene, silicone, fluorosilicone, epichlorohydrin, chlorosufonated polyethylene, fluoroelastoemers, perfluoroelastomer, tetrafluoroethylene, tetrafluoropropylene, polychloroprene, organic films such as, collagen films or films made of natural products like starch, proteins or synthetic polymers, ceramics, silicone films, metallic foils or metallized films including. Aluminum foil and plastic films with metal deposits, and multilayer systems composed of laminates of different combinations of materials such as PET with foil laminated together. The size of the membrane and the thickness of the material may also be chosen to achieve a specific frequency range. In one aspect, a thinner membrane will lower the membrane frequency response and conversely, a thicker membrane will result in a higher frequency response. A larger membrane will give a lower frequency response than a smaller membrane using the same material. For the purpose of a small device with small acoustic features such as a telephone, mp3 player, video recorder, camera, headphones, and hearing aid, the thickness of the membrane may ideally vary from 5 microns up to 2000 microns depending upon the material. The damping or energy absorption characteristics of the membrane also need to be considered. Higher damping (absorb more energy) materials will have a smoother frequency response and show less sharp peaks or resonances in their frequency response. This will result in a more natural sound transmission externally from a speaker. Conversely low damping materials such as metal foils or ceramics will have sharp resonances.

In the current state of the art, it is not known which materials are suitable to be used as impermeable membranes with desired acoustic properties and stability for water immersion and for outdoor use. Additionally, acoustic membranes in the present application are water proof which is a function of having a strong adhesive to form a strong bond with the adhesive bond strength and the cohesive strength of the materials indicating the degree of waterproofness. However, one would expect that a strong bond is better and an adhesive that holds the membrane tightly would be better for waterproofness. However, what is not obvious and a part of this invention is that the adhesive in fact must be compliant for dynamic use over a wide range of environmental conditions to allow the membrane to freely vibrate and displace the air volume contained within the housing. In addition, to avoid reverberations from vibrations of the material of the housing or feedback from echoes within the enclosure that affect sound transmission into and out of the housing, an air and water tight compressible seal made of an acoustic damping material such as foam or an elastomer material may be used to surround an air cavity between the housing and the microphones of the device and seal it from the rest of the housing to prevent reverberations from other sound sources within the housing that would affect the sound quality and transmission. The compressible elastomer or foam further enhances the compliance of the way in which a membrane is mounted so that it is not compressed between two stiff materials that inhibit its ability to vibrate or displace the air volume and react to the sound pressure differential created when a sound source passes through the air and watertight membrane assembly. The understanding of what may be suitable materials to form acoustic materials or other functional requirements for sound transmission does not exist in the art as this is usually achieved through the use of porous membranes that allow the transmission of sound through air permeable membranes however, the use of porous membranes for waterproofness may be unreliable as the size of the pores can be easily expanded or punctured upon touch, which would render them not waterproof. Porous membranes that are waterproof do rely upon the same principles to operate within a waterproof housing as non-porous waterproof membranes, however these principles have not been well understood as much of the prior art relied upon the use of porous membranes for waterproof housings. Various water proof applications use porous membranes that allow air to pass through but not water & while this is waterproof, this has its limitations. Such porous membranes are not reliably waterproof as the pores are easily damaged with abrasion, may leak over time and are not suitable for a dynamic use where they are subject to ongoing movement such as to protect against damage from accidental drops, daily use, or outdoor use. Also many membranes are made with PTFE (Teflon), which has chemical properties of strong resistance to chemical attack as it is relatively inert, but at the same time PTFE is very difficult to adhere due to its low surface energy and low ability to bond to other materials. The low surface energy or the low "wetability" of PTFE means that it is difficult to form a strong adhesive bonding, which is the basis of waterproof protection. Both the porosity of the material and its material properties are limitations in utility for waterproof cases. There is therefore a need in the art for an improved water proof housing that allows acoustic transmission but that does not compromise waterproofness.

A microphone usually may include an airtight seal around the microphone in order for the membrane to function optimally, allowing a lower frequency response, louder overall volume and greater clarity with background noise reduction; however the opposite may be required for a speaker membrane. If the volume of the air between the device and the membrane is reduced, possibly by sealing the speaker membrane, or reducing the volume of air between the device and the membrane, the ability of the membrane to vibrate is impeded so that overall sound transmission is reduced. One requirement for a speaker membrane to operate may be the strategic use of a sufficiently large air gap or air cavity to allow the membrane to vibrate. The transmission of sound in a speaker is a function of the material properties of the membrane, thinness of the membrane, size of the membrane, compliant mounting of the membrane, and the size of the air cavity as all of these create the effect of allowing a flexible membrane compliantly-mounted to create low resistance to respond to air pressure. In particular, for membranes that are not permeable to air or water, it is desirable to utilize the pent up air pressure in the air chamber or case to force the membrane to vibrate so that it acts as an air piston. A compliantly mounted membrane allows it to vibrate, instead of clamping it tight which inhibits movement. A compliantly mounted membrane includes a spring-like effect that allows the membrane to vibrate and act as an air piston responding to changes in air pressure to move the membrane allowing sound to transfer and increases an overall sound level. In some instances, sound from a sound source such may be redirected within an air and watertight housing so that a sufficiently large sized membrane and sufficiently large sized air cavity is available to vibrate to act as an air piston. When using non-porous membranes, it may be important to have a way to equalize air pressure in a closed housing so that the membrane can flex and sound can propagate. A build up in air pressure may cause the membrane to bulge and the force of the air in the cavity with keep the membrane from vibrating fully and propagating sound. It may be necessary to have a secondary port in the waterproof housing that can be opened & closed occasionally to equalize the air pressure. The functional importance of strategic air cavities and membranes and their physical requirements are not well understood in prior art as these would not be obvious when using porous membranes that allow the flow of air such that cavities are not sealed and that due to their construction may not be as consistent or flat affecting tonal quality and may be more prone to breaking down on excessive vibrational energy particularly if not compliantly mounted such that the porous membrane tears, deforms or separates. In understanding how acoustics function in a waterproof housing, the principles that apply to non-porous membranes may also apply to porous membranes, however the exact understanding would not exist unless an effort were made to first understand the functional and structural considerations required for non-porous membranes to function in an air and water tight housing. In an air and water tight housing, the sound may be redirected through the use of strategic air cavities and air gaps, ducts or internal ports or pipes to allow the air pressure to move to another larger area of the housing that can vibrate and act as the speaker membrane to allow sound waves to propagate to the outside of the housing. The sound may be redirected in such a way because the housing includes non-permeable air tight membranes so that there is minimal loss in acoustic energy as there is little transmission loss of the sound since there are no air vents that would reduce the air pressure and reduce the potential vibrational energy of the membrane.

Sound waves are thus generated on the other side of the air and water tight membrane to the external environment which can then propagate through the external medium, whether air or water. It is known in the art that the sound impedance of air and water are different which limits the ability for sound to travel from a sound source in air and to be propagated through water without significant transmission loss. Hence, there is a need in the art to be able to propagate sound underwater without significant signal attenuation. An air and water tight housing that employs air chambers and a non-permeable membrane to create an air piston permits sound from a source inside the housing to propagate through an external aqueous environment without significant attenuation because the acoustic energy within the housing is converted to vibrational energy of the membrane so that sound waves may be generated on the external side of the air and water tight acoustic membrane in water. These sound waves generated within water experience less acoustic impedance underwater so that sound may be propagated much further, possibly throughout the entire body of a contained water mass, such as a swimming pool. Hence, an operator of a device contained within such an air and water tight housing may listen to music underwater even if they relatively further away from the housing.

In addition, in some instances, the membrane may need to be isolated from adjacent structures through the use of damping materials such as foam or rubber. This may be required if there are reverberations, from vibrations/feedback that reflect within the housing that create interference with the speaker output and depends upon the spatial orientation of the features within the housing, although in general, the larger the volume of air, the less interference is created.

For many device manufacturers, there is an ongoing development to create devices that are slimmer, thinner, and smaller and yet continue to deliver more performance. Component parts are also become more compact and smaller to fit within devices such that features and parts are closer together in a smaller space. With the increasing use of tiny MEMS microphones and speakers, new technologies such as beamforming may be employed for noise cancellation techniques and these are particularly relevant in designing a waterproof case. Such devices may employ an array of MEMS omnidirectional microphones with a low signal-to-noise ratio that may or may not be combined with a gyroscope to determine the orientation of the device and the location of a primary sound source, detect the direction of background noise an apply improved noise cancellation techniques to eliminate the background noise. Devices that employ multiple microphones configured to form a directional response or beam pattern can be designed to be more sensitive to sound coming from one or more specific directions that coming from other directions and using sophisticated signal processing algorithms, eliminate feedback, echoes and background noise. In electronic devices that employ multiple microphones in beamforming arrays for noise attenuation and cancellation, a waterproof housing forms a unique challenge as it may confuse the signal processing algorithms of the device if unexpected feedback or vibrations from a speaker reverberate through the housing and are detected by any of the microphones. This may cause echoes or distortions of sound and an acoustic feedback loop as a sound source is fed into a sound receiver and will affect the quality of a phone call. To avoid this, microphones in such a device may be isolated from reverberations from vibrations of the housing or any sound that speakers in the device may generate using damping materials such as foam or rubber.

In a waterproof housing for a device there may be multiple sensors on the device such as audio (microphone) and image sensors (camera) that must operate and there may be insufficient space due to the close proximity of these features. In one aspect, this is a design challenge for acoustics as membranes need a sufficiently large area to vibrate and transmit sound. In another aspect, this is a design challenge for waterproof bonding as a visco elastic adhesive such as 3M VHB tapes usually may require a minimal width to bond reliably (at least 1.5 mm or greater). In another aspect, a suitably thin membrane may require a minimum sufficiently large are in order to vibrate to transmit sound. What is not obvious is in the art is that a channel may be utilized from an area where there is more space to mount an acoustic membrane assembly to redirect the acoustic energy to a microphone. In another aspect, for the flash and camera to function in such devices, they have their field of view and expand to the surface of the housing and cannot be obstructed and the flash can reflect from the surface of a housing into the camera. In an area where a microphone is located in close proximity to a camera or a light sensor, instead of redirecting the microphone through a channel to another location, the sound port may be used for both light and acoustic transmission by ensuring that the sound port allows sufficient clearance for the transmission of light and directs sound to the microphone of the device. In one aspect, the use of a membrane material that is optically clear for the transmission of light and suitable for transmission of acoustic energy for sound with a sufficiently large surface area and is of a suitable thickness to vibrate and compliantly mounted to propagate sound (e.g. TPU, PVDF, PEN, or PET) may be used. For these sensors to operate within the waterproof housing, the area around each sensor may be sealed using materials that absorb light and sound to avoid reflections of light back into the camera and reverberations of sound and acoustic feedback from speakers in to the microphone (e.g. black elastomer, foam, rubber with black adhesive).

In some devices, where a microphone and speaker are located within the same area or close proximity and may function at different times as either a speaker or a microphone such as in the earpiece area, which complicates the required functionality of the waterproof housing as there needs to be a balance between the need to isolate and seal a microphone using damping materials to avoid reverberations, feedback and enhance tonal quality and volume of microphones and the need for a speaker to have a sufficiently large strategic air gap and sufficiently large surface area of a thin wall or membrane to vibrate to propagate sound. Usually in such an electronic device, the microphone and speaker do not function at the same time as this would cause a feedback loop and in most electronic devices, microphones and speakers are usually separated as much as possible to prevent this and the microphone is located in this area as a second distal microphone used to enhance the sound quality by canceling out background noise or used as a primary microphone when pair with another speaker located elsewhere on the device. In one aspect, the same area may be designed to allow sound to propagate through the housing from the speaker by employing a sufficiently large air gap and suitably large surface area of a thin wall or membrane, while also isolating and sealing a microphone using damping materials to avoid reverberations, feedback and enhance tonal quality and volume. In one aspect, in an area wherein both a microphone and a speaker must function, they may employ the same thin flexible membrane that can freely vibrate for both the microphone and the speaker with an air cavity surrounded and sealed by damping materials to isolate that cavity from reverberations and speaker output elsewhere in the housing. The membrane may be compliantly mounted to flex or vibrate, be of sufficient thickness and of sufficiently large surface area to avoid excess vibration. This may be further complicated in that such devices may also have adjacent areas for other functions such as the proximity sensor, camera, flash, back illumination sensor, ambient light sensor, capacitive, resistive or pressure sensitive touchscreen and/or other sensors that may rely upon sensory input from the environment or are able to detect the presence of nearby objects without any physical contact, which limits the size of an earpiece membrane for the speaker and also limits the area that an acoustic sealing foam may be used to isolate the adjacent area for the microphone. A proximity sensor may operate by emitting a beam of electromagnetic radiation in the IR spectrum and detects changes in the field or return signal and estimates the distance by measuring the amount of light or time-to-travel of light reflected back from the nearest object. An ambient light sensor may use photodiodes sensitive to different portions of the light spectrum to determine the ambient light level in the environment. A backside illumination sensor may operate to enhance the sensitivity of a camera in a low light setting. In another aspect, for sensors that operate by transmitting light such as the proximity and ambient light sensor and backside illumination sensor, light must travel through both the housing and through air and the distance to the housing and its thickness, optical clarity and light transmission in the relevant spectra of light detected for sensor operation and the size of the air gap formed between the housing and the device must be designed to avoid significantly distorting or altering the amount and path of light and field of view so as to avoid affecting the function of the sensors. Where a touchscreen operates the relative permittivity of the membrane material and air may affect its functionality as well. In order for these sensors to function as well as a microphone and/or speaker, the air gaps should be minimized and the material of the membrane should be sufficiently thin to not affect the field of view or sensitivity of the sensors. If the area of such an earpiece is located adjacent to sensors and other functions, the earpiece may be designed with a membrane assembly that is suitable for the speaker sound to vibrate the membrane and be heard, while a noise isolating assembly made of damping materials such as foam or a rubber or elastomer seal applied with a pressure sensitive adhesive may be located further around the perimeter of the sensors and touchscreen such that they do not impede the function of those elements. Such a noise isolating assembly may form an airtight seal with the surface of the housing or screen membrane so that sound from another speaker in the housing does not generate feedback or echoes and may be aided by the use of damping materials that have a smooth and high surface friction. Such a noise isolating assembly also serves to assist the signal processing algorithm to detect the background noise and cancel it quickly enabling a clear call. The noise isolating assembly may be of sufficient thickness that may range from 0.07 mm to 2 mm and may be of a suitable location that it does not significantly distort the housing so that it affects the pressure or capacitive functionality of the touchscreen nor the optical clarity and light transmission and impairs the function of the proximity sensor or ambient light sensor or other sensors or functions.

Referring to FIGS. 1-8 there is shown a first embodiment of a protective case 10 for an electronic device 12. In one aspect the protective case 10 includes a main housing 14 and a lid 16. The main housing 14 may include a case member 18. The case member 18 may be formed of various materials to provide a rigid structure for the protective case 10. In one aspect, the case member 18 may be formed of a clear material such as a clear plastic resin or other materials that are not clear such as other plastic resins or metal. Various plastic resins including polycarbonate may be utilized or other materials such as polycarbonate blends, acrylics, Tritan copolyester, PES, etc.

The case member 18 may include various slots and access ports 20 formed therein. The slots and access ports 20 may be used to actuate various functions using buttons or switches and allow sound transmission, as will be described in more detail below. Additionally, the case member 18 may include a window portion 22 formed therein that receives a screen member 24. The case member 18 may include sealing and locating material 26 applied thereon on defined portions of the case member 18, such as about the slots and access ports 20 to provide location for the electronic device 12 within the main housing 14 and a sealing for the case member 18 as well as allow access to various buttons of the electronic device as will be described in more detail below. The sealing and locating material 26 may provide shock mitigation properties for the protective case 10 for the protection of the electronic device 12 when exposed to shock and drops. In one aspect, the sealing and locating material 26 may include various thermoplastic elastomers such as a TPE-TPU material or may be formed of other materials such as rubbers including silicone.

As referenced above, the case member 18 includes a screen member 24 attached thereon about the window portion 22 of the case member 18. The screen member 24 may be a separate piece attached using various methods including using an adhesive, welding, molding or otherwise attaching the screen member 24. The screen member 24 could also be a separate piece that is assembled and sealed with a rubber gasket to the case member 18. Alternatively, the screen member 24 may be formed with the case member 18 and may have a thickness that is different from other portions of the case member 18. In one aspect, the screen member 24 may be formed of a clear material allowing viewing of a display of the electronic device 12. The screen member 24 may have a thickness that allows a user to manipulate a touch screen of the electronic device 12 through the screen member 24. In one aspect, the screen member 24 may be formed of a PET, polycarbonate, PC/PMMA blend, TPU, PBT material or other suitable material with high optical transparency, low haze and have a thickness of about 0.1 to 0.5 millimeters that may be assembled into the window portion 22 of the case member 18 such that it lays flush against the touchscreen of the electronic device 12 which will allow a user to manipulate a touch screen with or without another screen protector applied to the electronic device 12. The material of the screen member 24 should be of a high tensile strength and in some materials; the orientation of the polymer should be oriented such that it is biaxial to increase the strength to yield and elongation. In one aspect, the screen member 24 may allow the operation of certain sensors of the electronic device 12 that employ the use of light transmission through specific spectra such as infrared, so the material used to form the screen member 24 may need to have low absorption of the relevant spectra to avoid reducing the sensitivity and function of those sensors. The screen member 24 may be attached to the housing in a way that is flexible so that it continues to be secure even if the screen member 24 is comprised of different materials than the case member 18 and the coefficient of thermal expansion of both materials may be different or pressure may be applied to the screen member 24 so that the touchscreen of the electronic device 12 may be operated requiring the attachment point to be flexible and yield rather than break. Such a screen member 24 may have a coating on the exterior that increases the surface hardness, resists scratches, self-heals, does not show marks from fingerprints, or does not fog with temperature differences. The flexibly mounted screen member 24 may also have a coating on the interior that prevents the formation of watermarks or Newton Rings that may occur due to interference between the light waves reflected from the top and bottom surfaces of the air gap formed between the bending of the screen member 24 and the touchscreen of the electronic device. Such a coating would then create a finely textured surface on the interior of the screen member 24 that prevents the interference and that at the same time does not significantly reduce the optical transmission of the screen member 24. In one aspect, the screen member 24 may be formed of a conductive material or may have a conductive coating applied on the exterior, interior or both sides of the screen member 24 that serve to enhance the sensitivity of a capacitive touchscreen of an electronic device 12, and in this aspect, the screen member 24 may have a thickness greater than 0.5 mm to provide greater impact protection without a reduction in sensitivity of the touchscreen of the electronic device 12. Where coatings are used on the screen member 24, they must also have similar coefficients of thermal expansion to the material of the screen member 24 to avoid separation or delamination from changes in the temperature or environment.

The protective case 10 includes at least one sound chamber 28 formed thereon. At least one sound chamber 28 may be located on the case member 18 or the lid 16. The sound chamber 28 shown is defined by an area of the lid 16 that includes a channel and a thinned wall section 30 or wall section that has a smaller thickness than an adjacent portion of the lid 16. The thinned wall section 30 defines an air space 32 formed between the electronic device 12 and the lid 12 allowing for sound to be transmitted from speakers of the electronic device 12. The air space 32 and the thinned wall section 30 are sufficiently large to allow the thinned wall section 30 to vibrate without significant damping or absorption of sound thereby allowing sound transmission through the exterior portion of the thinned wall section 30 of the lid 16. In this way the walls of the case member 18 or the lid 16 may be used as a membrane to propagate sound when coupled with a suitably large air cavity formed by a sound chamber 28 or air space 32. In the depicted embodiments of the figures, two sound chambers 28 are defined in a lower portion 29 of the case member 18 and another sound chamber 28 is defined in an upper portion 31 of the case member 18. It should be realized that various numbers of sound chambers may be present.

In one aspect, the case member 18 also includes at least one secondary sound port 32. In the depicted embodiments two secondary sound ports 32 are formed in the lower portion 29 of the case member 18. The two secondary sound ports 32 include a speaker port 33 and a microphone port 35. Another two secondary sound ports 32 are formed in the upper portion 31 of the case member 18 and include a second speaker port 37 and a second microphone port 39. The secondary sound ports 32 may be defined by slots 34 formed in the case member 18. The slots 34 may be covered with the sealing and locating material 26 that was discussed above or have different structures as will be discussed in more detail below.

In one aspect, the sealing and locating materials 26 may be applied as a membrane in a unitary structure 27 in the region of the secondary sound ports 32. Alternatively, the secondary sound port 32 may be covered by a membrane 44. The structures of the membranes 44 or membrane in a unitary structure 27 may vary based upon the type of secondary sound port 32.

As stated above, the protective case 10 includes a lid 16. The lid 16 may be formed of a clear material as specified above with respect to the case member 18. The clear lid allows for a visual inspection of an O-ring as described in more detail below. The lid 16 includes a planar surface 50 that terminates at an edge 42. The edge 42 includes the attachment structures or tabs 38 that mate with the main housing 14. The lid 16 also includes a groove 52 that receives a gasket 54. The gasket 54 may be an appropriately sized O-ring having a desired shore durometer that seats between the perimeter of the main housing 14 and the groove 52 in the lid 16 to provide a water tight seal. The lid 16 may also include a camera transmission portion 36 formed thereon, as described above.

Figure 2A:
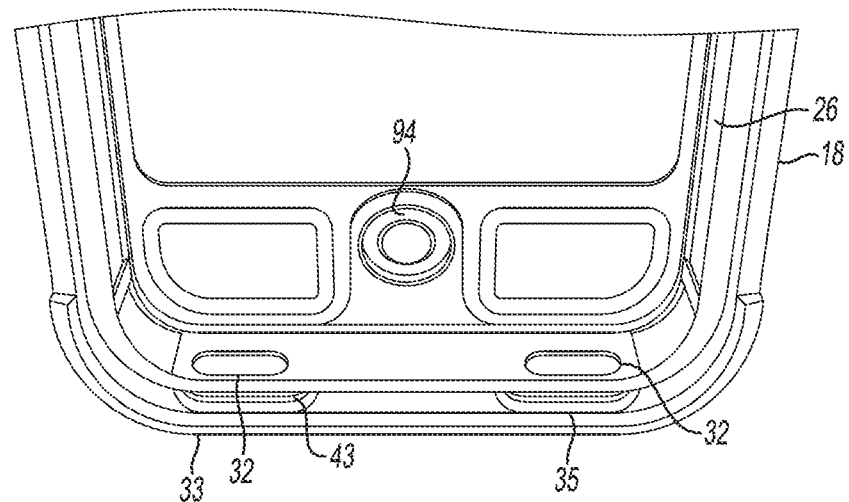
FIG. 2A is a partial perspective view of the lower portion of the case member.
Figure 2B:
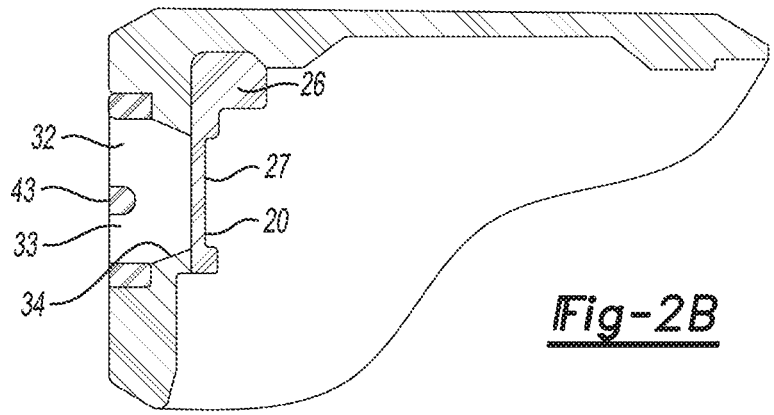
FIG. 2B is a partial sectional view of the speaker port and TPU.
Figure 2C:
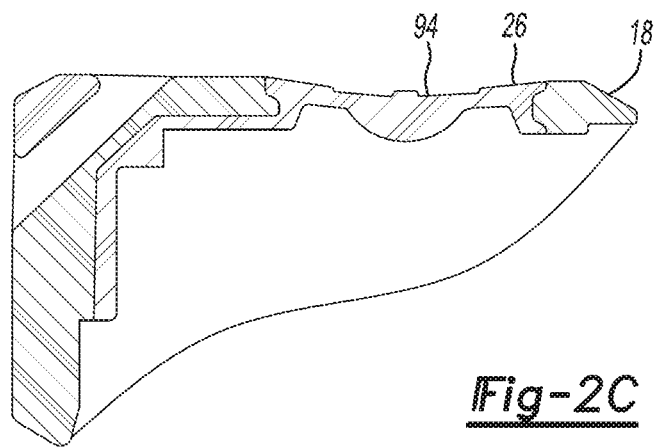
FIG. 2C is a partial sectional view of the home button port and membrane.

Referring to FIG. 2A-B, the speaker port 33 may have a membrane in a unitary structure 27 positioned over the port 33. In one embodiment, the membrane in a unitary structure 27 and may be formed of sealing and locating material 26 applied on that portion of the case member 18 to seal the case member 18. In another aspect, the speaker port 33 may be covered by a membrane in the form of a thin film or sheet of material that covers the opening and is attached to the case member 18 internally preventing the entry of water and air allowing for a clear transmission of sound. In one aspect, the membrane material may be that as described above. The case member 18 may include a grill structure 47 formed therein over the opening to the speaker port 33. The grill structure 47 protects the membrane in a unitary structure 27 during assembly and use.

Figure 3A:
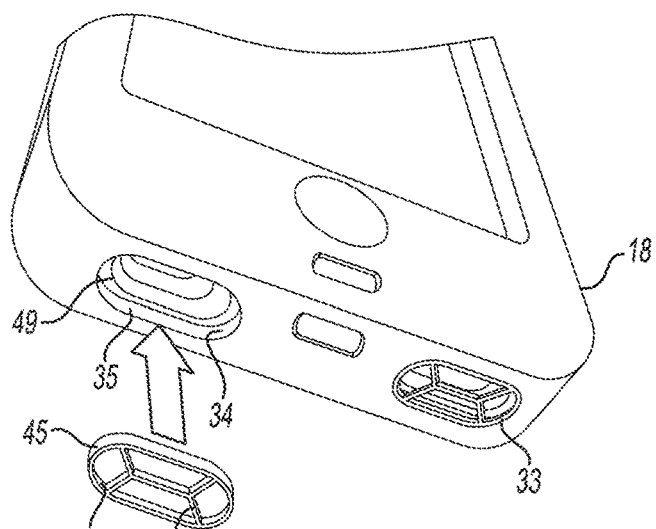
FIG. 3A is a partial perspective view of the lower portion of the case member.
Figure 3B:
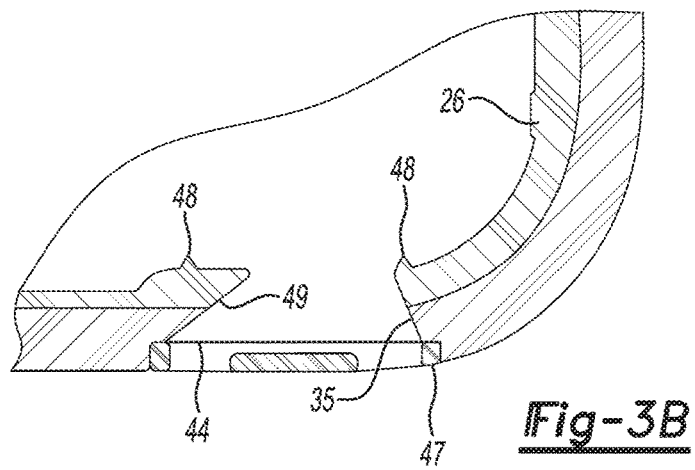
FIG. 3B is a partial sectional view of the microphone port and membrane.
Figure 3C:
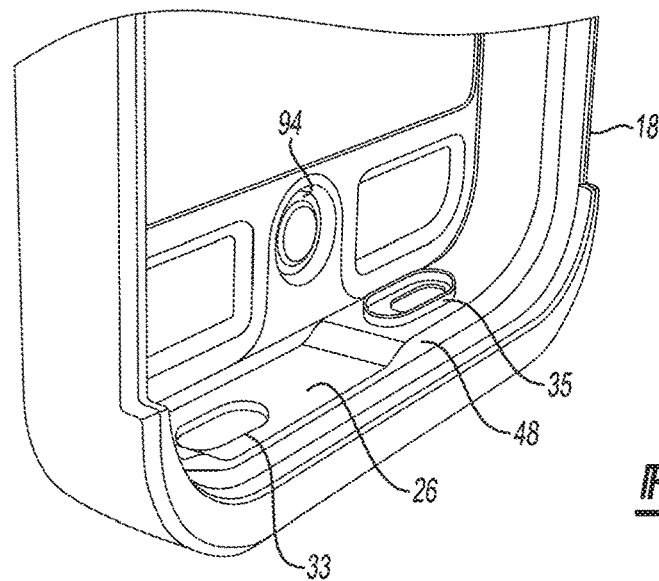
FIG. 3C is a partial perspective view of the lower portion of the case member dealing with the sealing rib of the microphone port in one embodiment of a protective case.

Referring to FIGS. 3A-C, the membrane 44 positioned about the microphone port 35 of the device may be compliantly mounted on a first membrane assembly 45 positioned within the microphone port 35. The membrane assembly 45 may include a membrane 44 attached to a grill structure 47. The membrane 44 may be formed of the materials described above. In one aspect the grill structure 47 may be formed of a clear material allowing for use of a UV curable adhesive or a double-sided pressure sensitive adhesive to attach the membrane assembly 45 to the case member 18. The membrane assembly 45 provides a water tight seal of the microphone port 35. The microphone port 35 includes a cone shaped channel 49 to direct and amplify sound as it travels into the protective case 10 to a microphone of the electronic device 12. The sealing and locating material 26 positioned within the case member 18 and positioned about the microphone port 35 continues the cone shaped profile and includes a sealing rib or raised ridge structure 48 that mates with the electronic device 12 isolating the microphone and preventing degradation of the sound transmission and reverberations within the housing. In one aspect, a separate structure in a membrane assembly with foam, rubber or elastomer as a damping material may be attached or formed about the microphone port 35 to define to the sealing rib 48.

Figure 4A:
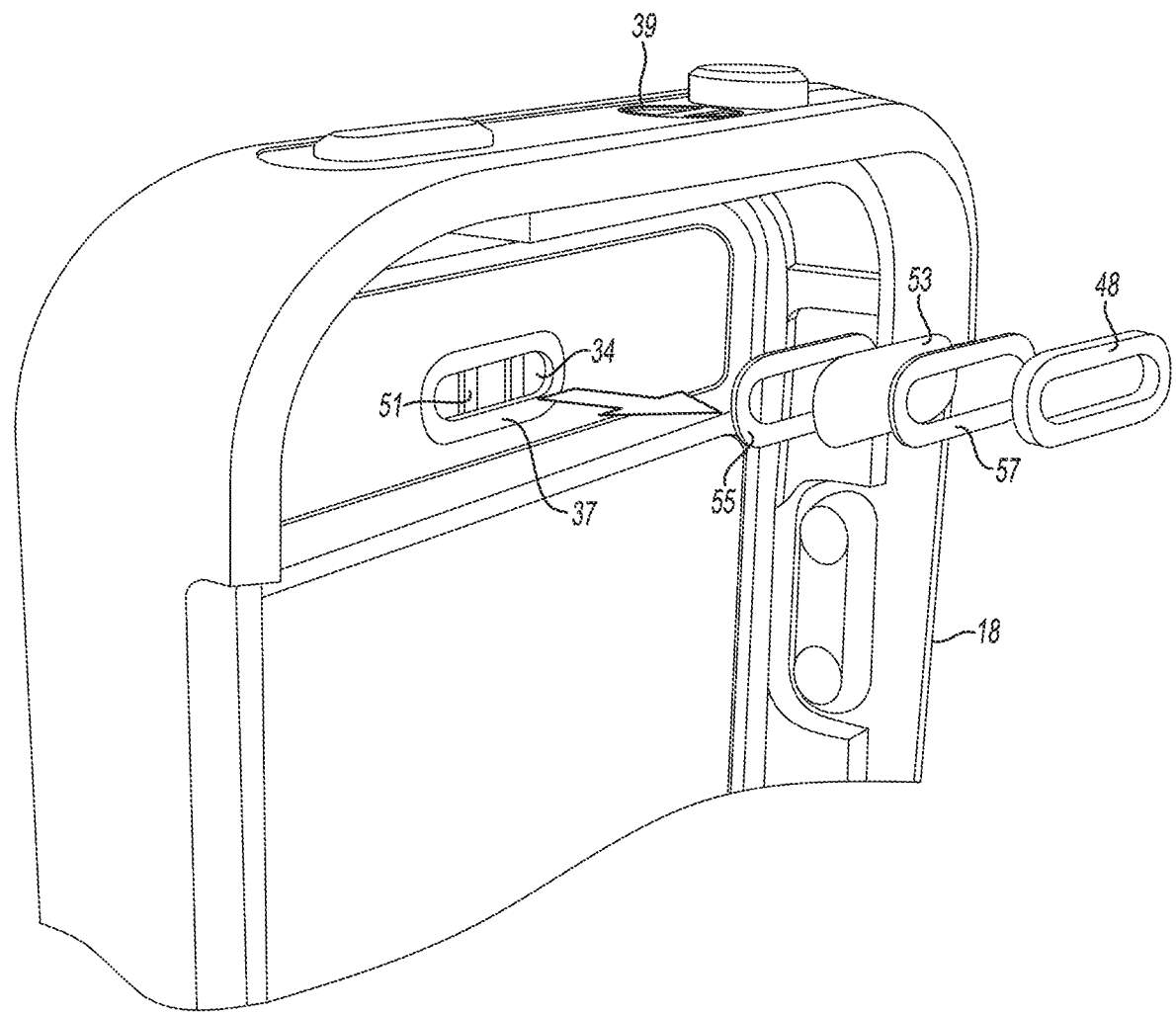
FIG. 4A is an exploded partial perspective view of the upper portion of the case member.
Figure 4B:
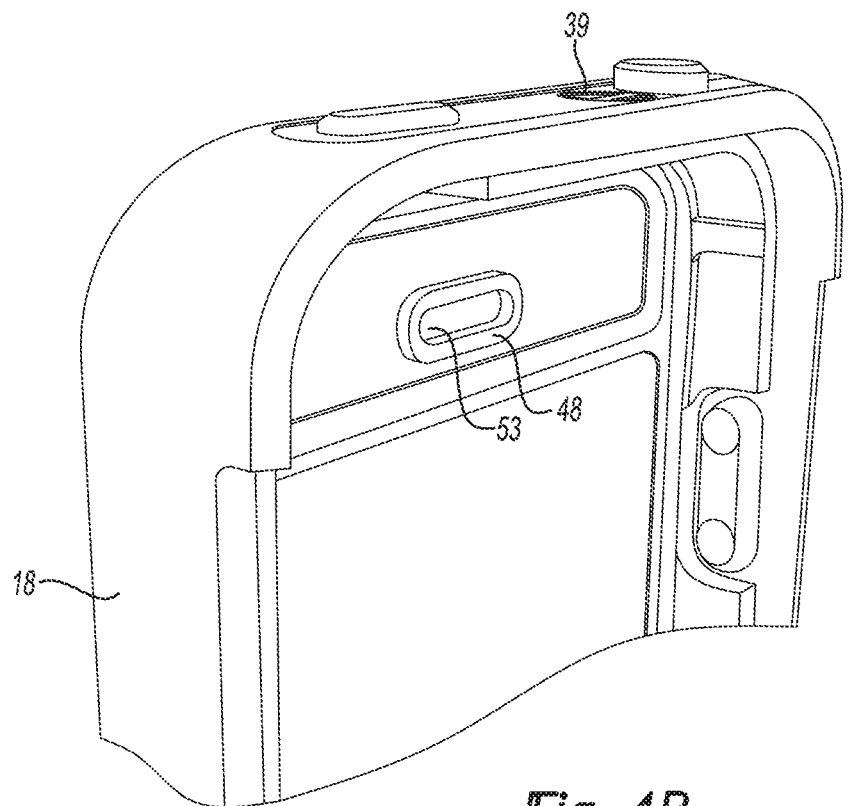
FIG. 4B is an assembled partial perspective view of the upper portion of the case member and second speaker port.
Figure 4C:
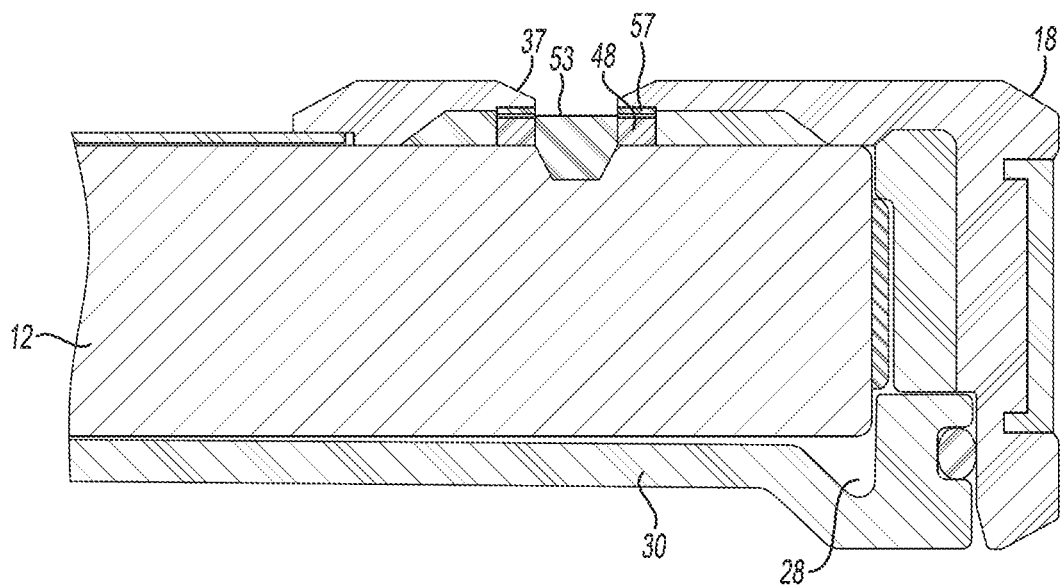
FIG. 4C is a partial sectional view of the second speaker port and membrane.
Figure 5:
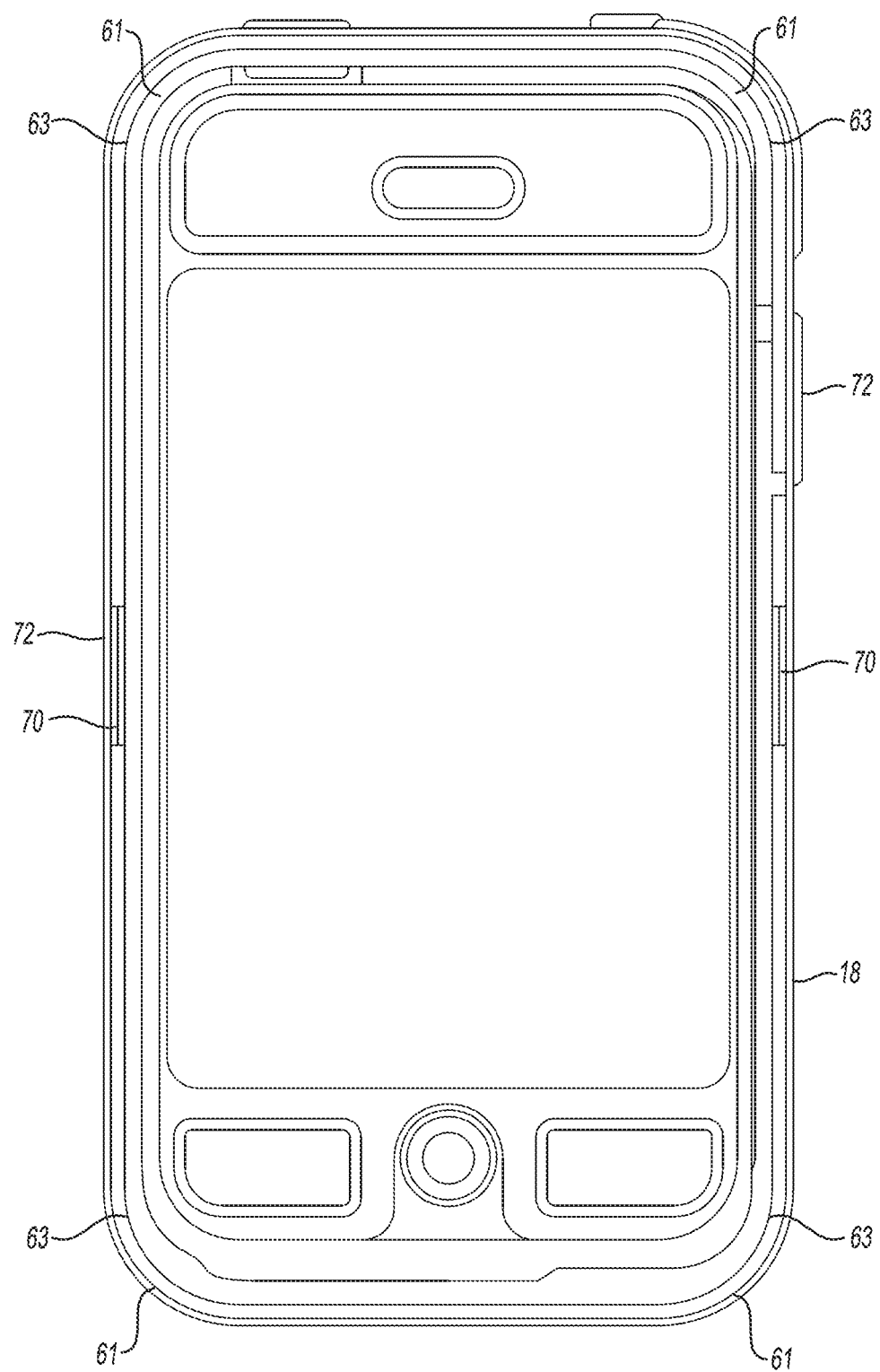
FIG. 5 is a front view of the case

Referring to FIGS. 4A-C, the second speaker port 37 may include a grill structure 51 formed in the case member 18 about the speaker port 37. The grill structure 51 protects the membrane 53 from damage during assembly and use. A viscoelastic adhesive or foam based adhesive 55 such a double sided tape may be applied about the second speaker port 37 internally to the case member 18. In one aspect the foam adhesive 55 may have a thickness in the range of 0.03 to 1 millimeters. A membrane 53 is attached to the foam adhesive 55 bonding the membrane 53 to the case member 18 providing a water tight seal. In one aspect the membrane 53 may have materials properties as described above. Another adhesive 57 may be positioned about the membrane 53 such that a raised rib 48 may be attached about the area of membrane 53. The raised rib 48 seals a microphone or speaker as described above. The thickness of the foam adhesive 55 provides a separation of the membrane 53 from the case member 18 which in combination with the thickness and material properties of the membrane 53 allow the membrane 53 to freely vibrate and allow for a clear transmission of sound including in a bass frequency range. The rib structure 48 may be located immediately above the membrane 53 or in a wider area around the membrane 53 and directs the sound from the second speaker of the device to the membrane 53 and isolates the sound from other portions of the case member 18 preventing sound transmission to the microphones of the electronic device 12 positioned within the protective case 10.

Figure 7:
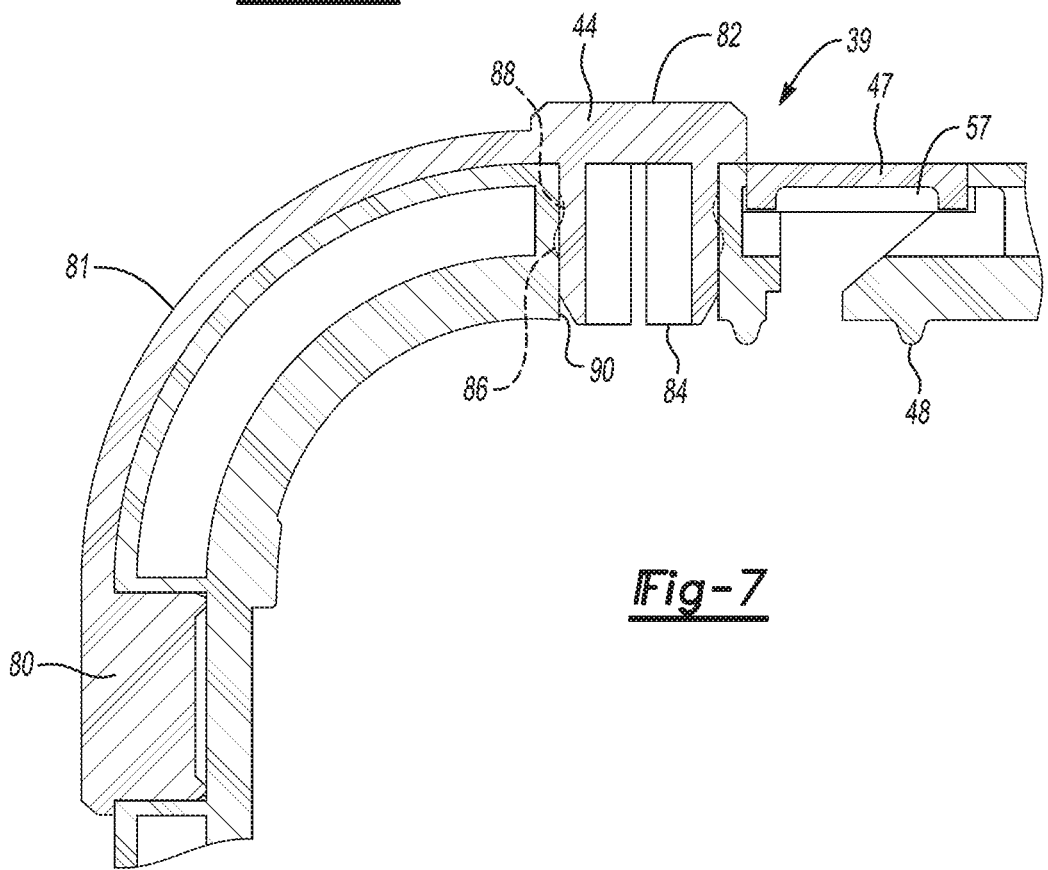
FIG. 7 is a partial sectional view of the case member and a plug.

Referring to FIG. 7, the second microphone port 39 may include a similar membrane assembly as described above with reference to the microphone port 35. A grill assembly 47 and membrane 57 may be attached within the second speaker port 39. Additionally, the sealing and locating material 26 positioned within the case member 18 and positioned about the second microphone port 39 includes a rib or raised ridge structure 48 that mates with the electronic device 12 isolating an air chamber formed to direct sound to the microphone from other portions of the case member 18 preventing degradation of the sound transmission and reverberations.

It should be realized that various numbers of secondary sound ports 32 may be present. In one aspect, at least one of a sound chamber 28 or a secondary sound port 32 is present in the case member 18. In another aspect, at least one of a sound chamber 28 or a secondary sound port 32 may be present in the lid 16 or a plug.

The case member 18 may include a camera transmission portion 36 formed thereon. The camera transmission portion 36 may be defined by a thin walled section. The thinned walled section 30 may provide less distortion and alleviate focus issues with the electronic device 12 positioned within the volume of the protective case 10. In one aspect the camera transmission portion may include an additional lens such as a polarized, glass, CR-39, wide angle or fish eye lens formed or attached to the camera transmission portion 36.

Figure 6A:
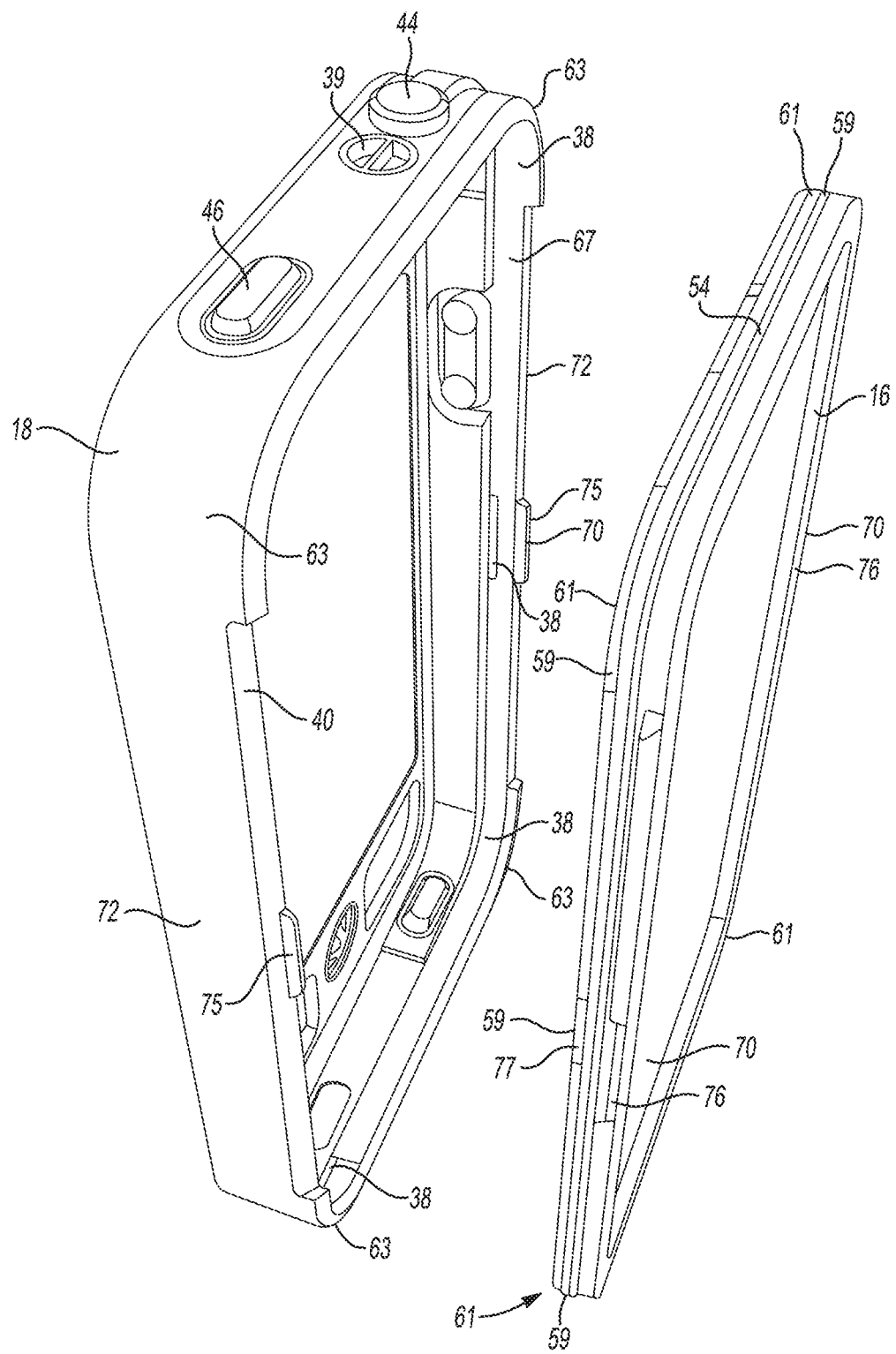
FIG. 6A is a perspective view of the case.
Figure 6B:
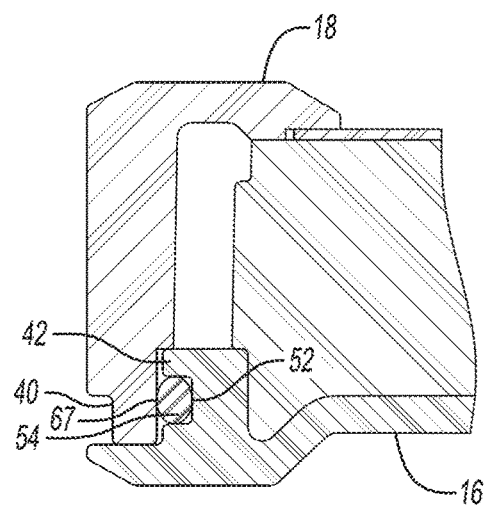
FIG. 6B is a partial sectional view of the case member, lid and O-ring joined where there is no attachment structure.
Figure 6C:
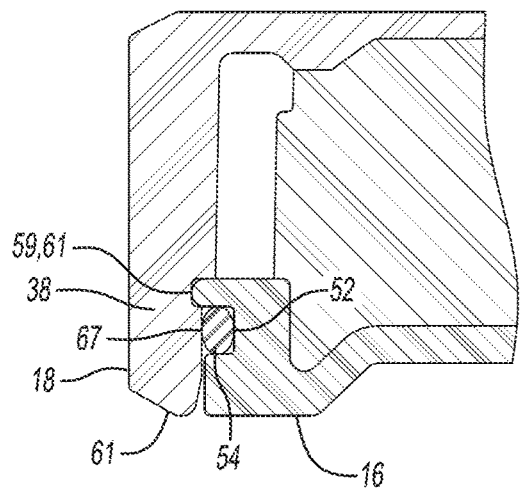
FIG. 6C is a partial sectional view of the case member, lid and O-ring joined in a region of the first attachment structure.

Referring to FIGS. 6A-E, the case member 18 and lid 16 may include attachment structures 38 for joining the main housing 14 with the lid 16. In the depicted embodiments the attachment structures 38 may be formed at various positions on the case member 18. Various types of attachment structures may be utilized. In one aspect, as shown in FIG. 6C a first attachment structure 61 may be present that corresponds to an attachment structure 38 in the corners 63 and adjoining sides of the case member 18 and lid 16. The first attachment structure 61 includes a rounded edge 59 so that the main housing 14 and lid 16 may be joined and separated repeatedly. As can be seen in the figure, the gasket 54 is compressed between the wall 67 of the case member 18 and the groove 52 formed in the lid 16 which receives the gasket 54. In one aspect, the gasket 54 receives a radial compression between the main housing 14 and the lid 16 to provide a water tight seal. The radial compression is defined by the load applied to the gasket 54 from the wall 67 of the main housing 14 and the position of the gasket 54 in the groove 52 of the lid 16. In one aspect, the water tight seal is created through the rigid structure/structural frame using the wall 67 of the main housing 14 to compress the gasket against the groove 52 formed in the lid 16 and this water tight seal may function independently of and can be supplemented by one or more other mechanisms to mate, clasp, latch and keep the main housing 14 and the lid 16 mated joined and closed.

Figure 6D:
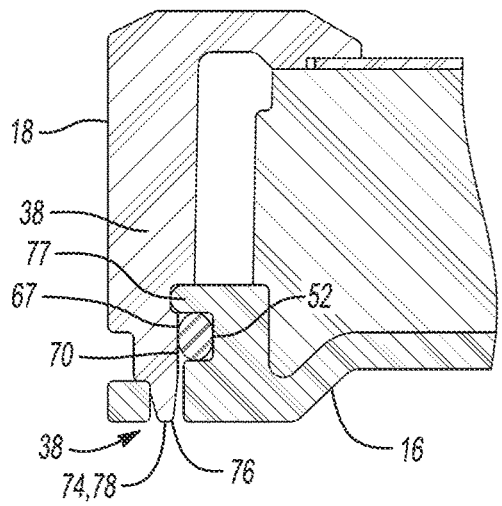
FIG. 6D is a partial sectional view of the case member, lid and O-ring joined in a region of the second attachment structure.
Figure 6E:
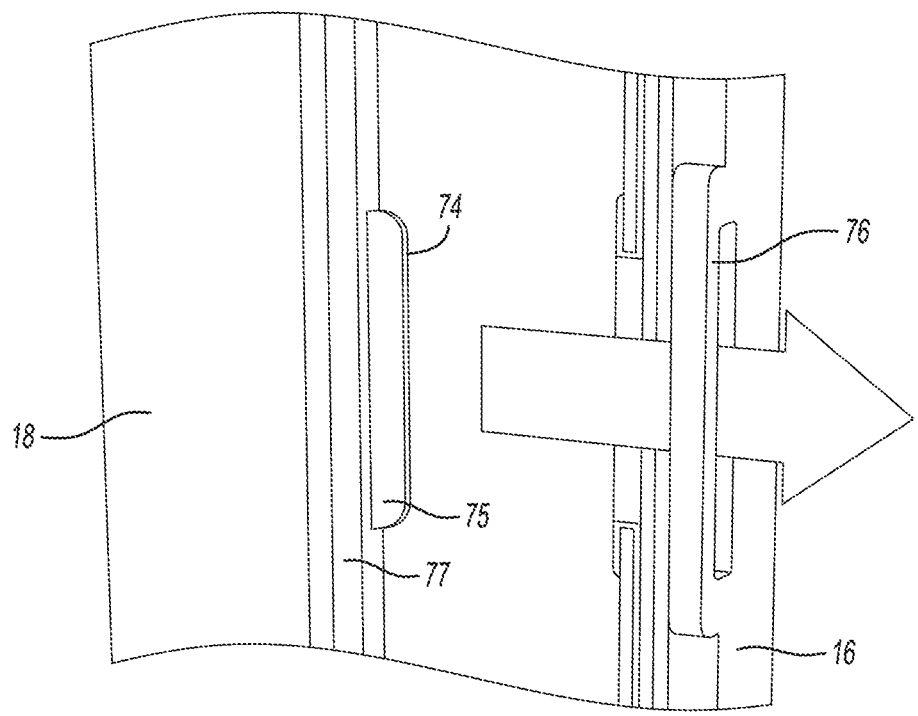
FIG. 6E is a partial perspective view of the second attachment structure.

Referring to FIG. 6D-E, the case member 18 and lid 16 may include a second attachment feature 70 present on the lateral or longer sides 72 (Shown in FIG. 5) of the case member 18 and lid 16. The second attachment feature 70 includes a secondary structure 74 on the main housing 14 to reinforce the compressive force that the wall 67 exerts on the gasket 54 along the longer side 72 of the main housing 14 where the structural frame may be more susceptible to flex under the compressive force of the gasket 54 The second attachment feature 70 includes a tab 75 on the main housing 14 that is trapped within a groove 76 on the lid 16 such that the lid 16 and case member 18 are interlocked and structurally stronger. Additionally a rounded tab 77 protrudes from the edge 42 of the lid 16 slightly more than the gasket 54 so that the tab 77 makes contact with side wall 67 of the main housing 14 first and protects the gasket 54 from abrasion when mating the lid 16 to the main housing 14. As can be seen in the FIG. 6D, the gasket 54 is compressed between the wall 67 of the case member 18 and the groove 52 formed in the lid 16 which receives the gasket 54. In one aspect, the gasket 54 receives a radial compression between the main housing 14 and the lid 16 to provide a water tight seal. The radial compression is defined by the load applied to the gasket 54 from the wall 67 of the main housing 14 and the position of the gasket 54 in the groove of the lid 16.

The case member 18 may also include a detent 40 formed thereon that allows a user to separate the main housing and lid 14, 16 after they have been joined. In one aspect the detent 40 is sized and positioned to allow a user to access an edge 42 of the lid 16. The user may thereby use their fingernails or a flat-edge tool inserted into the detent 40 to pry the lid 16 from the main housing 14.

The case member 18 may include additional structures that allow a user to operate the electronic device 12 with a watertight seal. The case member 18 may include one or more plugs that are attached to the case member 18. The plug 44 shown in FIG. 7 includes an attachment structure 80 for mating with the case member 18 that is joined to a plug portion 82 through a tether 81. The tether 81 may be formed of a sealing and locating material 26 or of an elastomer or textile. The plug portion 82 may or may not include a core 84 that is inserted into or over-molded with sealing and locating material 26 that has defined sealing ribs 86 that may be on the exterior surface of the plug portion 82. The plug core 84 stabilizes the plug portion 82 so that it consistently maintains the appropriate shape to fit accurately in the sealing cavity 88 for a water tight seal into the headphone jack portion 90 of the case member 18. Alternatively, the exterior surface of the plug portion 82 may have a groove into which a gasket may be assembled to form an accurate fit to a sealing cavity 88. The sealing cavity 88 may or may not have a sealing rib to aid in the creation of a water tight seal. In another embodiment not shown here, the secondary sound ports and membrane assemblies may be formed on one or more plugs that are sealably joined to the case member 18.

Figure 8A:
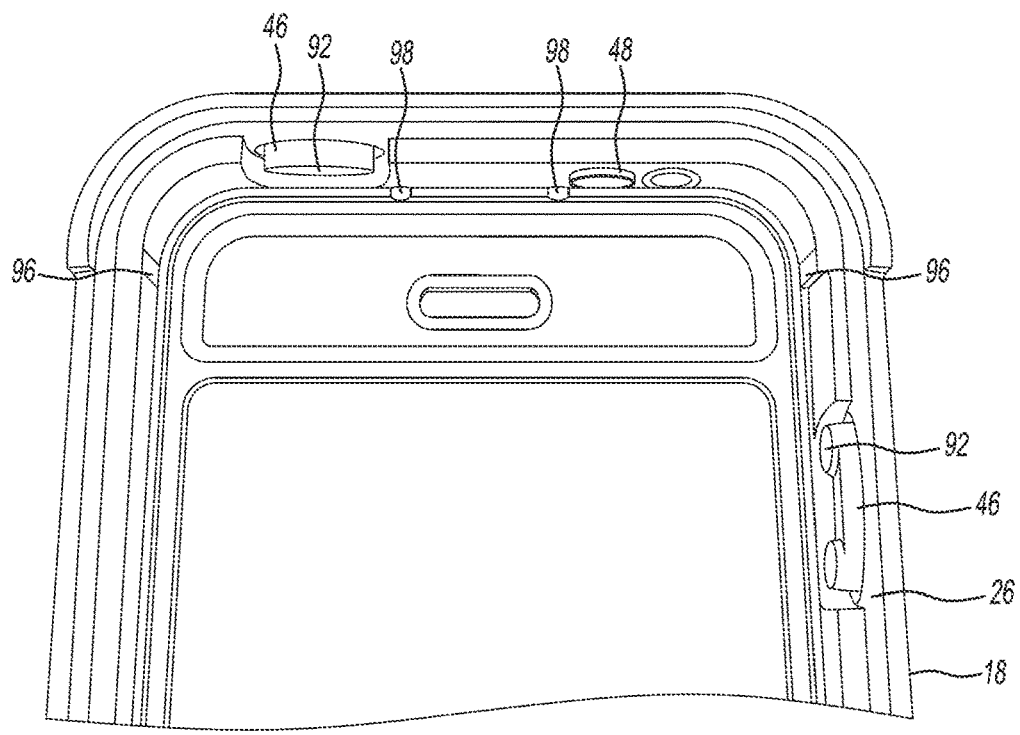
FIG. 8A is a partial perspective view of the upper portion of the case member.
Figure 8B:
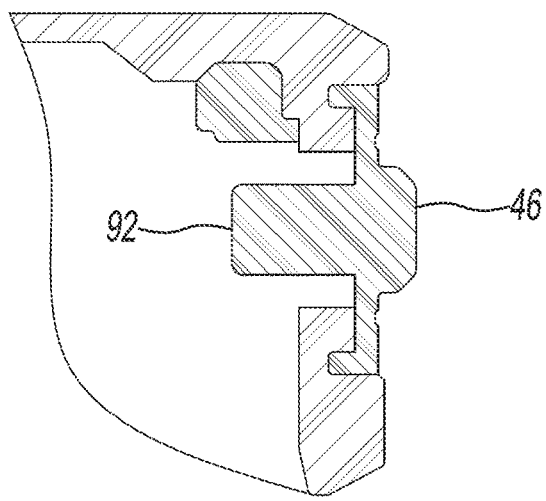
FIG. 8B is a partial sectional view of a toggle membrane.
Figure 8C:
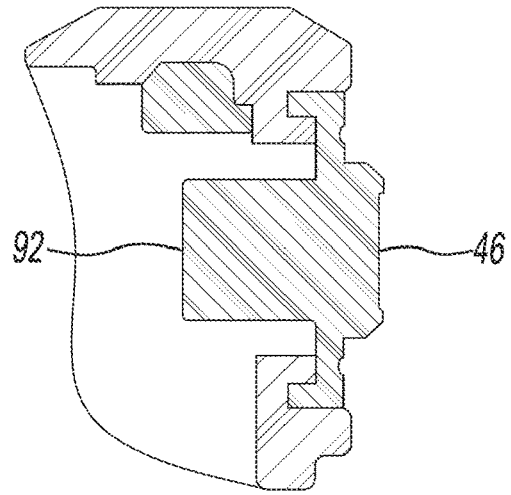
FIG. 8C is a partial sectional view of a toggle membrane.

Additionally, the case member 18 may include various flexible membrane structures 46 to operate buttons or switches associated with the electronic device 12. Additional flexible membranes structure 46 not shown may be positioned to operate any number of buttons or switches such as a mute toggle, volume adjustment button, on/off button or any other type of button. The flexible membrane structures 46 may have various forms and shapes to actuate the desired buttons of the electronic device 12. As shown in FIGS. 8A-C a flexible membrane structure 46 may include a mechanical feature 92 to actuate the desired button of the electronic device 12. The flexible membrane structures 46 may be formed of the sealing and locating material 26 described above or may be another material attached to the main housing 14. In one aspect, the flexible membrane structure 46 may be over-molded with the main housing 14 to define a home button actuation point 94. The case member 18 as stated above includes a sealing and locating material 26 attached to the interior and exterior walls of the case member 18. Portions of the sealing and locating material 26 on the interior of the case member 18 may include raised structures or bumps 96 to locate and position the device within the case member 18, as best seen in FIG. 8A. Additional stabilization structures 98 may be formed to stabilize the main housing 14 in an over-mold tool. In another embodiment for the manufacture of the protective case 10 through a 2K double injection (or co-injection); the protective case 10 may employ the use of non-flexible buttons made of solid harder materials such as plastic or metal, etc. These solid buttons may be inserted into a cavity of the co-molded rubber 26 within the case member to allow the actuation of buttons through a thin rubber section to the button on the device within.

The case member 18 may also include an attachment structure 48 best seen in FIG. 1 & FIG. 10, for attaching to a lanyard allowing a user to carry the protective case 10. The lanyard attachment structure may be positioned at various positions on the case member 18.

In use, a user may position an electronic device 12, such as a phone and in particular a phone having a touch screen, within the case member 18. The lid 16 may then be joined with the main housing 14 using the attachment structures 38 such that the gasket 54 is seated in the groove 52 of the lid 16 and a radial compression is applied to the gasket 54 sealing the lid 16 and main housing 14 and provides a water tight seal. The user may visually verify that the gasket 54 is properly seated as the main housing 14 and lid 16 may be formed of a clear material in an area about the gasket 54 so the user may see the seal of the gasket 54 through the wall 67 of the main housing 14 to make sure the gasket 54 is compressed, which will appear as an even compression line of a slightly different color of the gasket 54 formed when the gasket is deformed against the main housing. The user may confirm the water tight seal formed by the main housing 14 and lid 16 if the compression line appears consistently around the entire perimeter of the clear case member 18 with no breaks across the line. If the gasket 54 is not properly seated or the main housing 14 and lid 16 are not sealed, this will be immediately detectable as the gasket 54 will show where the seal is broken in the lack of formation of a slightly different colored line in one section of the perimeter as seen through the main housing 14 or lid 16. The user may operate the various functions of the electronic device 12 through the use of the various flexible membranes 46. Sound may be transmitted through the protective case 10 using the various sound chambers 28, secondary sound ports 32, membrane in a unitary structure 27 and thin walled portions 30 described above. The water tight space within the joined protective case 10 allows for the clear transmission of sound. Additionally, cameras associated with the electronic device 12 are operable and have a clear path for transmission. A touch screen of the electronic device 12 may be operated through the screen member 24 of the case member 18.

Figure 9:
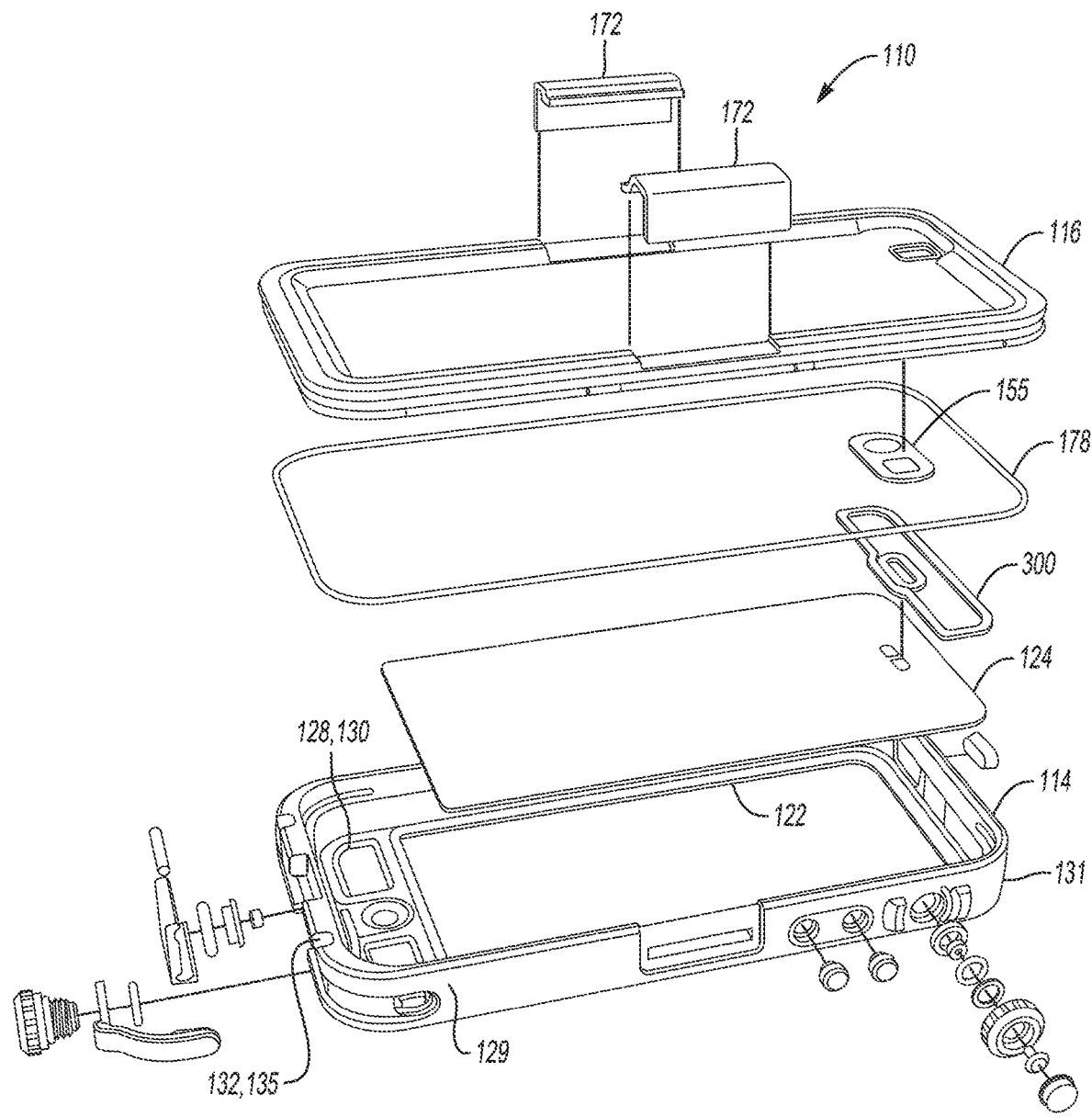
FIG. 9 is an exploded perspective view of a second embodiment of a protective case.

Referring to FIG. 9 there is shown a second embodiment of a protective and waterproof case 110. As with the first embodiment, the protective case 110 includes a main housing 114 and a lid 116. The main housing 114 may include a case member 118. The case member 118 may be formed of various materials to provide a rigid structure for the protective case 110. In one aspect, the case member 118 may be formed of a clear material such as a clear plastic resin. Various plastic resins including polycarbonate may be utilized.

The case member 118 may include various slots and access ports 120 formed therein. The slots and access ports 120 may be used to actuate various functions using buttons or switches and allow sound transmission, as will be described in more detail below. Additionally, the case member 118 may include a window portion 122 formed therein that receives a screen member 124. The case member 118 may include sealing and locating material 126 applied thereon on defined portions of the case member 118, such as about the slots and access ports 120 to provide location and a sealing for the electronic device 112 as well as allow access to various buttons of the electronic device as will be described in more detail below. In one aspect, the sealing and locating material 126 may include various plastic elastomers such as a TPE-TPU material, rubber or may be formed of other materials.

The case member 118 includes a screen member 124 attached thereon about the window portion 122 of the case member 118. The screen member 124 may be a separate piece attached using various methods including using an adhesive, welding, molding hot stamping, insert molding, co-injection or otherwise attaching the screen member 124. Alternatively, the screen member 124 may be formed with the case member 118 and may have a thickness that is different from other portions of the case member 118. In one aspect, the screen member 124 may be formed of a clear material allowing viewing of a display of the electronic device 112. The screen member 124 may have a thickness that allows a user to manipulate a touch screen of the electronic device 112 through the screen member 124 and allow for transmission of sound. In one aspect, the screen member 124 may extend to an ear piece speaker location of the electronic device 12 allowing the screen member 124 to vibrate and allow more acoustic energy to be transmitted through the screen member 124.

The lid 116 includes at least one sound chamber 128 formed thereon. The at least one sound chamber 128 may be defined by an area of the lid 116 that includes a thinned wall section 130 or wall section that has a smaller thickness than an adjacent portion of the lid 116. The thinned wall section 130 defines an air space 205 allowing for sound to be transmitted from speakers of the electronic device 112. In the depicted embodiments of the figures, two sound chambers 128 are also defined in a lower portion 129 of the case member 118. It should be realized that various numbers of sound chambers may be present.

In one aspect, the case member 118 also includes at least one secondary sound port 132. In the depicted embodiments a secondary sound ports 132 is formed in the upper portion 131 of the case member 118 and includes a microphone 135. Additionally, the lid 116 may include a second microphone port 139. The secondary sound ports 132 may be defined by slots 134 formed in the case member 118 or lid 116.

Figure 11:
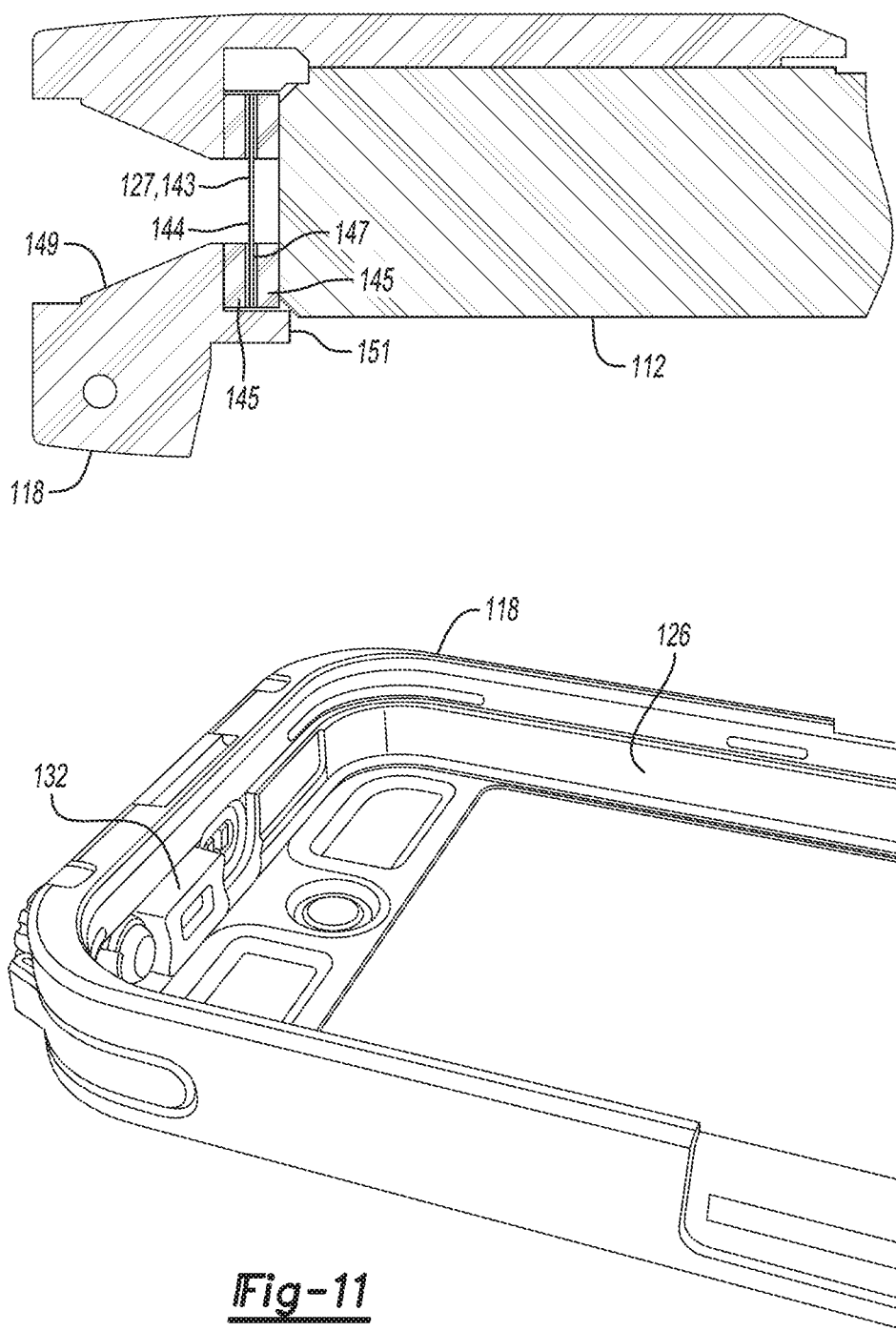
FIG. 11 are a sectional view and perspective view of the membrane assembly of the microphone port of FIG. 10.

Referring to FIGS. 10-11, the membrane 127 positioned about the microphone port 135 of the electronic device 112 may have a first membrane assembly 143 positioned within the microphone port 135. The membrane assembly 143 may include a membrane 144 of a size and thickness as described above and having the desired material properties as described above to allow for the accurate transmission of sound. In the depicted embodiment, a TPU membrane 144 is attached to foam sections 145 using an appropriate adhesive such as a double sided adhesive 147 as described above. The membrane assembly 143 is positioned on an inner surface of the case member 118 in the region of the microphone port 135 and compliantly attached to the case member 118 using a viscoelastic adhesive. The foam sections 145 serve to define an air cavity in which to seal the microphone of the electronic device 112 to improve the sound quality and prevent reverberations as described above and also compliantly mounts and allow the membrane 144 to freely vibrate for an accurate transmission of sound as described above. In another embodiment not shown, the air cavity may for formed of a foam, rubber or elastomer material which may not be directly attached to the membrane assembly but that instead is located in an area that seals the membrane assembly and isolates an air cavity that directs sound to the sealed area around the microphone of the device 112. The microphone port 135 includes a cone shaped channel 149 to direct and amplify sound as it travels to the membrane assembly 143 on microphone port 135 to direct it to a microphone of the device 112. Additionally, the case member 118 may include a lip or extension 151 from the case member 118 toward an interior of the case member 118. The lip 151 prevents the device 112 positioned within the case 110 from damaging the foam sections 145 such as from a sideways sheering force that may be applied.

Referring to FIGS. 12-13 the second microphone port 139 may be formed in the lid 116. The second microphone port 139 may include a membrane assembly 155 that also functions as a camera and flash isolation structure. The entire membrane assembly 155 may be attached to the lid 116 using an appropriately compliant adhesive as described above such as a double sided VHB tape at least 1 mm wide to form a water tight seal. In the depicted embodiment the lid 116 may include a raised lip 117 to locate the membrane assembly 155. An opaque co-molded section 119 made of a black elastomer, rubber or other material that absorbs light may be defined about the second speaker port 139 to receive the membrane assembly 155 to block light transmission from a camera flash from traveling through the clear lid 116 or case member 118. Another raised lip 117*b* of a black TPE/TPU molded elastomer, rubber or other material that absorbs light may also be defined about the camera or flash to locate the membrane assembly 155 and to block light from a flash from traveling through the lid 116 or membrane assembly 115 or case member 118 to the camera.

The membrane assembly 155 may include a membrane 161 positioned between foam sections or rubber sections 163. The membrane 161 is formed of a clear material such as TPU, PEN, PVDF or other acoustic and optically transparent material to allow a camera flash or a camera of an electronic device 12 to operate through the membrane 161 and also allow for the transmission of sound to be received in the case 110 by a microphone of an electronic device 12. As shown in the figures, the membrane 161 is positioned in a cutout section 165 of the foam sections 163. An adjacent cutout section 167 is defined to receive a camera from the electronic device 12 which may or may not be located through a raised lip of TPE/TPU 117*b*. The camera is isolated from the flash that passes through the membrane 161 of the second microphone port 139. The camera may operate through the lid material that is positioned below the camera cut out section 167 or through an additional assembled lens formed or attached to the lid 116 such as those mentioned above. The foam section cutout 165 for the membrane 161 also includes a notch 169 formed therein to form and seal an air chamber between the electronic device 12 and the lid 116 that directs and allows acoustic energy to travel to a microphone of the device 112.

Referring to FIGS. 14A-16C, the case member 118 and/or lid 116 may include attachment structures 138 such as cavities, undercuts and tabs, snap fit, or hinge features or other attachment structures for joining the main housing 114 with the lid 116. In the depicted embodiments the attachment structures 138 may include cavities 170 formed in the case member 118 and lid 116 allowing the lid 116 to mate with the case member 118 on one side of the lid 116. On an opposing side latches 172 may be attached that pivot and contact snap fit features 174 on the case member 118 to secure the lid 116 to the case member 118. Additionally secondary snap fit features 176 may be formed on the lid 116 to mate with the cavities 170 in the case member 118 and securely attach the lid 116 to the case member 118. As can be seen in the figures, a gasket or seal 178 is positioned in a groove 152 formed about the edge of the lid 116. The seal 178 includes a sealing edge 180 and a dust skirt lip 182 to prevent dust and other debris from entering the interior of the case 110. The seal 178 is compressed between the wall 167 of the case member 118 and the groove 152 formed in the lid 116 which receives the seal 178. In one aspect, the seal 178 receives a radial compression between the main housing 114 and the lid 116 to provide a watertight seal. The radial compression is defined by the load applied to the seal 178 from the wall 167 of the main housing 114 and the position of the seal 178 in the groove 152 of the lid 116. Additionally the dust lip 182 seals a gap between the lid 116 and case member 118. The seal 178 may include cut out portions 181 to allow the latches 172 to sit flush in the housing 114 when attached.

Figure 14A:
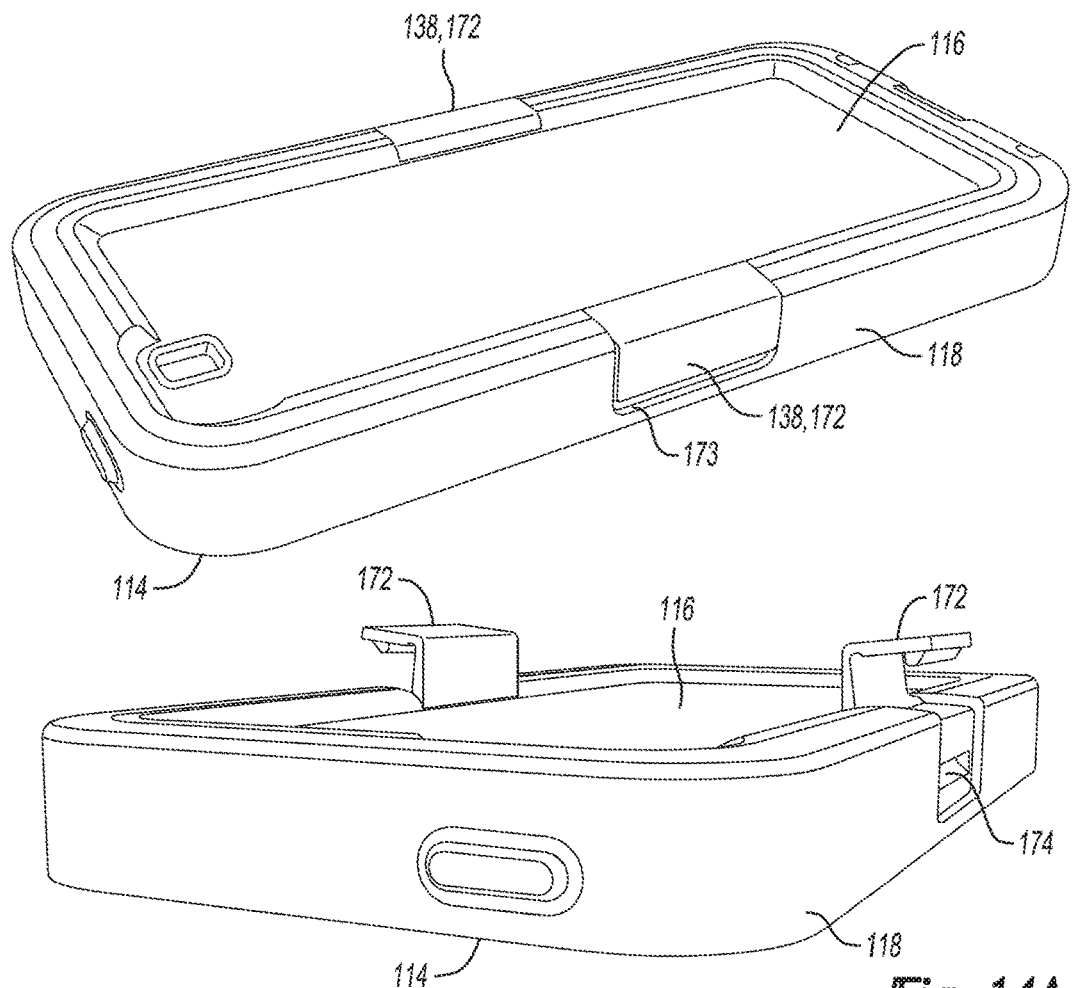
FIG. 14A-B are perspective views of the case and attachment structures of the second embodiment.
Figure 14B:
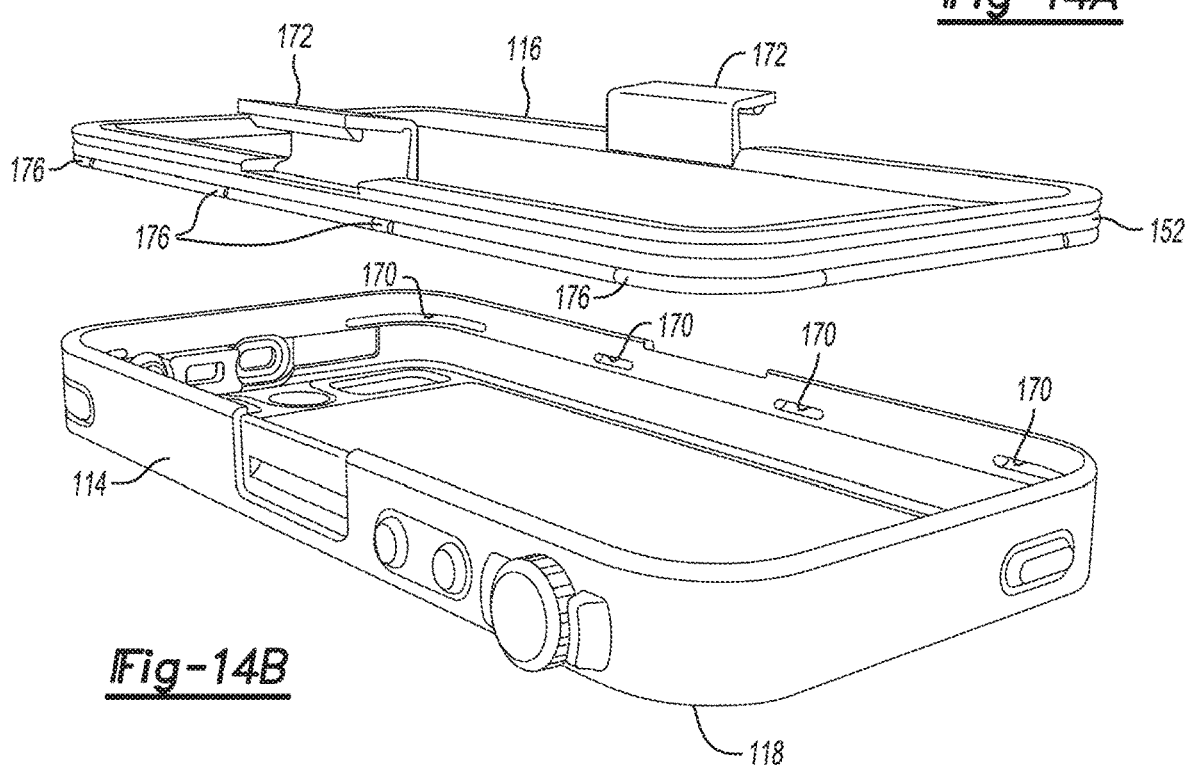

Referring to FIGS. 14A and 14B, the case member 118 and lid 116 may include attachment structures 138 for joining the main housing 114 with the lid 116. In the depicted embodiments the attachment structures 138 may include cavities 170 formed in the wall 167 of the case member 118 and allowing the lid 116 to mate with the case member 118 and be additionally secured using side latches 172 on both sides of the lid 116 in the middle of the case member. These side latches 172 may be attached that pivot and contact snap fit features 174 on the case member 118 to secure the lid 116 to the case member 118. Additionally secondary snap fit features 176 may be formed on the lid 116 to mate with cavities 170 formed in the wall 167 of the case member 118 and securely attach the lid 116 to the case member 118. The combination of both of the opposing side latches 172 that fit into snap fit features 174 and the secondary snap fit features 176 that fit into cavities 170 on the case member 118 may be employed to capture and seal an O-ring 178 depicted in FIG. 16C to create sufficient force to maintain an even compression line along the wall 167 of the case member 118 and to create a water tight seal. In another aspect, the opposing side latches 172 also keep the lid 116 in place if the strong outer shell is exposed temporarily to significant forces such as an impact on a drop or pressure at depth underwater and helps to maintain the overall structure and integrity of the water tight seal. As can be seen in the figures, a round O-ring seal 178 is positioned in a groove 152 formed about the edge of the lid 116. Additionally, the case member 118 or lid 116 may have locating cavities that allow a mounting feature to orient itself to be used as an attachment point for accessories such as a belt clip, holster, stand, mount, docking stand, tripod, floatation device, etc. In one embodiment as shown in FIG. 14A, when the secondary snap fit features 176 are engaged in the corresponding cavities 170 to join the case member 118 and lid 116 together and the opposing side latches 172 are pivoted an engaged with snap fit features 174, locating cavities 173 are formed in the area where the opposing side latches 172 are secured in the two side walls of the case member 118. Referring to FIGS. 30 and 31, there is shown one embodiment of a mounting feature 175 engages and fits into the locating cavities 173. The mounting feature 175 also serves to increase the structural integrity of the sealed case member 118 and lid 116 by increasing the rigidity of the protective case 110 that aids in maintaining a consistent compression for a water tight seal including in the event of a drop or impact that could otherwise force the lid 116 to separate from the main housing 114. Referring to FIGS. 30 and 31, mounting features 175 may connect onto a range of accessories that employ a variety of mechanical methods of attachment 177, such as a bayonet, screw, snap fit or other methods.

Figure 17A:
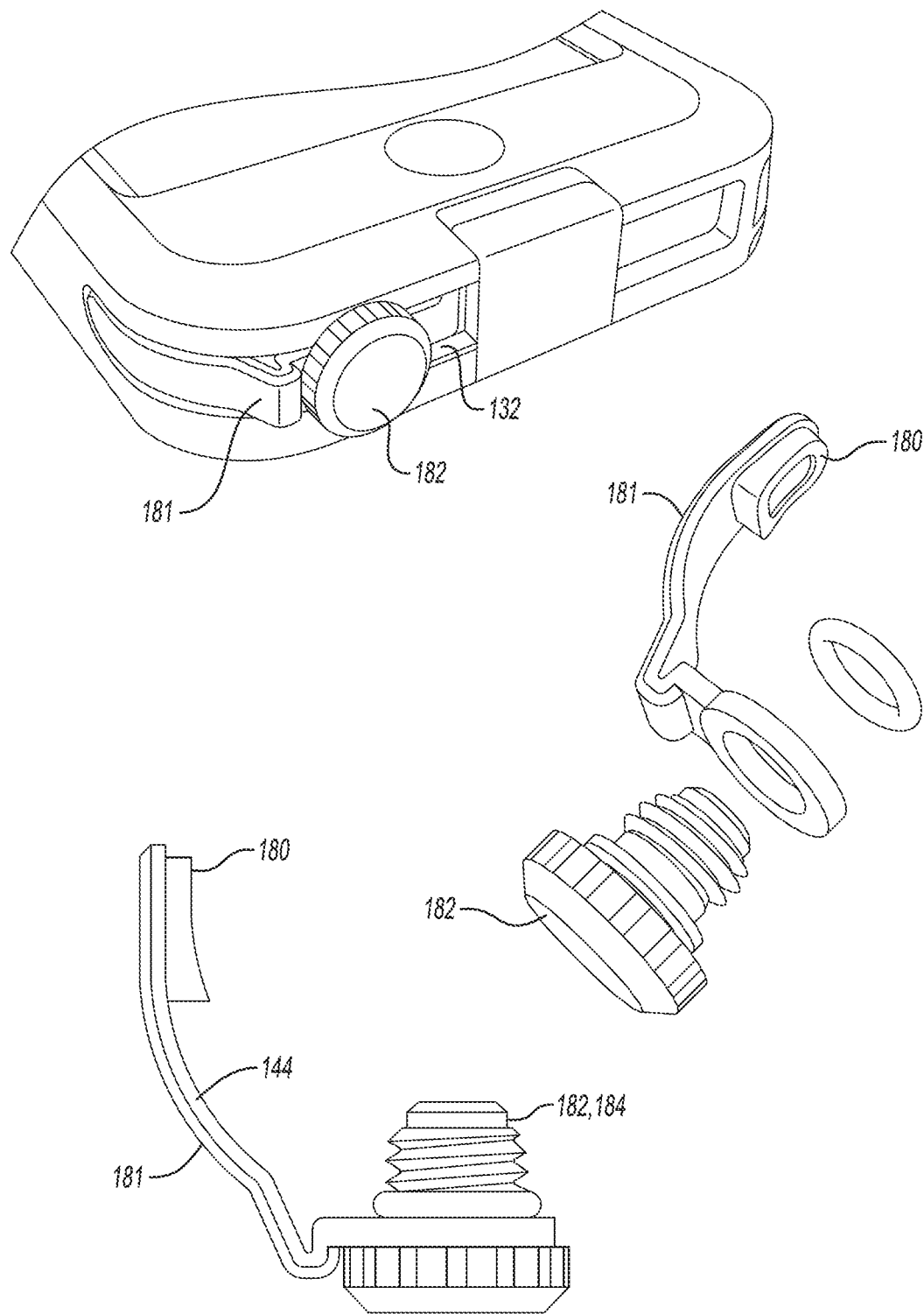

The case member 118 may include additional structures that allow a user to operate the electronic device 112 with a water tight seal. The case member 118 may include a plug 144, best shown in FIG. 17 that is attached to the case member 118. The plug 144 includes an attachment structure 180 for mating with the case member 118 that is joined to a plug portion 182 through a tether 181. The plug portion 182 engages a specific corresponding shaped access port form in the case member 118 and forms a water tight seal through compression of an O-ring, gasket or other compressible material built into or assembled onto the plug portion 182 when mated together through a friction fit, snap fit, bayonet fit, screw fit or other mechanical mating method. In other embodiments, a plug 144 may be used to engage various access ports as shown in FIG. 17B to access features of the electronic device 112 such as the charge connector, audio jack, camera, buttons, switches, sensors, battery, power source or other feature of the electronic device 112. The tether 181 be made of rubber or textile including a thin cord and may be utilized so as to avoid accidental loss of the removable sealable plug 144 when the attachment structure 180 is permanently or semi-permanently mated to the case member 118. In FIG. 17, the plug portion 182 may include a threaded core 184 that mates with the head phone slot formed in the housing 114. An O-ring may be positioned about the plug 182 to compress and seal as the plug portion 182 is screwed into the head phone slot formed in the case member 118. The removable plug 144 may be replaced with an adaptor 364 with the same shaped features on the exterior of plug portion 182, such as a threaded core 184, such that the adaptor 364 may engage the corresponding access port or slot on the case member 118 and form a water tight seal with or without an assembled O-ring. The adaptor 364 may also interact with a feature of the electronic device 112 by engaging an audio jack, USB slot, micro USB slot, storage or memory slot, access port for digital or analog audio or video input or output device such as a speaker, video player, recorder or other device. In another embodiment, a waterproof charge connector may be used to seal to the opening of the charge port to create a waterproof connection to a waterproof charger or battery. Such a connector may employ a friction fit, snap fit, bayonet fit, screw fit or other means to mechanically attach and not accidentally separate the connector from the housing by pulling on connector or the protective case 110 and rendering it not waterproof.

Figure 20:
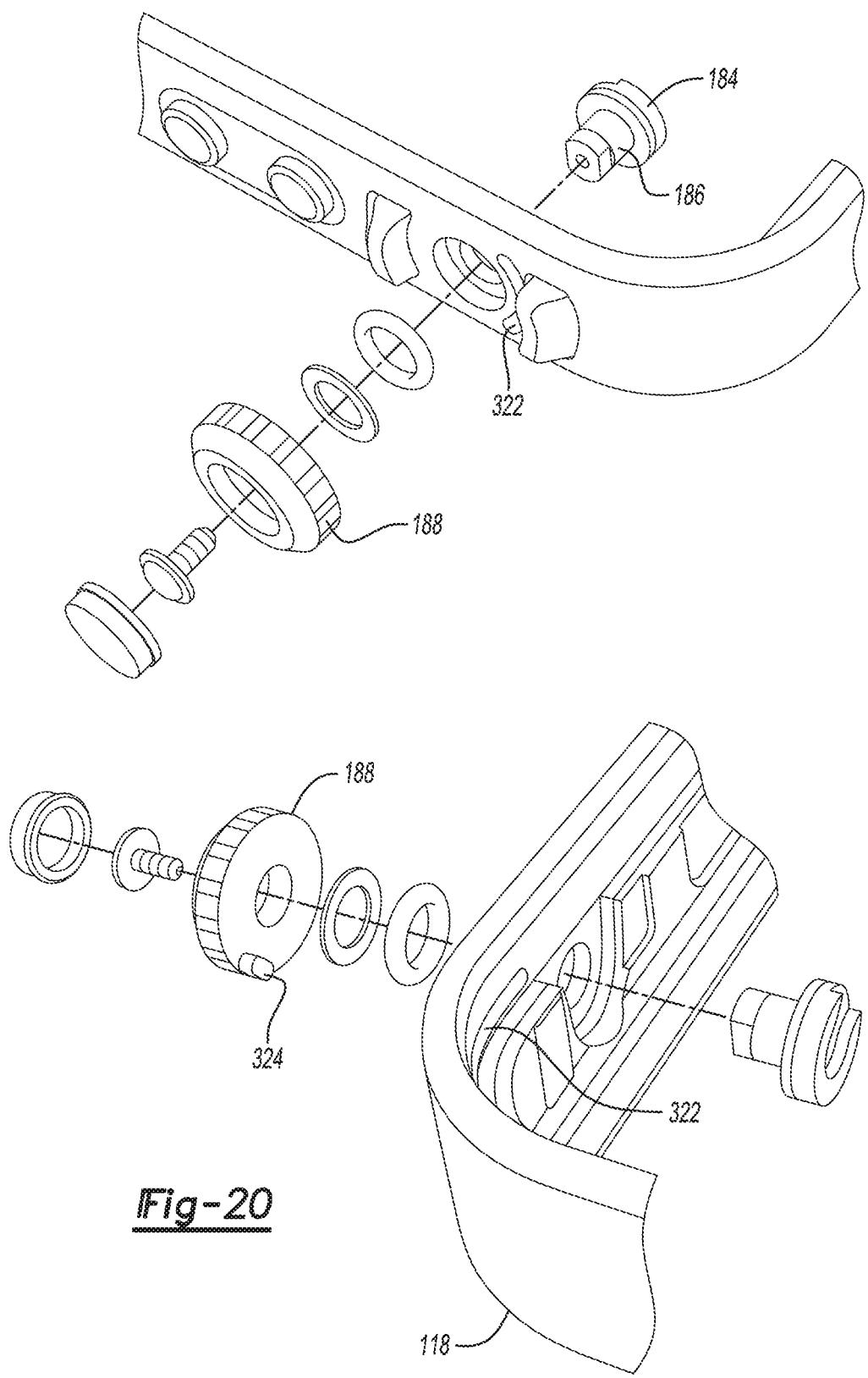
FIG. 20 is a perspective view of the case and a second toggle for actuating a device of the second embodiment.

Additionally, the case member 118 may include various toggles 146 to operate buttons or switches associated with the electronic device 112. In the depicted embodiment of FIGS. 18-19, a first toggle 182 may be positioned on the upper portion of the case member 118. The toggle 182 includes an assembly having an actuator having a C-shaped contact portion 184 within the case member 118 and a shaft 186 that extends through the slot formed in the case member 118 and is received in a control button 188 on the exterior of the case member 118. The shaft 186 may have one or more O-rings or compressible gaskets that may be made of a self-lubricating material and may have a low friction surface finish to minimize wear on the O-ring or gasket and the O-rings may be positioned around the shaft 186 to seal the opening in an axial or radial direction in the case member 118 and provide a water tight seal. The control button 188 may be rotated to cause the C-shaped contact portion 184 to rotate and actuate a switch on the electronic device 112. Another toggle 190, as shown in FIG. 20 may be positioned on the upper side of the case member 118. The toggle 190 may include a similar structure a described above including the button 188, actuator with contact portion 184 and O-ring seal. The control button 188 may have a protrusion 324 that engages a locating feature 322 formed in the case member 118 so as to limit the rotation of the shaft 186 so that the C-shaped contact portion 184 rotates just enough to toggle the switch on the electronic device 112.

Figure 22C:
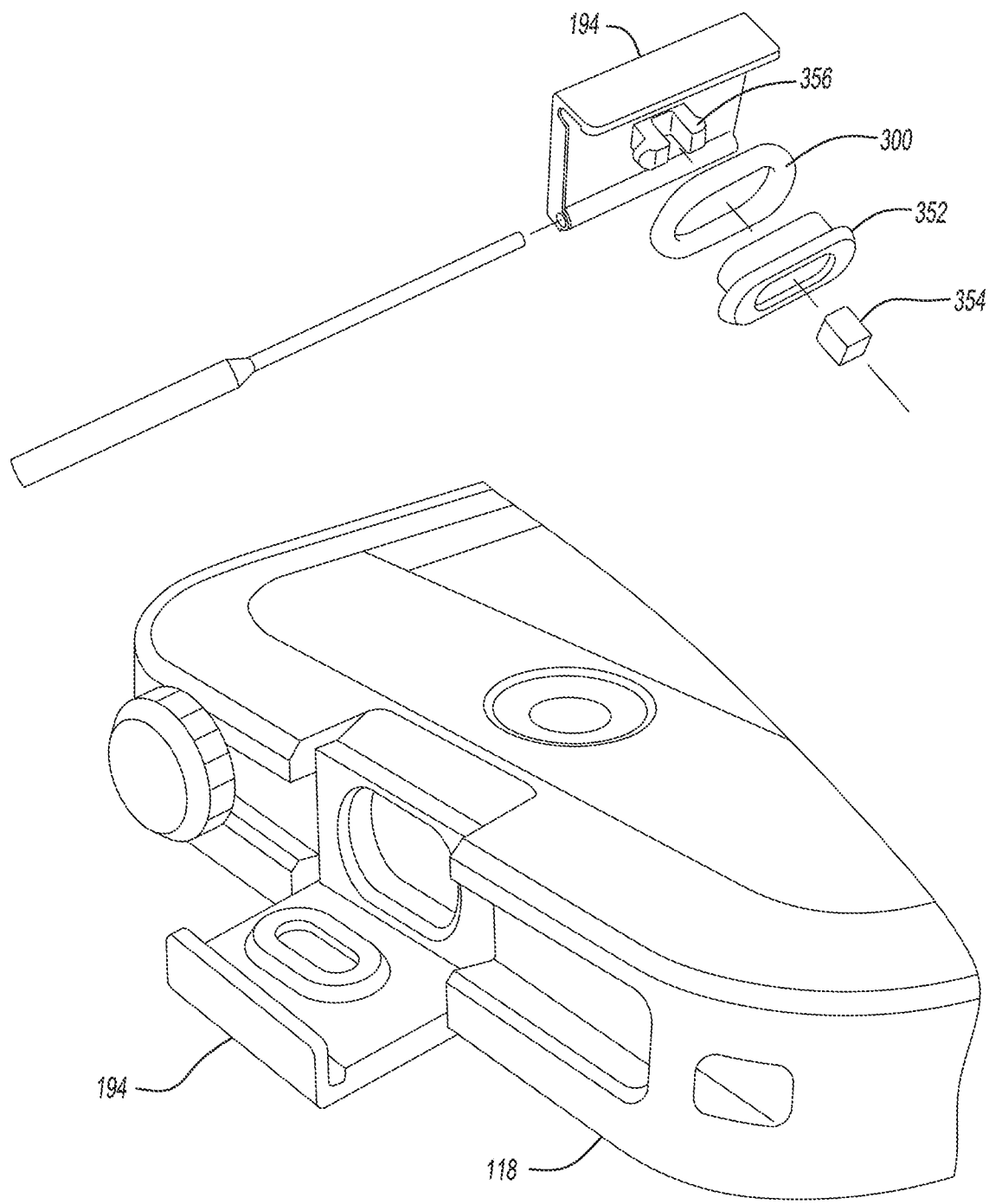

Referring to FIGS. 21-22, the case member 118 may include an access port 192 formed on the lower portion of the case member 118. The access port 192 may be used for charging an electronic device 112 or accessing other parts of the device 112. The access port 192 includes a removably hinged door 194 attached to the case member 118. The hinged door 194 includes a seal or compressible gasket 196 positioned thereon that mates with the case member 118. The hinged door 194 includes snap features 198 formed thereon that mate with the case member 118 to hold the door 194 in place. The angle of the snap features 198 can range from 45 degrees to 90 degrees. The closer to 90 degrees the angle is, the more secure the latch, but the more difficult it becomes to remove. In one embodiment, a secondary lock 200 slides within a channel in the case member 118 to move in and out of contact with the door 194 to latch the door 194 to the case member 118, thereby securing the door 194 to prevent it from being accidentally opened. In one aspect, the door may be opened or removed so that accessory devices may be mated with the case 110. For example various accessories such as battery chargers and other devices may include a seal that mates with the case member 118 and latches to the case member 118 may be included. In another aspect as shown in FIGS. 22B and C the hinged door 194 may include snap feature 356 that mates with a member 352. An O-ring 350 may seal about the snap feature 356 and member 352. A lock piece 354 may mate with the snap feature 356 to hold the member 352 in place. Additionally an alternative door 194 may mate with the case member 118 and include latches as shown in FIG. 32.

Figure 25:
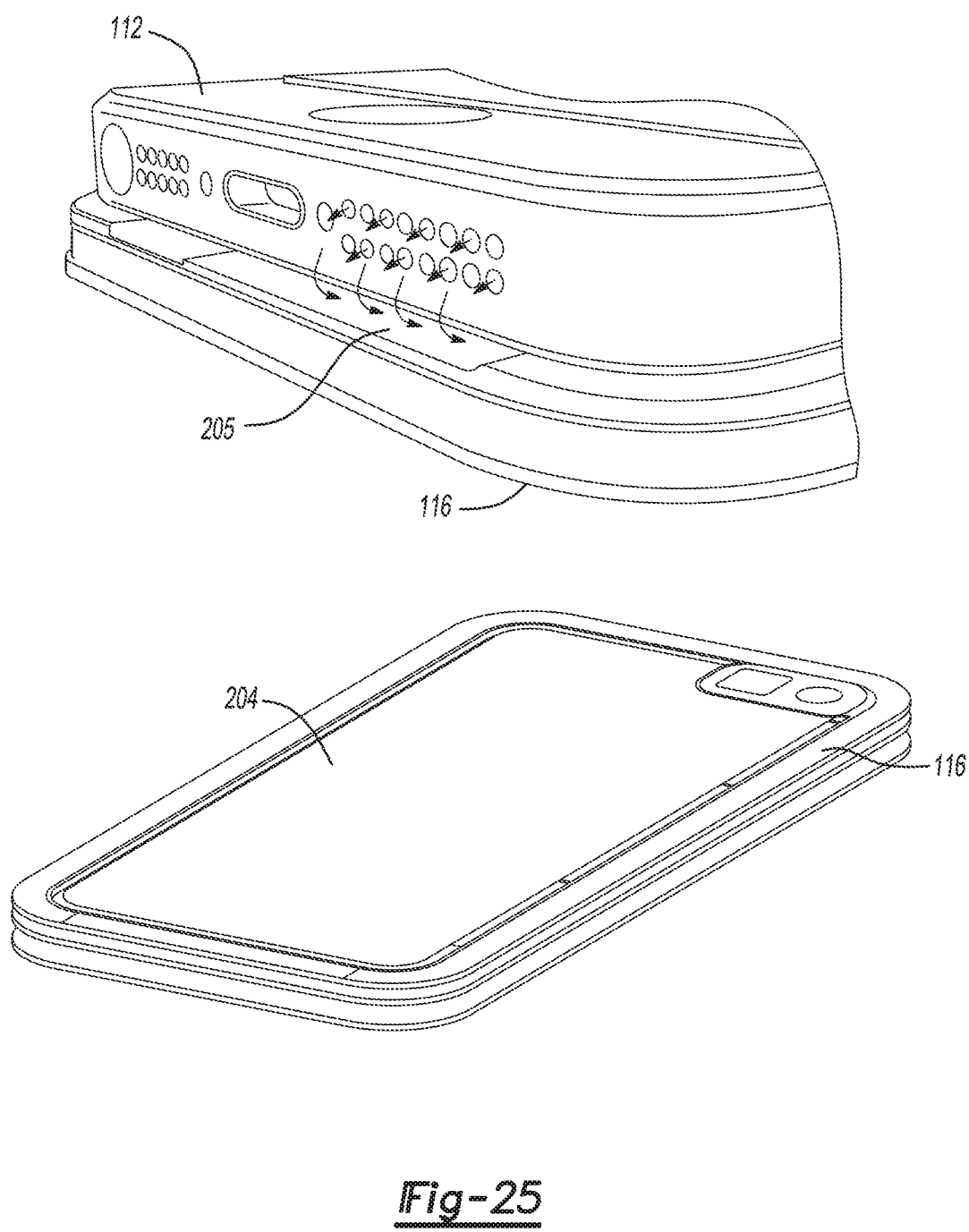
FIG. 25 are perspective views of a case member showing air gaps of the second embodiment.
Figure 26:
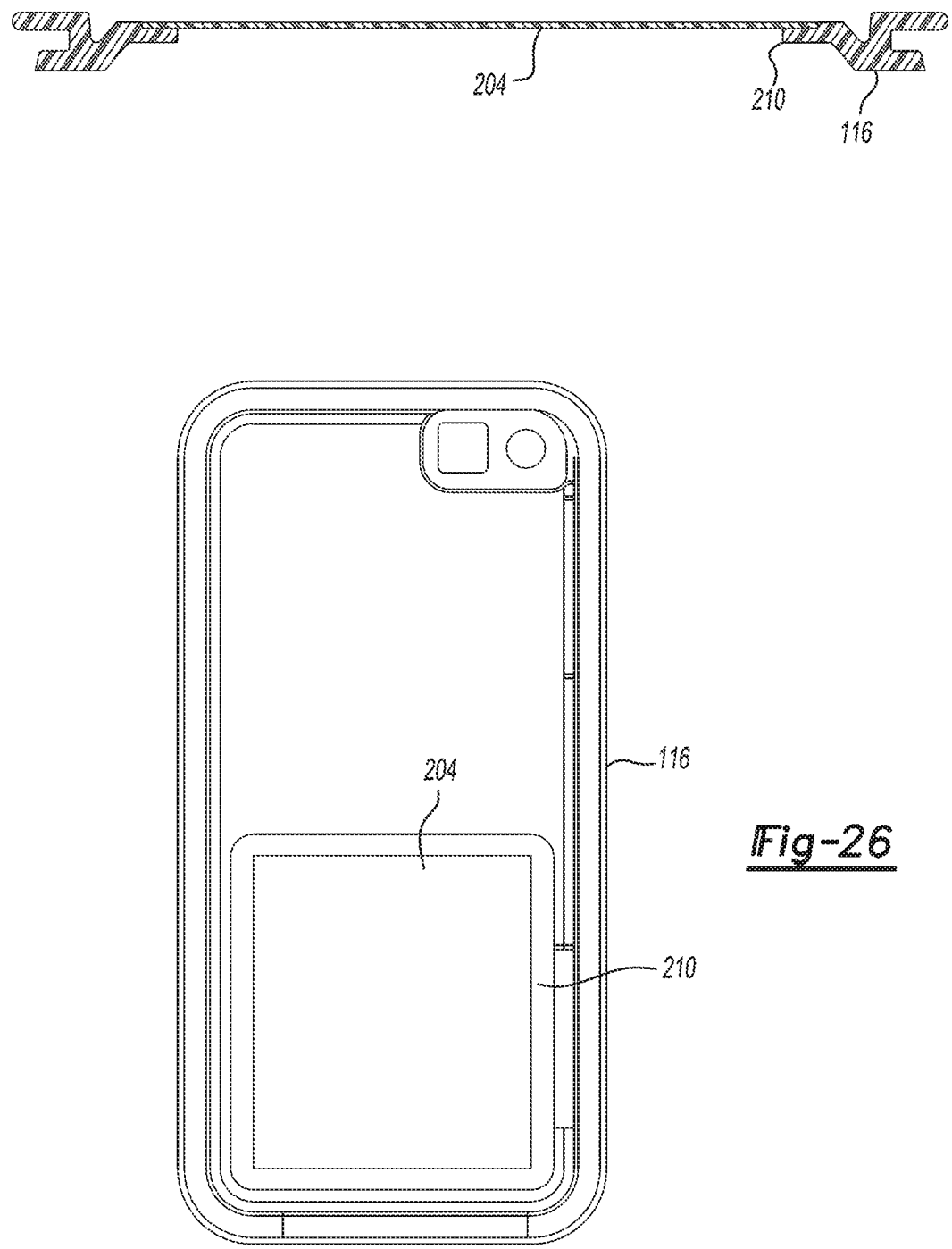
FIG. 26 is a perspective view and sectional view showing a port and thin walled membrane.

In one aspect, as shown in FIGS. 24-26, the lid 116 or screen 124 may act as an acoustic membrane 204 to transmit sound out of the case 110. As shown in FIG. 24 the lid 116 is spaced from the device in the case to define an air space or air gap 205. The sound may be redirected through the air cavities and air gaps 205 to allow the air pressure to move to another larger area of the case 110 that can vibrate and act as the speaker membrane 204 to allow sound waves to propagate to the outside of the case. The sound can be redirected in such a way because the case 110 is constructed with strategic air channels and no air vents so that there is minimal loss in acoustic energy as there is little transmission loss of the sound since there are no air vents that would reduce the air pressure and reduce the potential vibrational energy of the membrane. In one embodiment, the structure of the lid may be utilized to act as the acoustic membrane 204. In one aspect as shown in FIG. 26 the lid 116 may include a cut out portion 210 that may have a thinner piece of material compliantly mounted therein to act as the membrane 204. Various sized cutouts 210 may be utilized with various sized membranes 204 applied over the cut out 210. The membrane material may be the same or different from the lid 116. In mounting such membranes to the lid, it is important to pay attention to boundary conditions of the membrane to avoid excessive vibrations that affect the acoustics which can be avoided by ensuring that the membrane is compliantly mounted or additional damping materials are used. Alternatively the lid 116 may be formed as one piece and act as the acoustic membrane 204. In such an embodiment the lid 116 may have a thickness and size which in combination with the air gap 205 allows the lid to vibrate and transmit sound.

The screen 124 may also act as an acoustic membrane in combination with an air gap 205 as best shown in FIG. 24. As with the lid 116, the screen may have a thickness and size in conjunction which in combination with the air gap 205 that allows the screen 124 to vibrate and transmit sound.

Figure 27:
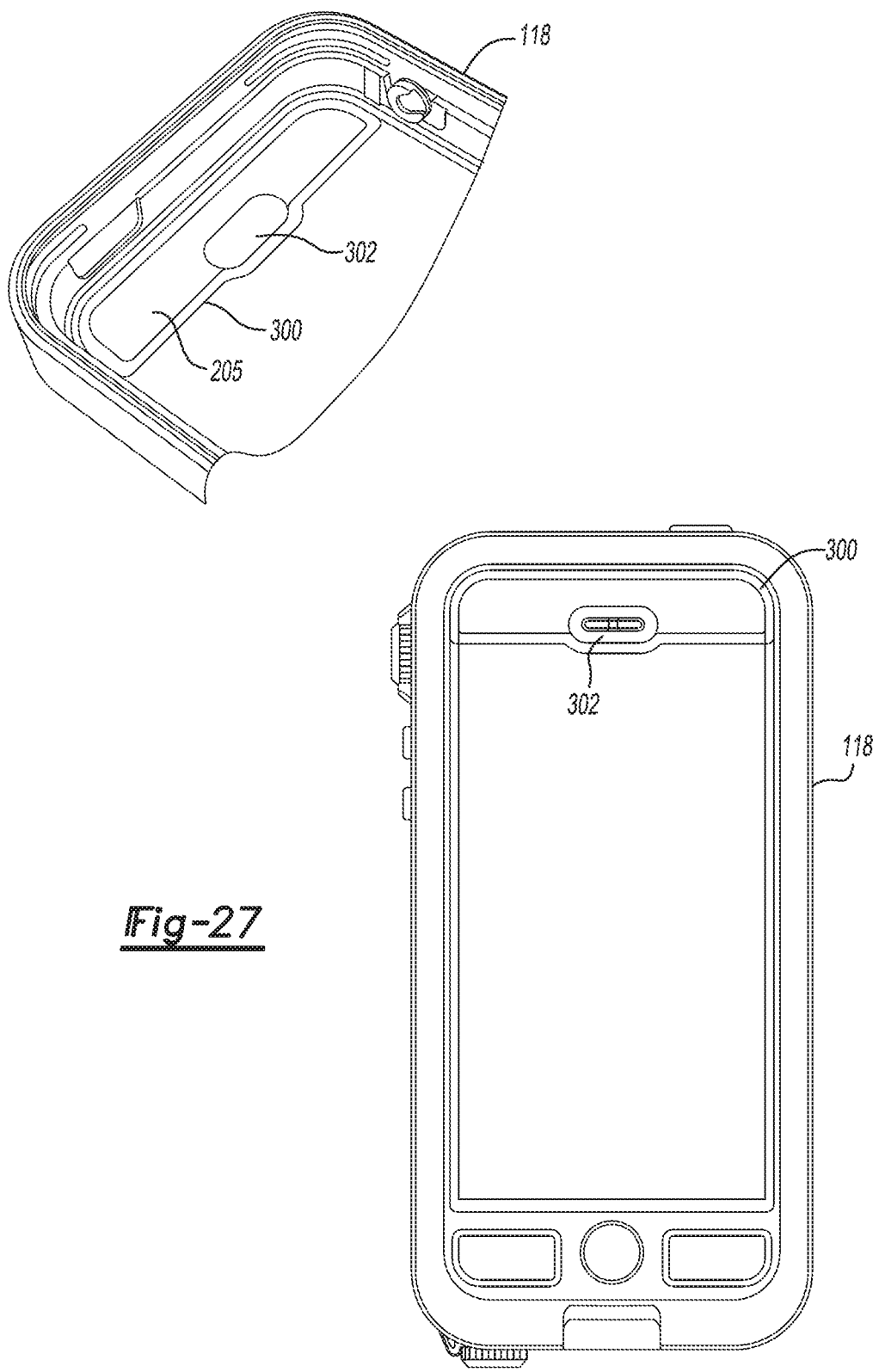
FIG. 27 is a perspective and front view of an isolation assembly positioned about an ear piece.

Referring to FIGS. 27 and 28, there is shown an earpiece sealing member or noise isolating assembly 300 that is positioned about a periphery of the ear piece speaker/microphone 302. As referenced above, if the area of such an earpiece 302 is located adjacent to sensors and other functions, the earpiece 302 may be designed with a membrane assembly that is suitable for the speaker sound to vibrate the membrane and be heard, while a noise isolating assembly 300 made of damping materials such as foam, elastomer or a rubber seal applied with a pressure sensitive adhesive may be located further around the perimeter of the sensors and touchscreen such that they do not impede the function of those elements. Such a noise isolating assembly 300 may form an airtight seal with the surface of the housing or screen membrane 124 so that reverberations and sound from another speaker in the housing does not generate feedback or echoes. This also serves to assist the signal processing algorithm employed by the electronic device 112 to detect the background noise and cancel it quickly enabling a clear call. The noise isolating assembly 300 may be of sufficient thickness that may range from 0.07 mm to 2 mm and may be of a suitable location that it does not significantly distort the housing so that it affects the pressure or capacitive functionality of the touchscreen nor the optical clarity and light transmission and impairs the function of the proximity sensor or ambient light sensor or other back illuminated camera sensors or sensors or functions.

In one aspect, as shown in FIG. 28 the ear piece sealing member 300 may be located within the shaded area 304 to provide sealing and not distort the other functions of sensors on a device.

Referring to FIG. 29 there are shown views of an audio adaptor 360 that is sealingly connected to the head phone jack port. The audio adaptor 360 includes an O-ring or gasket 362 that is assembled onto a groove 366 that may be formed as part of an over molded body 364. The O-ring seals against the case and provided a water tight seal. A user may plug in a water proof headphone to listen to audio or make phone calls through the headphones.

The invention has been described in an illustrative manner. It is therefore to be understood that the terminology used is intended to be in the nature of words of description rather than of limitation. Many modifications and variations of the invention are possible in light of the above description. Thus, within the scope of the appended claims, the invention may be practiced or applied other than as specifically described.

We claim:

1. A protective case for an electronic device, the protective case comprising:
   a main housing;
   the main housing shaped to receive the electronic device, said electronic device including a switch;
   the main housing including a slot formed therein proximate the switch of the electronic device when the electronic device is positioned in the main housing and a toggle rotatively positioned within the slot, the toggle including a pair of raised contact portions arranged such that the switch is positioned between the raised contact portions and is actuable by rotation of the toggle to move only one of the pair of raised contact portions at a time into contact with the switch and move the switch.

2. The protective case for an electronic device of claim 1 wherein the toggle includes a circular body having the pair of raised contact portions formed on a lower surface.

3. The protective case for an electronic device of claim 1 wherein the pair of raised contact portions are positioned within the main housing, the toggle including a shaft extending from the pair of raised contact portions and passing through the slot.

4. The protective case for an electronic device of claim 3 further including an O-ring positioned about the shaft, the O-ring providing an air and water tight seal relative to the slot.

5. The protective case for an electronic device of claim 3 wherein the toggle includes a button attached to the shaft on an exterior of the main housing, the button rotatable to actuate the toggle.

6. A protective case for an electronic device, the protective case comprising:
   a main housing;
   the main housing shaped to receive the electronic device, said electronic device including a switch;
   the main housing including a slot formed therein proximate the switch of the electronic device when the electronic device is positioned in the main housing and a toggle rotatively positioned within the slot, the toggle including a circular body having the pair of raised contact portions formed on a lower surface of the circular body such that the switch is positioned between the raised contact portions and is actuable by rotation of the toggle to move only one of the pair of raised contact portions at a time into contact with the switch and move the switch.

7. The protective case for an electronic device of claim 6 wherein the pair of raised contact portions are positioned within the main housing, the toggle including a shaft extending from the pair of raised contact portions and passing through the slot.

8. The protective case for an electronic device of claim 7 further including an O-ring positioned about the shaft, the O-ring providing an air and water tight seal relative to the slot.

9. The protective case for an electronic device of claim 7 wherein the toggle includes a button attached to the shaft on an exterior of the main housing, the button rotatable to actuate the toggle.

10. A protective case for an electronic device, the protective case comprising:
    a main housing;
    the main housing shaped to receive the electronic device, said electronic device including a switch;
    the main housing including a slot formed therein proximate the switch of the electronic device when the electronic devices is positioned in the main housing and a toggle rotatively positioned within the slot, the toggle including a pair of raised contact portions arranged such that the switch is positioned between the raised contact portions and is actuable by rotation of the toggle to move only one of the pair of raised contact portions at a time into contact with the switch and move the switch, wherein the pair of raised contact portions are positioned within the main housing, the toggle including a shaft extending from the pair of raised contact portions and passing through the slot.

11. The protective case of claim 10, wherein the toggle further includes a circular body having the pair of raised contact portions.

\* \* \* \* \*